(12) United States Patent
Pan et al.

(10) Patent No.: US 12,534,480 B2
(45) Date of Patent: Jan. 27, 2026

(54) ORGANIC COMPOUNDS AND APPLICATIONS THEREOF IN OPTOELECTRONIC FIELD

(71) Applicant: Zhejiang Brilliant Optoelectronic Technology Co., Ltd., Taizhou (CN)

(72) Inventors: Junyou Pan, Taizhou (CN); Xiang Chen, Taizhou (CN); Hong Huang, Taizhou (CN)

(73) Assignee: Zhejiang Brilliant Optoelectronic Technology Co., Ltd., Taizhou (CN)

( * ) Notice: Subject to any disclaimer, the term of this patent is extended or adjusted under 35 U.S.C. 154(b) by 314 days.

(21) Appl. No.: 18/300,811

(22) Filed: Apr. 14, 2023

(65) Prior Publication Data

US 2023/0255112 A1  Aug. 10, 2023

Related U.S. Application Data

(63) Continuation of application No. PCT/CN2021/123763, filed on Oct. 14, 2021.

(30) Foreign Application Priority Data

Oct. 14, 2020 (CN) ......................... 202011099557.7
Apr. 7, 2021 (CN) ......................... 202110370884.X

(51) Int. Cl.
  *C07F 5/02* (2006.01)
  *H10K 85/60* (2023.01)
  *H10K 59/38* (2023.01)

(52) U.S. Cl.
  CPC ........... *C07F 5/027* (2013.01); *H10K 85/658* (2023.02); *H10K 59/38* (2023.02)

(58) Field of Classification Search
  CPC ........ H01K 59/38; H01K 85/658; C07F 5/027
  See application file for complete search history.

(56) References Cited

U.S. PATENT DOCUMENTS

| | | | |
|---|---|---|---|
| 4,537,826 A * | 8/1985 | Miyamura | ............. G02F 1/1524 428/524 |
| 4,769,292 A | 9/1988 | Tang et al. | |
| 5,121,029 A | 6/1992 | Hosokawa et al. | |
| 5,130,603 A | 7/1992 | Tokailin et al. | |
| 6,020,078 A | 2/2000 | Chen et al. | |
| 6,251,531 B1 | 6/2001 | Enokida et al. | |
| 7,250,532 B2 | 7/2007 | Iwakuma et al. | |
| 2006/0210830 A1 | 9/2006 | Funahashi et al. | |
| 2006/0222886 A1 | 10/2006 | Kwong et al. | |
| 2007/0092753 A1 | 4/2007 | Begley et al. | |
| 2007/0252517 A1 | 11/2007 | Owczarczyk et al. | |
| 2008/0113101 A1 | 5/2008 | Inoue et al. | |
| 2009/0134784 A1 | 5/2009 | Lin et al. | |
| 2019/0393417 A1* | 12/2019 | Sugioka | ................. C09K 11/06 |
| 2020/0098991 A1* | 3/2020 | Kim | ........................ C07F 5/027 |
| 2020/0176679 A1* | 6/2020 | Jeong | ................... H10K 85/658 |
| 2022/0149281 A1* | 5/2022 | Li | ...................... H10K 85/6576 |

FOREIGN PATENT DOCUMENTS

| | | |
|---|---|---|
| CN | 1583691 A | 2/2005 |
| CN | 110407859 A | 11/2019 |
| CN | 110790782 A | 2/2020 |
| CN | 110832361 A | 2/2020 |
| CN | 110943176 A | 3/2020 |
| CN | 111029477 A | 4/2020 |
| CN | 111615653 A | 9/2020 |
| CN | 111630056 A | 9/2020 |
| CN | 111868627 A | 10/2020 |
| DE | 102005058557 A1 | 6/2007 |
| EP | 1957606 A1 | 8/2008 |
| JP | H0853397 A | 2/1996 |
| JP | 2913116 B2 | 6/1999 |
| WO | 0121729 A1 | 3/2001 |
| WO | 2006000388 A1 | 1/2006 |
| WO | 2006000389 A1 | 1/2006 |
| WO | 2006058737 A1 | 6/2006 |
| WO | 2006122630 A1 | 11/2006 |
| WO | 2007065549 A1 | 6/2007 |
| WO | 2007115610 A1 | 10/2007 |
| WO | 2007140847 A1 | 12/2007 |
| WO | 2008006449 A1 | 1/2008 |
| WO | 2010135519 A1 | 11/2010 |
| WO | 2011110277 A1 | 9/2011 |
| WO | 2018216990 A1 | 11/2018 |
| WO | 2021192795 A1 | 9/2021 |

OTHER PUBLICATIONS

Boyle et al., Composites, ASM Handbook, 2001, 21, Chapter Epoxy Resins, pp. 78-89, dated Dec. 31, 2001.

* cited by examiner

*Primary Examiner* — Bijan Ahvazi
(74) *Attorney, Agent, or Firm* — Westbridge IP LLC

(57) ABSTRACT

Disclsoed are organic compounds including at least one structural unit of formula (1) or (2), and containing at least one alcohol-soluble or water-soluble group are disclosed. Also provided are formulations and organic functional material films containing these organic compounds.

9 Claims, No Drawings

ORGANIC COMPOUNDS AND APPLICATIONS THEREOF IN OPTOELECTRONIC FIELD

CROSS-REFERENCE TO RELATED APPLICATIONS

This application is a continuation of International Application No. PCT/CN2021/123763, filed on Oct. 14, 2021, which claims priority to Chinese Patent Application No. CN202110370884.X, filed on Apr. 7, 2021 and Chinese Patent Application No. CN202011099557.7, filed on Oct. 14, 2020. All of the aforementioned applications are incorporated herein by reference in their entireties.

TECHNICAL FIELD

The present disclosure relates to organic optoelectronic materials and technologies, and in particular to organic compounds, formulations, and applications thereof in the optoelectronic field.

BACKGROUND

According to the principles of colorimetry, the narrower the full width at half maximum (FWHM) of the lights perceived by the human eyes is, the higher the color purity, and thus the more vivid the color display would be. Display devices with narrow-FWHM red, green and blue primary light are able to show vivid views with high color gamut and high visual quality.

The current mainstream full-color displays are achieved mainly in two ways. The first method is to actively emit red, green and blue lights, typically such as RGB-OLED display, etc. The current mature technology of manufacturing light emitting devices of all three colors is the vacuum evaporation method utilizing a fine metal mask, the complexity of processing leads to low yields, and the high-resolution display over 600 ppi is difficult to realize. The second method is to use color converters to convert the single-color light from the light emitting devices into different colors, thereby achieving a full-color display. For example, Samsung combines blue OLEDs with red and green quantum dots (QD) as the color converters. In this case, the fabrication of the light emitting devices is much simpler, and thus higher yield. Furthermore, the manufacture of the color converters can be achieved by different technologies, such as inkjet printing, transfer printing and photolithography, etc., appliable to a variety of display products with very different resolution requirements from low resolution large-size TV (around only 50 ppi) to high resolution silicon-based micro-display (over 3000 ppi).

Currently, there are mainly two types of color conversion materials used in mainstream color converters. The first one is inorganic nanocrystal, commonly known as quantum dot, which is a nanoparticle of inorganic semiconductor material (InP, CdSe, CdS, ZnSe, etc.) with a diameter of 2 to 8 nm. The small size of this material leads to quantum confinement effect, resulting in photoluminescent emissions with a specific frequency, which is highly dependent on the particle size. In this sense, the color of its emission can be readily tuned by adjusting the sizes. Limited by the current synthesis and separation technology of quantum dots, the FWHM of CD-containing quantum dots typically ranges from 25 to 40 nm, which meets the display requirements of NTSC for color purity. Meanwhile, Cd-free quantum dots generally come with larger FWHMs of 35 to 75 nm. Since Cd is considered highly hazardous to environment and human health, most countries have prohibited the use of Cd-containing quantum dots to produce electronic products. In addition, because of the not-sufficiency-large extinction coefficient of quantum dots, the rather thick film required for complete color conversion is rather high, typically above 10 µm. This is a great challenge to the mass production process, especially for Samsung's technology of combing blue OLED with red-green quantum dots.

The second one is organic dye, comprising various organic conjugated small molecules with chromophores. This organic dye generally has a relatively high extinction coefficient, but the intra-molecular thermal relaxation and the large vibration energy are always non-negligible, leading to the large FWHMs (typically over 60 nm) of their emission spectra. What is more, the color converters or the films are generally prepared by solution processing method, the organic conjugate systems commonly used today are relatively rigid, so that the solubility in organic solvent is limited, the processability is poor, and the common organic conjugate systems are difficult to use in the preparation of a display blue-light-plus-color converter displays.

Therefore, new materials still need to be further developed, so as to obtain organic materials with narrow FWHM, high solubility and good processing property. The color conversion film prepared with the organic materials can solve the current technical difficulties of combining blue OLED with red-green quantum dots and meet the requirements of high color gamut displays.

Beneficial effects: an organic compound as described herein has a relatively high solubility in a solvent, particularly an alcohol solvent, facilitating the preparation of inks for printing or coating processes, so as to achieve green environmental protection. Furthermore, the light emitting device with a relatively narrow FWHM and a high extinction coefficient, and is convenient to prepare a color converter with a relatively thin thickness, so as to achieve a wide color gamut display.

SUMMARY

In one aspect, the present disclosure provides an organic compound comprising a structural unit of formula (1) or (2),

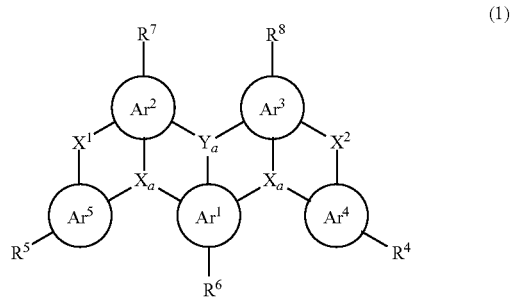

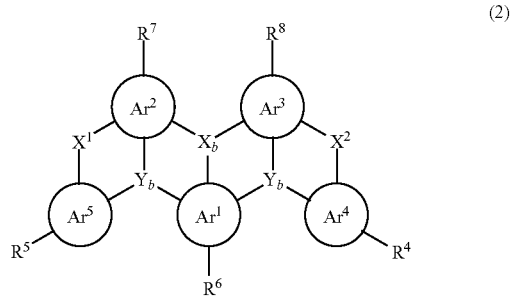

wherein:
each of $Ar^1$, $Ar^2$, and $Ar^3$ is independently an aromatic group containing 5 to 24 ring atoms, or a heteroaromatic group containing 5 to 24 ring atoms;
each of $Ar^4$ and $Ar^5$ is independently null, an aromatic group containing 5 to 24 ring atoms, or a heteroaromatic group containing from 5 to 24 ring atoms;
each of $Y_a$ and $Y_b$ is independently B, P=O, $C(R^9)$, $Si(R^9)$;
when neither $Ar^4$ nor $Ar^5$ is null, each of $X_a$ and $X_b$ is independently N, $C(R^9)$, $Si(R^9)$;
when $Ar^4$ and/or $Ar^5$ is null, each of the corresponding $X_a$ and $Y_b$ is independently $N(R^9)$, $C(R^9R^{10})$, $Si(R^9R^{10})$, C=O, O, C=$N(R^9)$, C=$C(R^9R^{10})$, $P(R^9)$, P(=O)$R^9$, S, S=O, or $SO_2$;
each of $X^1$ and $X^2$ is independently null or a bridging group;
$R^4$ to $R^{10}$ are independently selected from the group consisting of H, D, —F, —Cl, Br, I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic haloalkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_7$-$C_{20}$ aryloxycarbonyl group, a cyano group (—CN), a carbamoyl group (—C(=O)$NH_2$), a haloformyl group (—C(=C)—X where X represents a halogen atom), a formyl group (—C(=O)—H), an isocyano group, an isocyanate group, a thiocyanate group, an isothiocyanate group, a hydroxyl group, a nitro group, a $CF_3$ group, a cross-linkable group, a substituted/unsubstituted aromatic/heteroaromatic group containing 5 to 40 ring atoms, an aryloxy/heteroaryloxy group containing 5 to 40 ring atoms, an arylamine/heteroarylamine group containing 5 to 40 ring atoms, a disubstituted unit in any position of the above substituents and a combination thereof, wherein one or more of the substituent groups can form a monocyclic or polycyclic aliphatic or aromatic ring system with each other and/or with the ring bonded to the groups;
wherein the organic compound comprises at least one alcohol-soluble or water-soluble group.

In another aspect, the present disclosure also provides a formulation, comprising at least one of the organic compound as described herein, at least one organic solvent.

In yet another aspect, the present disclosure further provides an organic functional material film, comprising an organic compound as described herein, or prepared using a formulation as described herein.

In yet another aspect, the present disclosure further provides an optoelectronic device, comprising an organic compound or an organic functional material film as described herein.

DETAILED DESCRIPTION

The present disclosure may be embodied in many different forms and is not limited to the embodiments described herein. Rather, these embodiments are provided so that the understanding of the disclosure of the present disclosure will be more thorough.

All technical and scientific terms used herein have the same meaning as commonly understood by the skilled person in the art to which this disclosure belongs, unless otherwise defined. The terms used in the specification of the disclosure herein are for the purposes of describing specific embodiments only and are not intended to limit the present disclosure. The term "and/or" used herein includes any and all combinations of one or more of the related listed items.

As used herein, the terms "host material", "matrix material" have the same meaning, and they are interchangeable with each other.

As used herein, the terms "formulation", "printing ink", and "inks" have the same meaning, and they are interchangeable with each other.

In one aspect, the present disclosure provides an organic compound comprising a structural unit of formula (1) or (2),

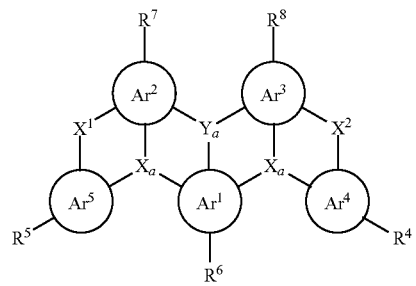

(1)

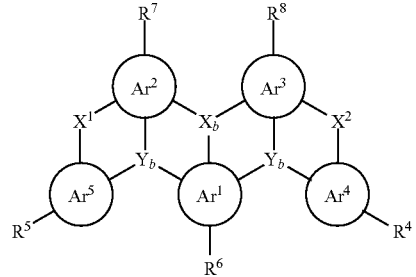

(2)

wherein:
each of $Ar^1$, $Ar^2$, $Ar^3$ is independently an aromatic group containing 5 to 24 ring atoms, or a heteroaromatic group containing 5 to 24 ring atoms;
each of $Ar^4$ and $Ar^5$ is independently null, an aromatic group containing 5 to 24 ring atoms, or a heteroaromatic group containing 5 to 24 ring atoms;
each of $Y_a$ and $Y_b$ is independently B, P=O, $C(R^9)$, $Si(R^9)$;
when neither $Ar^4$ nor $Ar^5$ is null, each of $X_a$ and $X_b$ is independently N, $C(R^9)$, $Si(R^9)$;
when $Ar^4$ and/or $Ar^5$ is null, each of the corresponding $X_a$ and $Y_b$ is independently $N(R^9)$, $C(R^9R^{10})$, $Si(R^9R^{10})$, C=O, O, C=$N(R^9)$, C=$C(R^9R^{10})$, $P(R^9)$, P(=O)$R^9$, S, S=O, or $SO_2$;
each of $X^1$ and $X^2$ is independently null or a bridging group;
$R^4$ to $R^{10}$ are independently selected from the group consisting of H, D, —F, —Cl, Br, I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic haloalkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_7$-$C_{20}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group, an isothiocyanate group, a hydroxyl group, a nitro group, a CF$_3$ group, a cross-linkable group, a substituted/unsubstituted aromatic/heteroaromatic group containing 5 to 40 ring atoms, an aryloxy/heteroaryloxy group containing 5 to 40 ring atoms, an arylamine/heteroarylamine group containing 5 to 40 ring atoms, a disubstituted unit in any position of the above substituents and combination thereof, wherein one or more of the substituent groups can form a monocyclic or polycyclic aliphatic or aromatic ring system with each other and/or with the ring bonded to the groups:

wherein the organic compound comprises at least one alcohol-soluble or water-soluble group.

Preferably, R$^4$ to R$^{10}$ are independently selected from the group consisting of H, D, a C$_1$-C$_{10}$ linear alkyl group, a C$_1$-C$_{10}$ linear alkoxy group, a C$_1$-C$_{10}$ linear thioalkoxy group, a C$_1$-C$_{10}$ linear silyl group, a C$_3$-C$_{10}$ branched/cyclic alkyl group, a C$_3$-C$_{10}$ branched/cyclic alkoxy group, a C$_3$-C$_{10}$ branched/cyclic thioalkoxy group, a C$_3$-C$_{10}$ branched/cyclic silyl group, a C$_1$-C$_{10}$ ketone group, a C$_2$-C$_{10}$ alkoxycarbonyl group, a C$_7$-C$_{10}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group or an isothiocyanate group, a hydroxyl group, a nitro group, a CF$_3$ group, Cl, Br, F, a crosslinkable group, a substituted/unsubstituted aromatic/heteroaromatic group containing 5 to 20 ring atoms, an aryloxy/heteroaryloxy group containing 5 to 20 ring atoms, an arylamine/heteroarylamine group containing 5 to 20 ring atoms, and any combination thereof, wherein one or more of the substituent R$^2$ groups can form a monocyclic or polycyclic aliphatic or aromatic ring system with each other and/or with the ring bonded to the groups.

In some embodiments, the organic compound comprise at least two alcohol-soluble or water-soluble groups.

In some embodiments, the organic compound comprise at least three alcohol-soluble or water-soluble groups.

In some embodiments, at least one of X$^1$ or X$^2$ is null; particularly preferably, both are null, in which case the organic compound comprises a structural unit of formula (1b) or (2b):

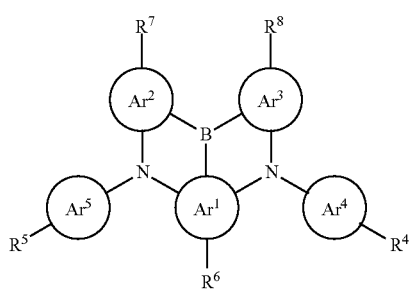

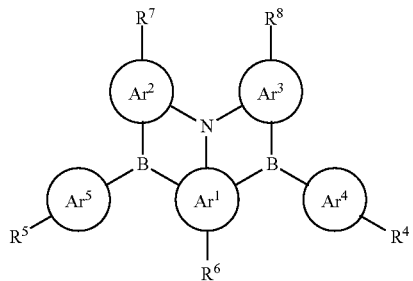

In some embodiments, at least one of X$^1$ or X$^2$ is a single bond; particularly preferably, both are single bonds, and the organic compound comprises a structural unit of formula (1c) or (2c):

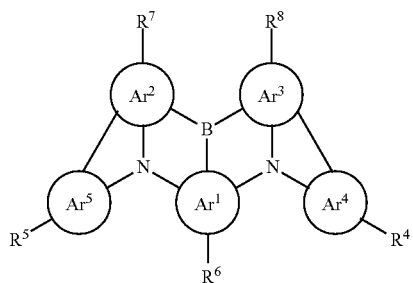

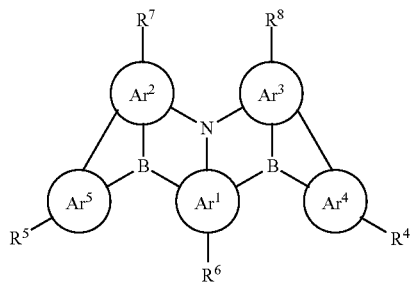

In some embodiments, X$^1$ and X$^2$ at each occurrence are the same or different di-bridging group; the preferred di-bridging groups are selected form the following formulas:

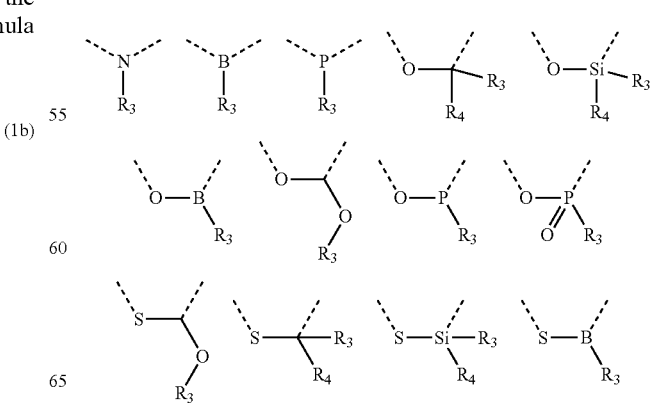

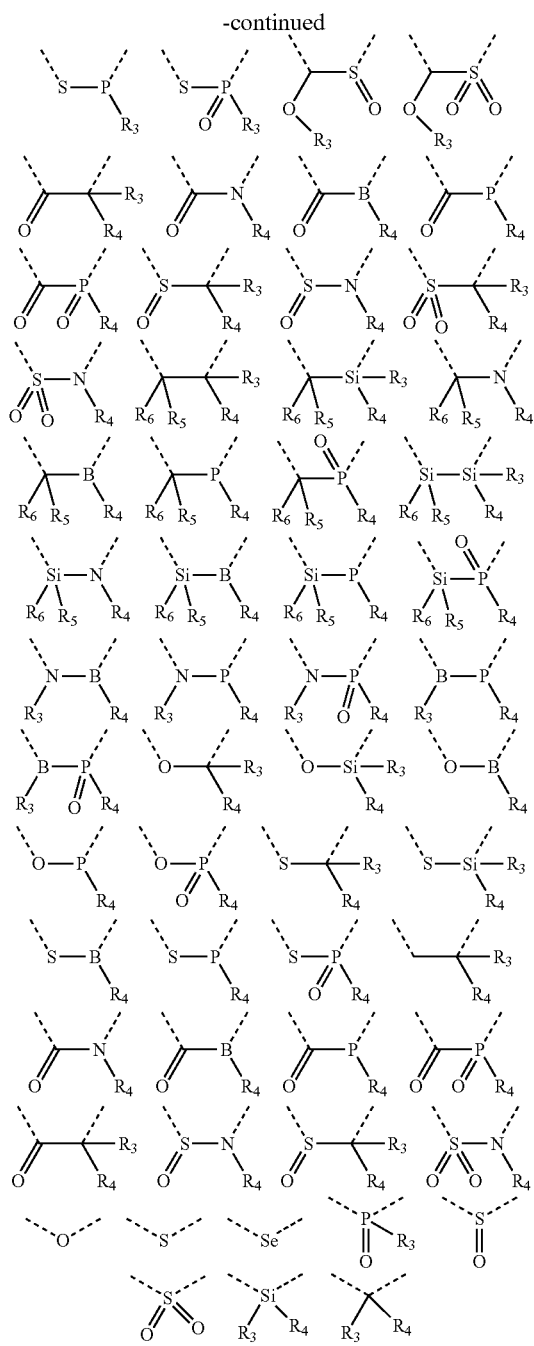

wherein $R_3$, $R_4$, $R_5$ and $R_6$ are identically defined as the above-mentioned $R_4$, and the dashed bonds refer to the covalent bonds connecting to the adjacent structural units.

For the purposes of the present disclosure, the aromatic ring system contains 5 to 10 carbon atoms in the ring system, the heteroaromatic ring system contains 1 to 10 carbon atoms and at least one heteroatom in the ring system, while the total number of carbon atoms and heteroatoms is at least 4. The heteroatoms are preferably selected from Si, N, P, O, S and/or Ge, particularly preferably selected from Si, N, P, O and/or S. For the purposes of the present disclosure, the aromatic ring groups or heteroaromatic ring groups contain not only aromatic or heteroaromatic groups, but also a plurality of aromatic or heteroaromatic groups are interconnected by short non-aromatic units (<10% of non-H atoms, more specifically 5% of non-H atoms, such as C, N or O atoms). Therefore, systems such as 9,9'-spirobifluorene, 9,9-diarylfluorene, triarylamine, diaryl ether, and the like are also considered to be aromatic ring systems for the purposes of this disclosure.

For the purposes of the present disclosure, the any H atom on the organic compound may be optionally substituted with a $R^4$ group, wherein $R^4$ may be selected from the group consisting of: (1) a C1 to C10 alkyl group, particularly preferably the following groups: methyl, ethyl, n-propyl, isopropyl, cyclopropyl, n-butyl, isobutyl, sec-butyl, t-butyl, cyclobutyl, 2-methylbutyl, n-pentyl, n-hexyl, cyclohexyl, n-heptyl, cycloheptyl, n-octyl, cyclooctyl, 2-ethylhexyl, trifluoromethyl, pentafluoromethyl, 2,2,2-trifluoroethyl, vinyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, and octynyl; (2) a C1 to C10 alkoxy group, particularly preferably methoxy, ethoxy, n-propoxy, isopropoxy, n-butoxy, isobutoxy, sec-butoxy, tert-butoxy, and 2-methylbutoxy; (3) a C2 to C10 aryl or heteroaryl group, which may be monovalent or divalent depending on the application, and in each case can also be optionally substituted with the group $R^4$ mentioned above and may be linked to an aromatic or heteroaromatic ring at any desired position, particularly preferably selected from the the group group consisting of: benzene, naphthalene, anthracene, dihydropyrene, chrysene, pyrene, fluoranthene, naphthacene, pentacene, benzopyrene, furan, benzofuran, isobenzofuran, dibenzofuran, thiophene, benzothiophene, isobenzothiophene, thiofluorene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthromidazole, pyridimidazole, pyrazine-imidazole, quinoxaline-imidazole, oxazole, benzoxazole, naphthoxazole, anthracenazole, phenoxazole, isoxazole, 1,2-thiazole, 1,3-thiazole, benzothiazole, pyridazine, benzopyridazine, pyrimidine, benzopyrimidine, quinoxaline, pyrazine, phenazine, 1,5-naphthyridine, carbazole, benzocholine, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole. 1,2,4,5-tetrazine, 1,2,3,4-tetrazine, 1,2,3,5-tetrazine, purine, pteridine, indolizine, and benzothiadiazole. For the purposes of the present disclosure, aromatic and heteroaromatic ring systems are particularly considered to be, in addition to the above-mentioned aryl and heteroaryl groups, also refer to biphenylene, terphenylene, fluorene, spirofluorene, dihydrophenanthrene, tetrahydropyrene, cis-indenofluorene, and trans-indenofluorene.

In some embodiments, the organic compounds of formulas (1)-(1e) or (2)-(2e), wherein $Ar^1$ to $Ar^5$ the same or different, at each occurrence, are independently selected from the group consisting of aromatic/heteroaromatic groups with 5 to 20, preferably 5 to 18, more preferably 5 to 15 ring atoms, and most preferably 5 to 10 ring atoms, they may be unsubstituted or further substituted by one or two $R^4$ groups. Preferred aromatic/heteraromatic groups include benzene, naphthalene, anthracene, phenanthrene, pyridine, pyrene, and thiophene.

In some embodiments, $Ar^1$ to $Ar^5$ are each independently selected from the following structural formulas:

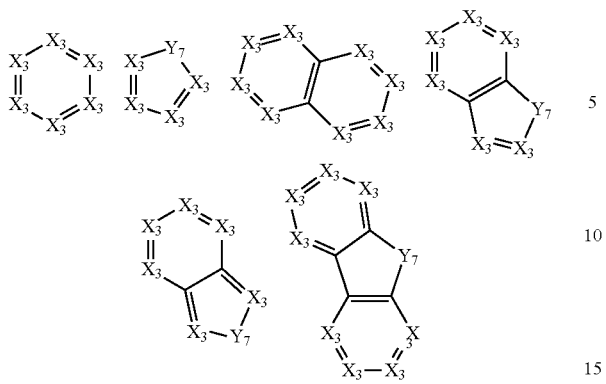

each $X_3$ is $CR^6$ or N;
each $Y_7$ is $CR^7R^8$, $SiR^9R^{10}$, $NR^6$, C(=O), S, or O.

Further, each of $Ar^1$, $Ar^2$, $Ar^3$, $Ar^4$, $Ar^5$ can be independently selected from one of the following structural formulas or any combination thereof, which can be further arbitrarily substituted:

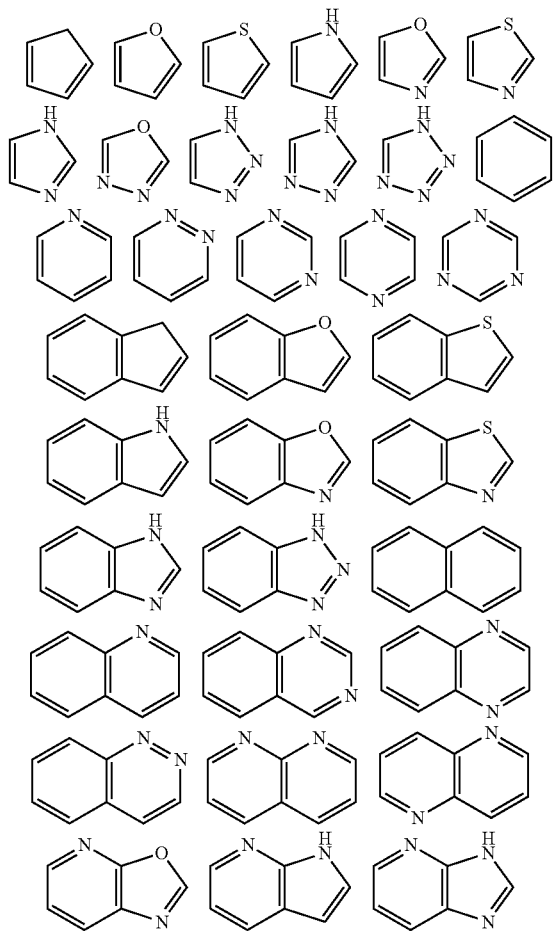

For the purposes of the present disclosure, in some embodiments, each of $Ar^1$ to $Ar^5$ is phenyl group in the structural units of formula (1) or (2).

In some embodiments, the organic compound as described herein comprises a structural unit of formula (1a) or (2a):

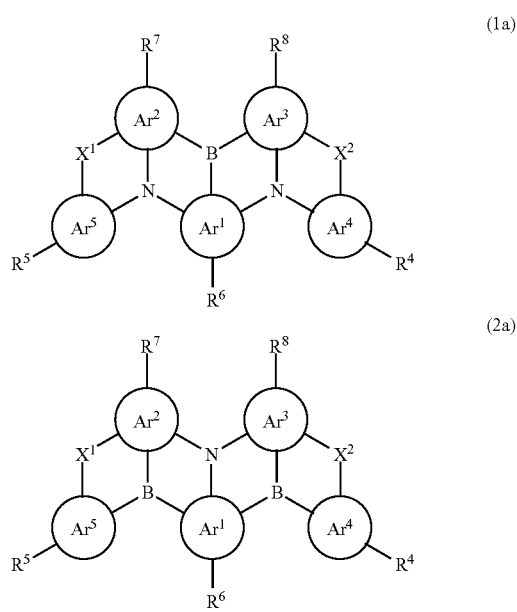

wherein each of $X^1$ and $X^2$ is O or S, and particularly preferably is O.

In some embodiments, the organic compound as described herein, comprises a structural unit represented by one of the formulas (1d)-(2d) and (1e)-(2e):

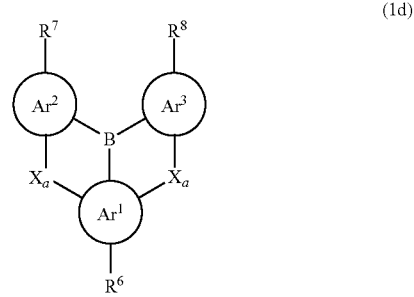

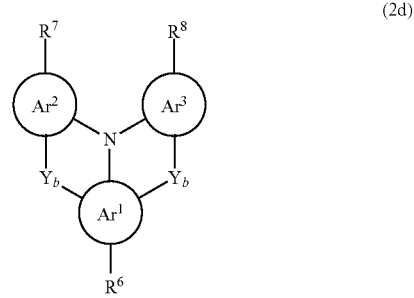

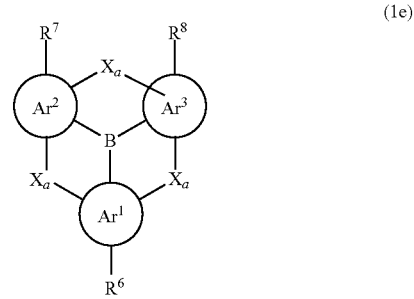

-continued

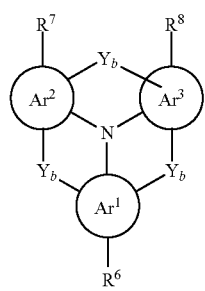
(2e)

Preferentially, each $Y_b$ in the formulas (2d) and (2e) is independently C=O, O, P(=O)$R^9$, S=O, or $SO_2$, and particularly preferred is C=O.

Preferably, each $X_a$ in the formulas (1d) and (1e) is independently N($R^9$), C($R^9R^{10}$), Si($R^9R^{10}$), O, S.

In some embodiments, the structural units of formulas (1), (2), (1a)-(1e), (2a)-(2e), wherein $R^4$ to $R^8$ may be same or different, at each occurrences, comprising the following structural units or any combination thereof:

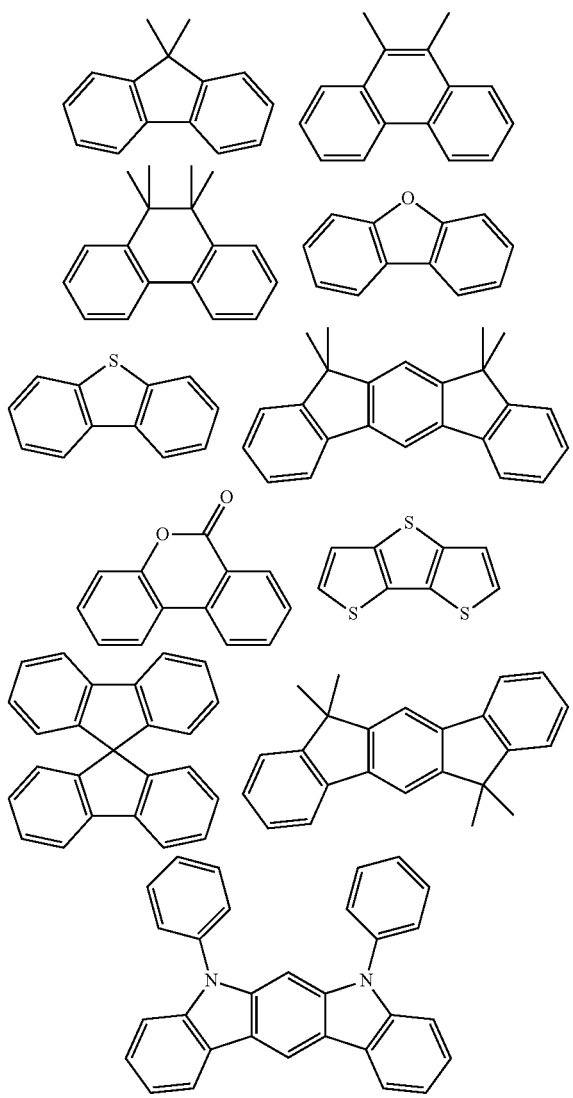

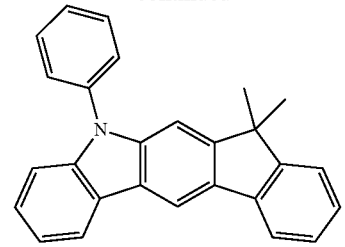

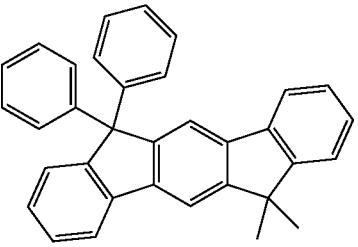

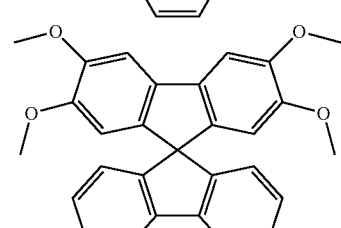

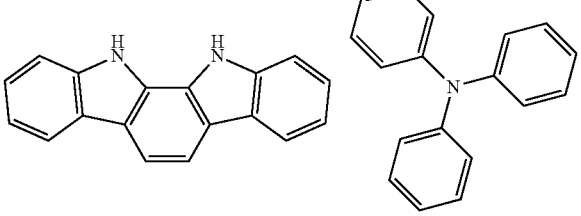

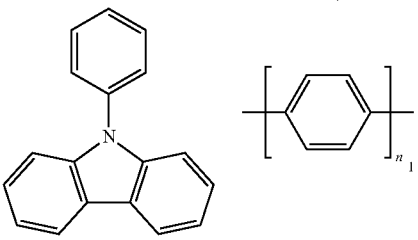

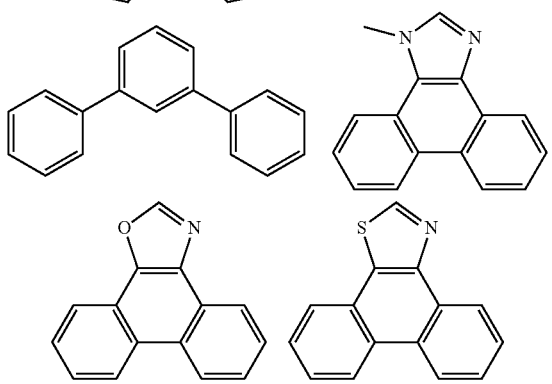

-continued

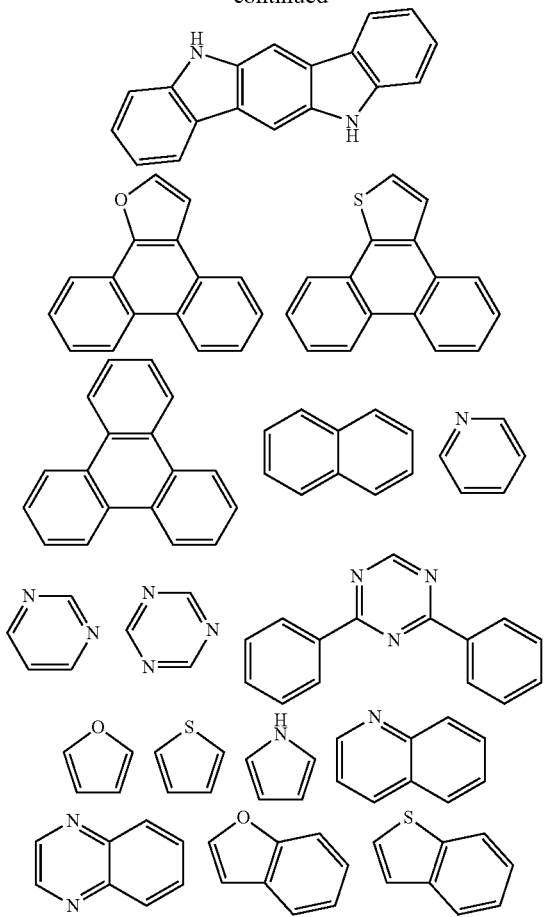

wherein $n_1$ is 1, or 2, or 3, or 4.

In some embodiments, the structure of the organic compound is shown below:

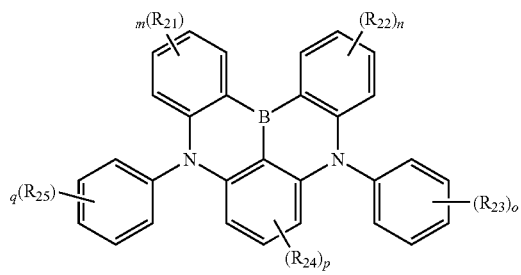

wherein $R_{21}$ to $R_{25}$ are independently selected from the group consisting of H, D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_7$-$C_{20}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group or an isothiocyanate group, a hydroxyl group, a nitro group, a $CF_3$ group, Cl, Br, F, a crosslinkable group, a substituted/unsubstituted aromatic/heteroaromatic group containing 5 to 40 ring atoms, an aryloxy/heteroaryloxy group containing 5 to 40 ring atoms, and any combination thereof, wherein one or more of the substituent groups can form a monocyclic or polycyclic aliphatic or aromatic ring system with each other and/or with the ring bonded to the groups; and at least one of $R^{21}$ to $R^{25}$ contains an alcohol-soluble or water-soluble group.

m, n are integers from 0 to 4; o, q are integers from 0 to 5; p is an integer from 0 to 3.

Preferably, $R_{21}$ to $R_{25}$ are independently selected from the group consisting of H, D, a $C_1$-$C_{10}$ linear alkyl group, a $C_1$-$C_{10}$ linear alkoxy group, a $C_1$-$C_{10}$ linear thioalkoxy group, a $C_3$-$C_{10}$ branched/cyclic alkyl group, a $C_3$-$C_{10}$ branched/cyclic alkoxy group, a $C_3$-$C_{10}$ branched/cyclic thioalkoxy group, a $C_3$-$C_{10}$ branched/cyclic silyl group, a $C_1$-$C_{10}$ ketone group, a $C_2$-$C_{10}$ alkoxycarbonyl group, a $C_7$-$C_{10}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group or an isothiocyanate group, a hydroxyl group, a nitro group, a $CF_3$ group, Cl, Br, F, a crosslinkable group, a substituted/unsubstituted aromatic/heteroaromatic group containing 5 to 20 ring atoms, an aryloxy/heteroaryloxy group containing 5 to 20 ring atoms, and any combination thereof, wherein one or more of the substituent groups can form a monocyclic or polycyclic aliphatic or aromatic ring system with each other and/or with the ring bonded to the groups.

In the embodiments of the present disclosure, triplet energy level (T1), singlet energy level (S1), highest occupied molecular orbital (HOMO), and lowest unoccupied molecular orbital (LUMO) play key roles in the energy level structure of the organic material. The determination of these energy levels is introduced as follows.

HOMO and LUMO energy levels can be measured by photoelectric effects, for example by XPS (X-ray photoelectron spectroscopy), UPS (UV photoelectron spectroscopy), or by cyclic voltammetry (CV). Recently, quantum chemical methods, such as density functional theory (DFT), are becoming effective methods for calculating the molecular orbital energy levels.

The triplet energy level T1 of the organic materials can be measured by low-temperature time-resolved luminescence spectroscopy, or calculated by quantum simulation (such as by Time-dependent DFT), for instance with the commercial software Gaussian 03W (Gaussian Inc.).

The singlet energy level S1 of the organic material can be determined by the absorption spectrum or the emission spectrum, and can also be calculated by quantum simulation (such as Time-dependent DFT).

It should be noted that the absolute values of HOMO, LUMO, T1, and S1 may varies depend on the measurement method or calculation method used. Even for the same method, different ways of evaluation, for example, using either the onset or peak value of a CV curve as reference, may result in different (HOMO/LUMO) values. Therefore, reasonable and meaningful comparison should be carried out by using the same measurement and evaluation methods. In the embodiments of the present disclosure, the values of HOMO, LUMO, T1, and S1 are based on Time-dependent DFT simulation, which however should not exclude the applications of other measurement or calculation methods.

In some embodiments, the S1-T1 of the organic compound as described herein ≤0.30 eV, preferably ≤0.25 eV, more preferably ≤0.20 eV, particularly preferably ≤0.15 eV, and most preferably ≤0.10 eV.

In some embodiments, the alcohol-soluble or water-soluble group of the organic compound as described herein is selected from: alcohols, aldehydes, acids, crown ethers, polyethers, or primary amines.

Preferably, the alcohol-soluble or water-soluble group is selected from the group consisting of:

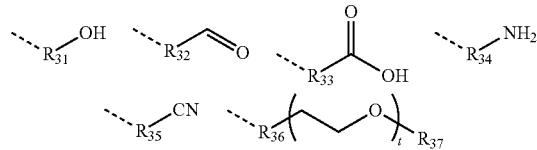

$R_{31}$ to $R_{37}$ are independently selected from the group consisting of a $C_1$-$C_{20}$ linear alkyl group, a $C_1$-$C_{20}$ alkoxy group, a $C_1$-$C_{20}$ thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group or an isothiocyanate group, a hydroxyl group, a nitro group, a $CF_3$ group, Cl, Br, F, a crosslinkable group, a substituted/unsubstituted aromatic/heteroaromatic group containing 5 to 40 ring atoms, an aryloxy/heteroaryloxy group containing 5 to 40 ring atoms, and any combination thereof, wherein one or more of the substituent groups can form a monocyclic or polycyclic aliphatic or aromatic ring system with each other and/or with the ring bonded to the groups.

The dashed lines represent bonded bonds, t is an integer greater than 0.

Furthermore, individual H atoms or $CH_2$ groups as described herein may be substituted by above-mentioned groups or R group. R is selected from the group consisting of $C_1$-$C_{40}$ alkyl groups, preferably from the group consisting of: methyl, ethyl, n-propyl, isopropyl, cyclopropyl, n-butyl, isobutyl, sec-butyl, t-butyl, cyclobutyl, methylbutyl, n-pentyl, sec-pentyl, cyclopentyl, n-hexyl, cyclohexyl, n-heptyl, cycloheptyl, n-octyl, cyclooctyl, ethylhexyl, trifluoromethyl, pentafluoroethyl, trifluoroethyl, vinyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, and octynyl; and $C_1$-$C_{40}$ alkoxy groups, such as methoxy, trifluoromethoxy, ethoxy, n-propoxy, isopropoxy, n-butoxy, isobutoxy, sec-butoxy, tert-butoxy, and methylbutoxy.

In some embodiments, in the organic compound as described herein, the total percentage of $SP^3$ hybrid groups does not exceed 50% of the total molecular, more preferably does not exceed 30%, and most preferably does not exceed 20%. The presence of less $SP^3$ hybrid groups can effectively ensure the thermal stability of the compound, thereby ensuring the stability of the devices.

In some embodiments, in order to improve solubility and/or film-forming property, in the organic compound as described herein, the total percentage of the $SP^3$ hybrid groups exceeds 20% of the total molecular, preferably exceeds 30%, more preferably exceeds 40%, and most preferably exceeds 50%.

In some embodiments, the full width at half maximum (FWHM) of the emission spectrum of the organic compound is ≤50 nm, preferably ≤45 nm, more preferably ≤40 nm, particularly preferably ≤35 nm, and most preferably ≤30 nm.

Examples of suitable organic compounds as described herein are listed below, but not limited to:

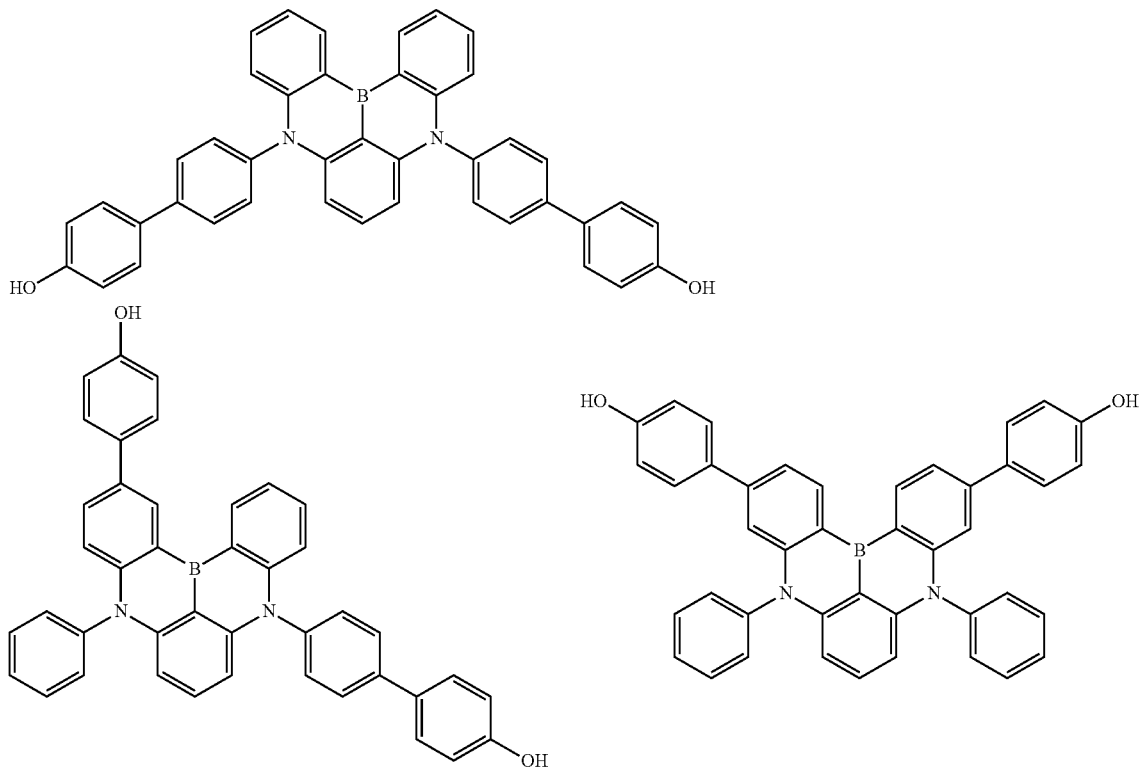

-continued
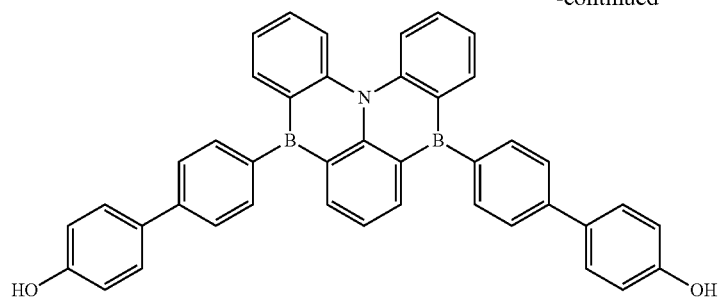
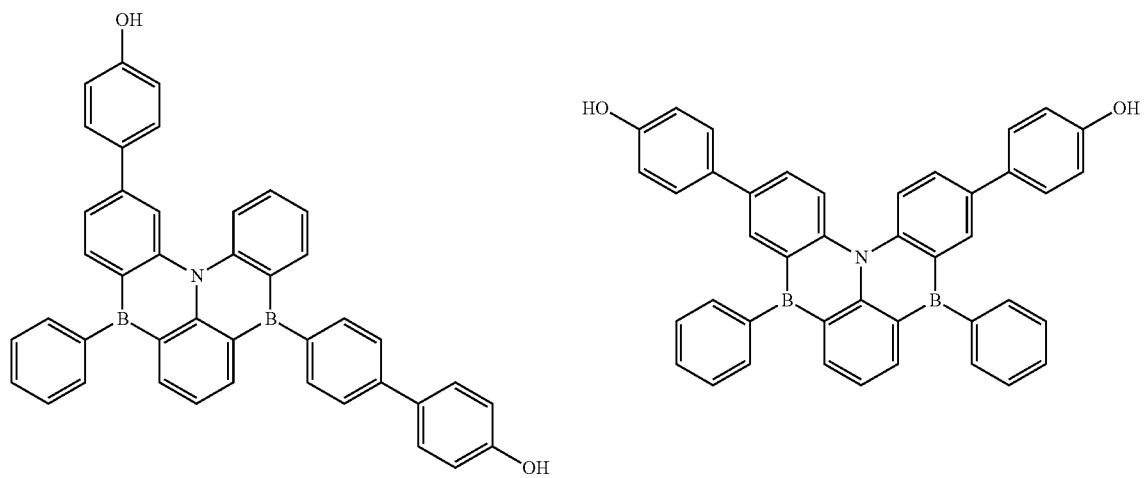
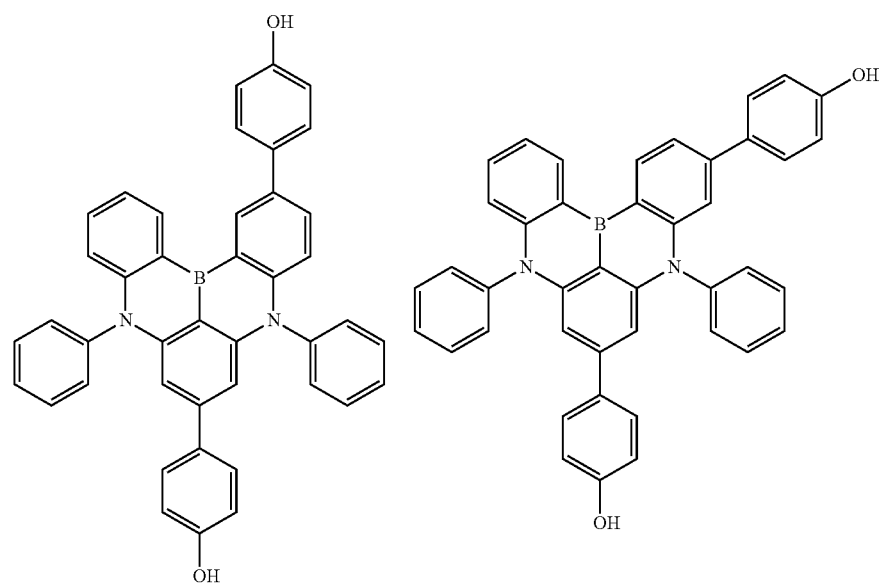

-continued
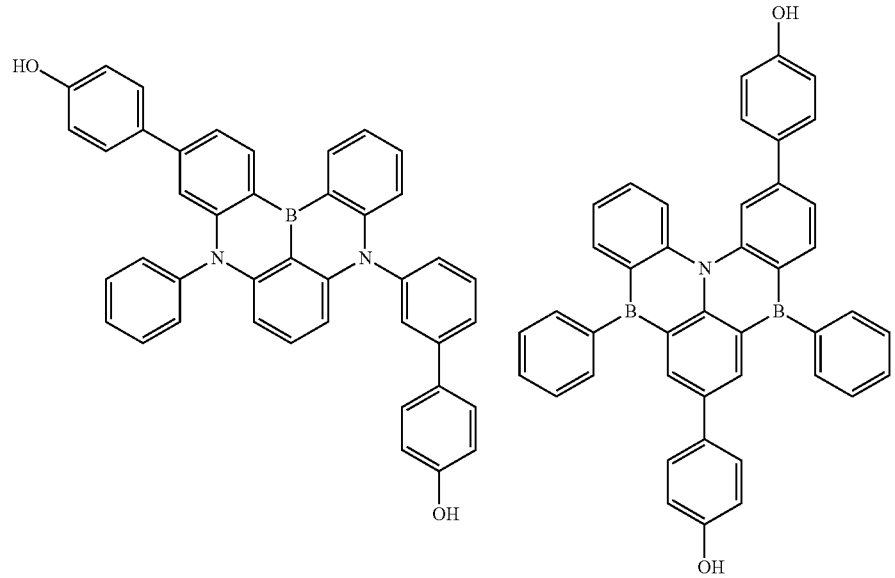
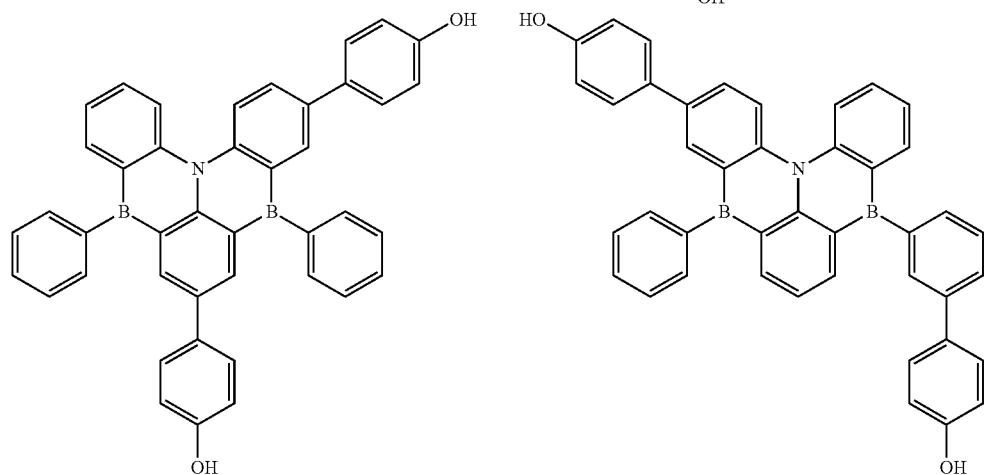
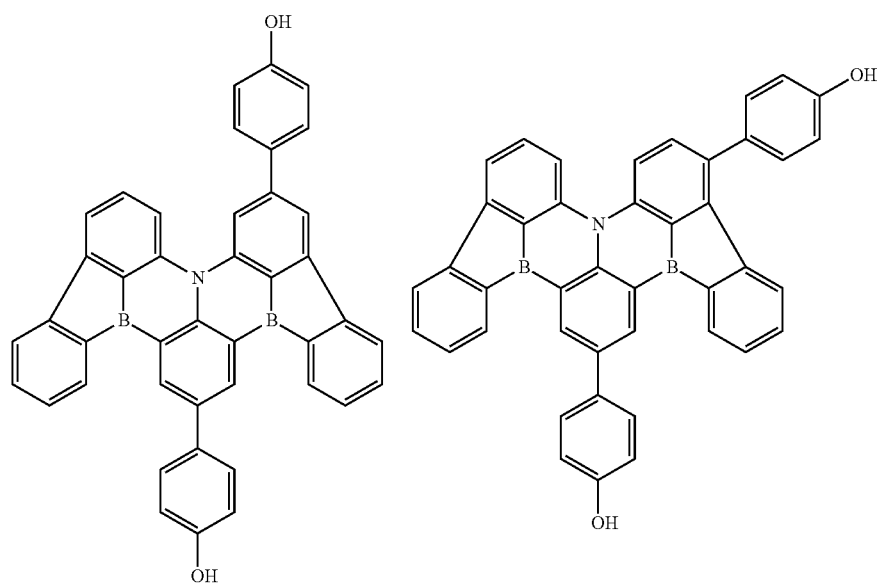

-continued
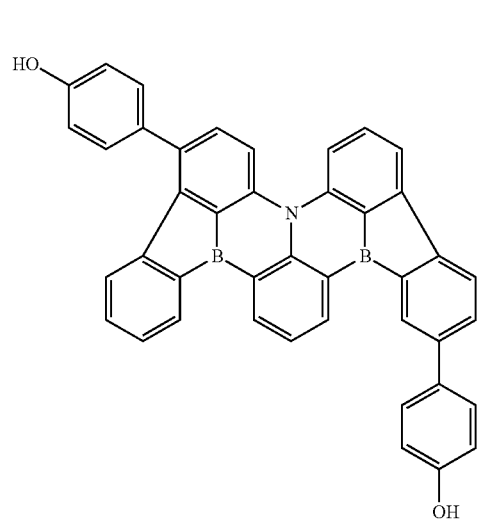
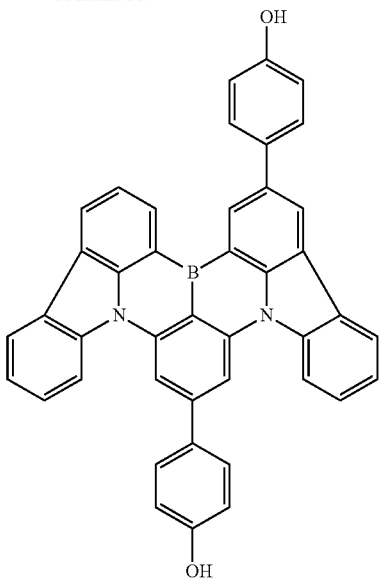
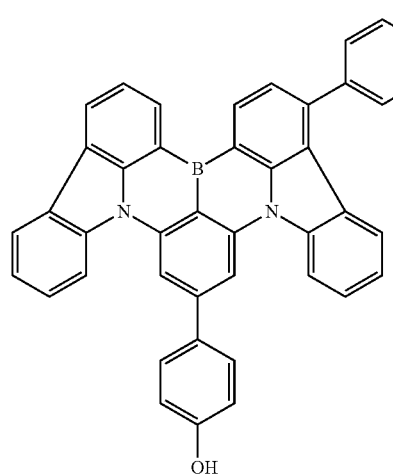
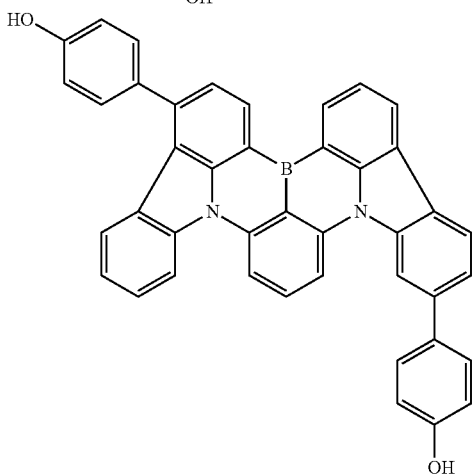
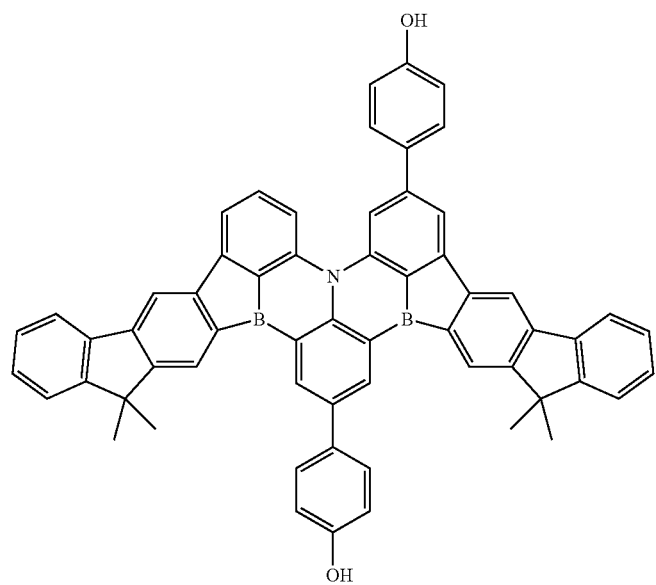

-continued
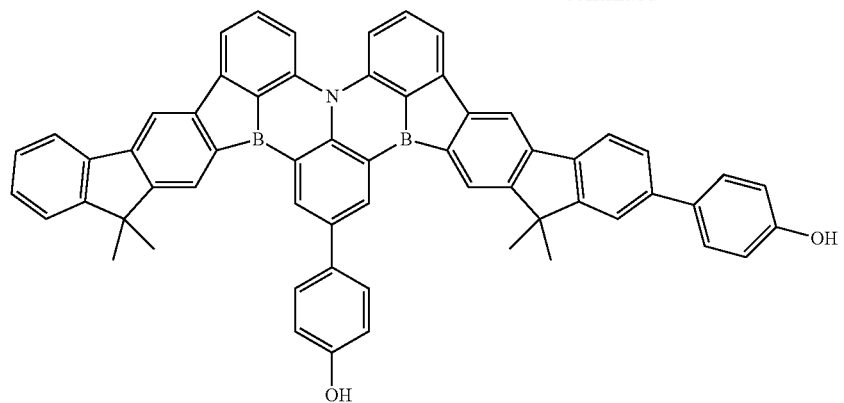
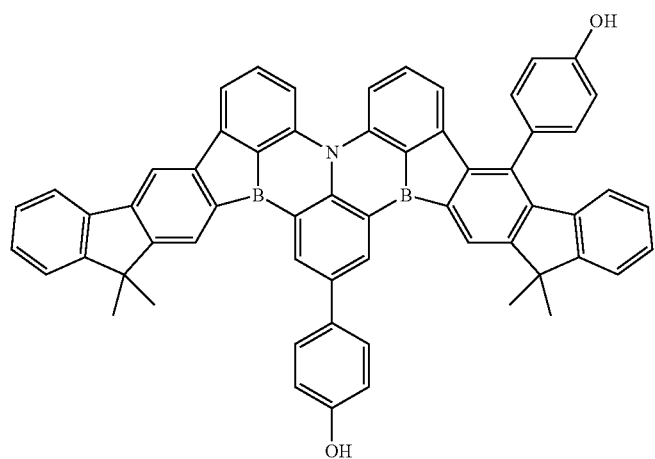
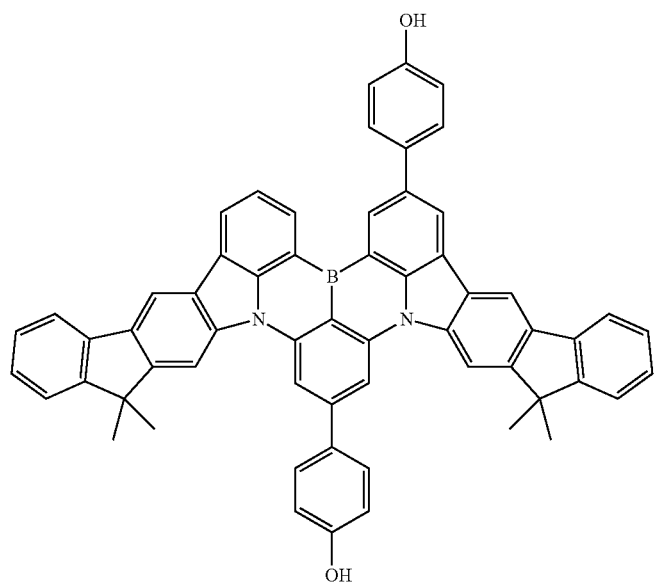

-continued
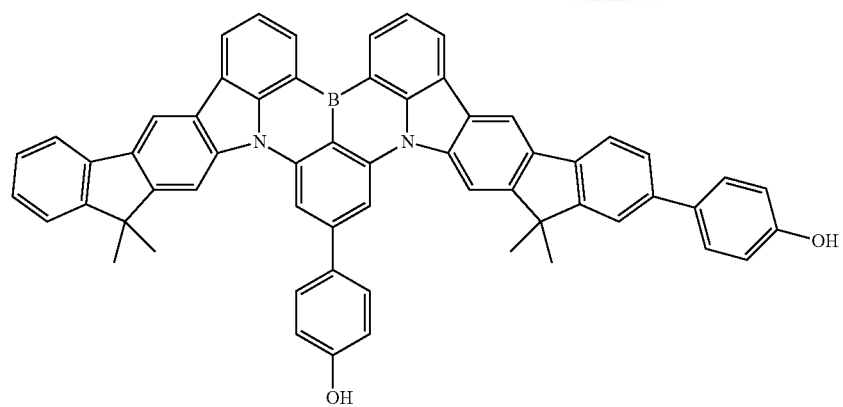
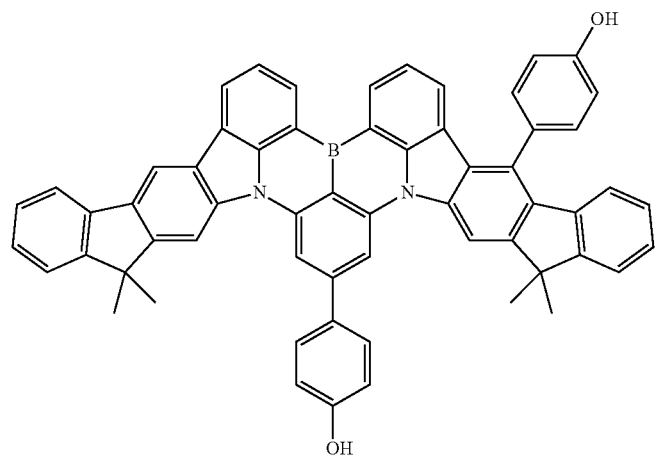
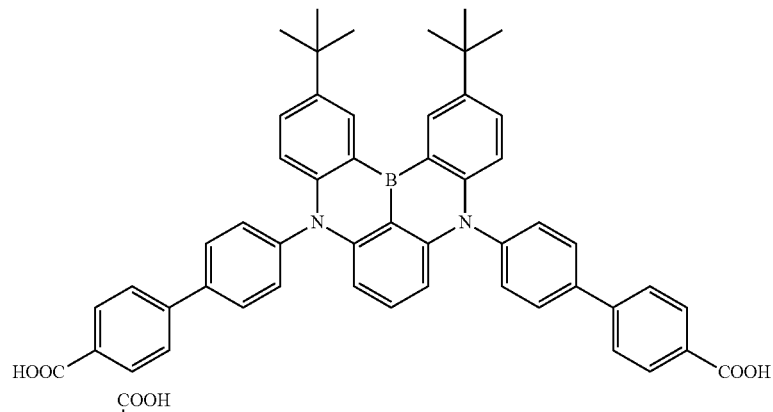
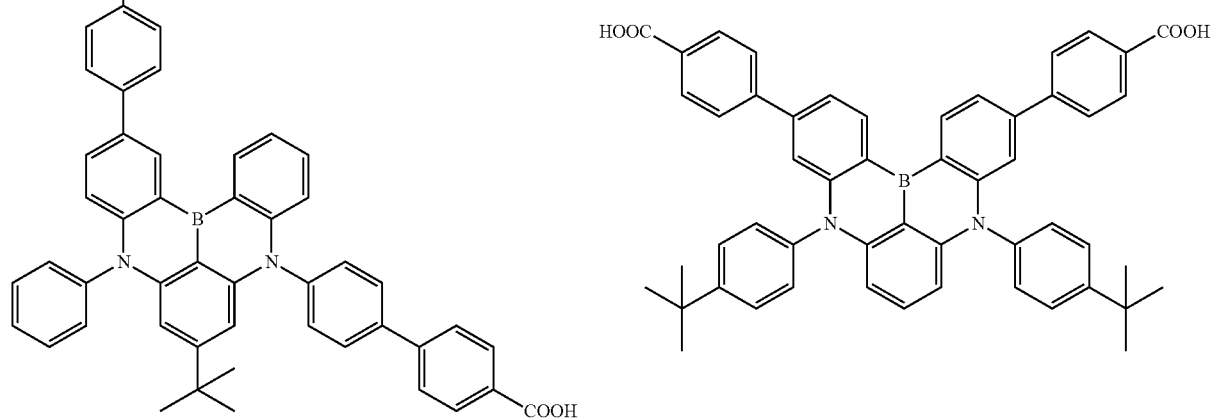

-continued
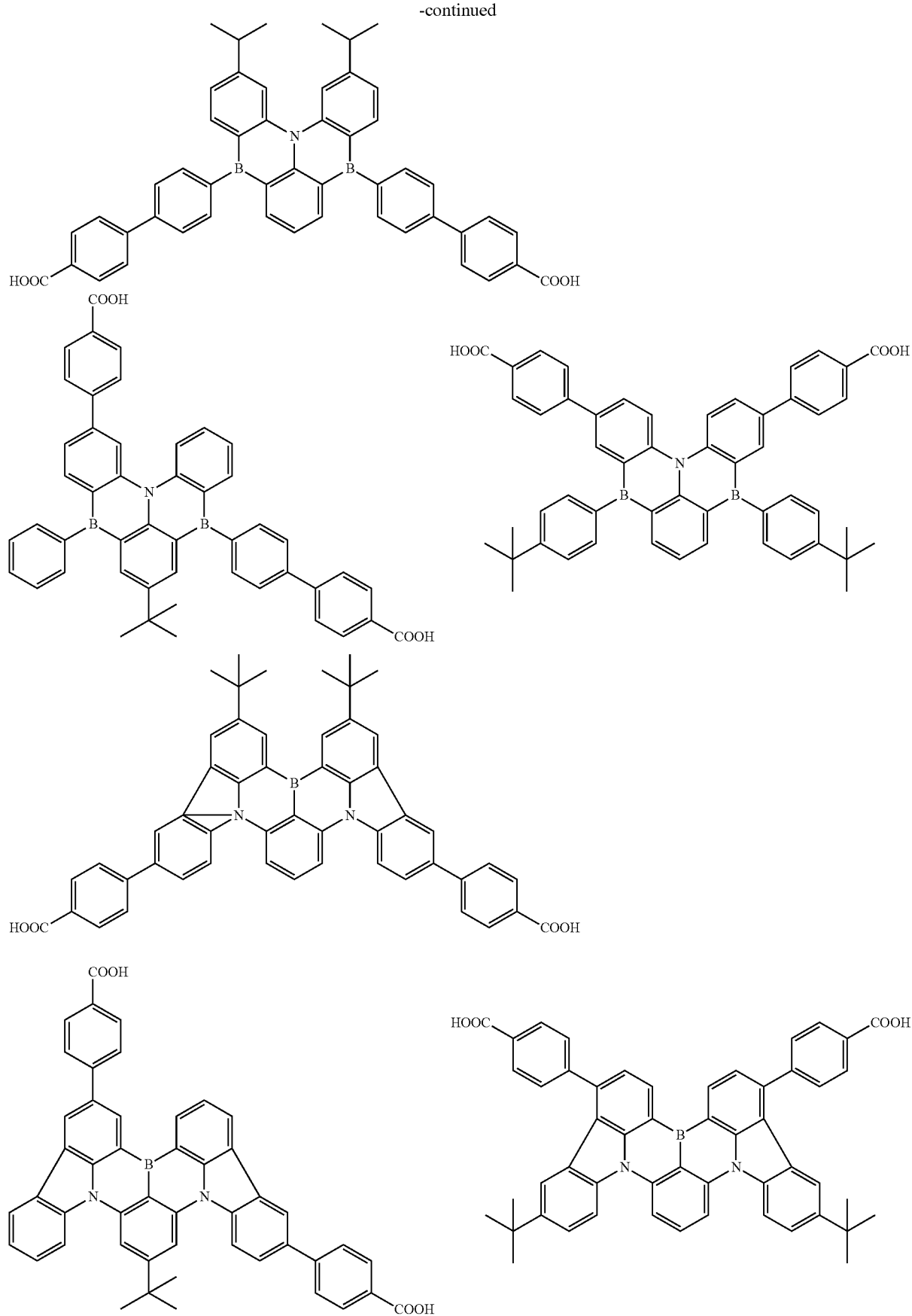

-continued
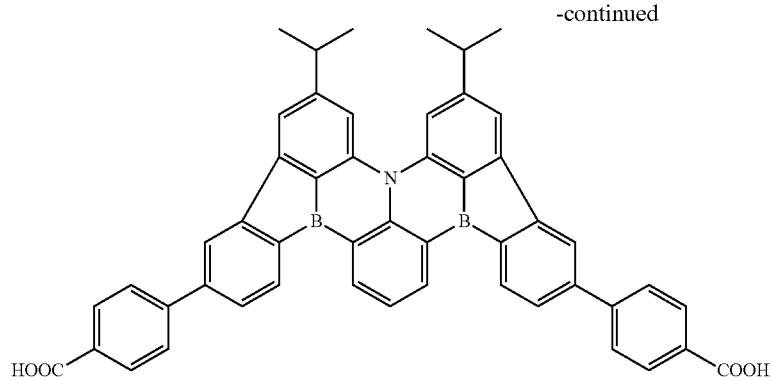
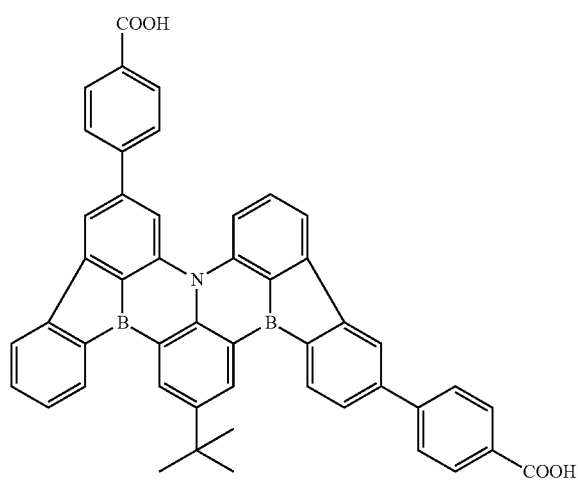
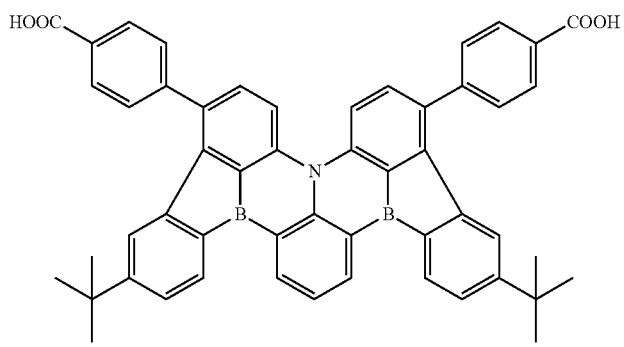
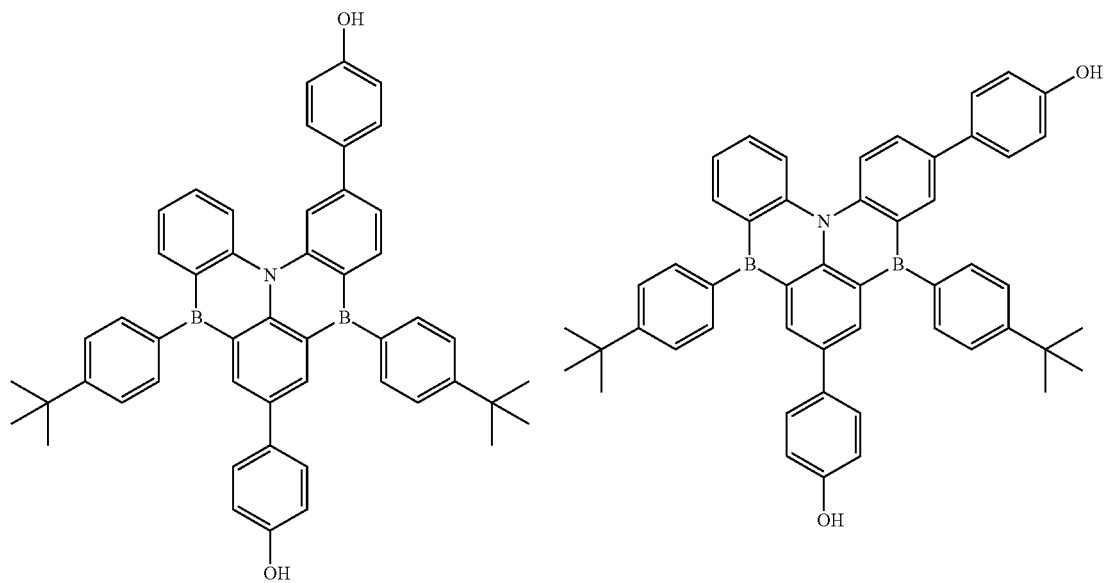

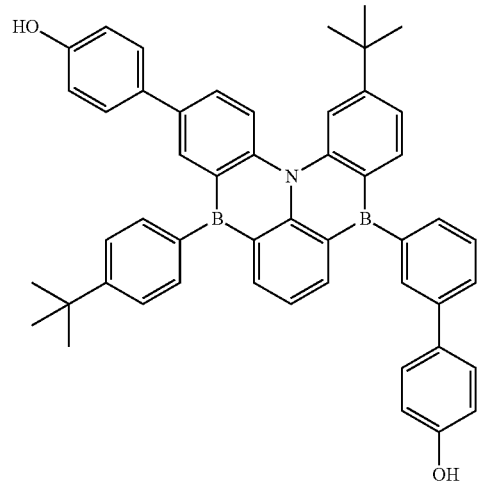
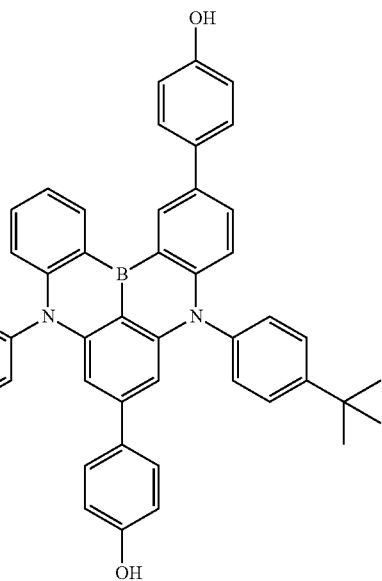
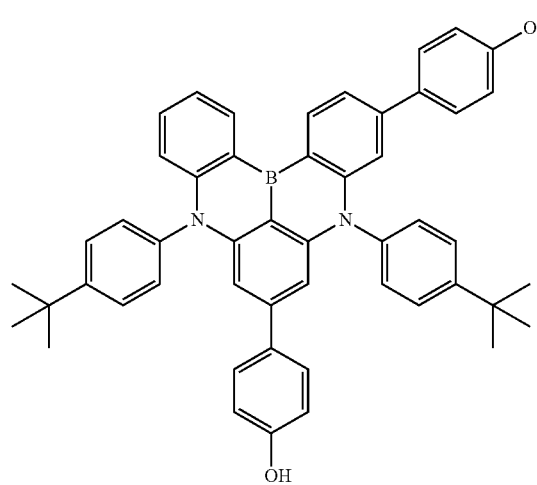
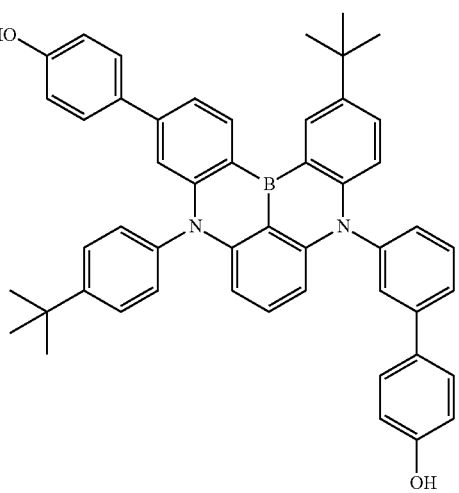
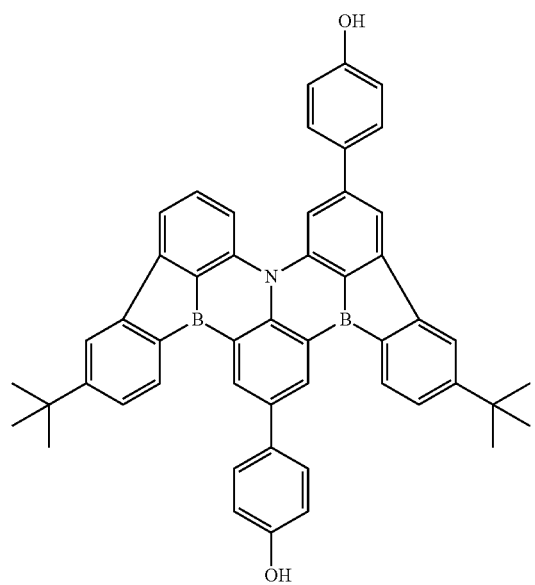
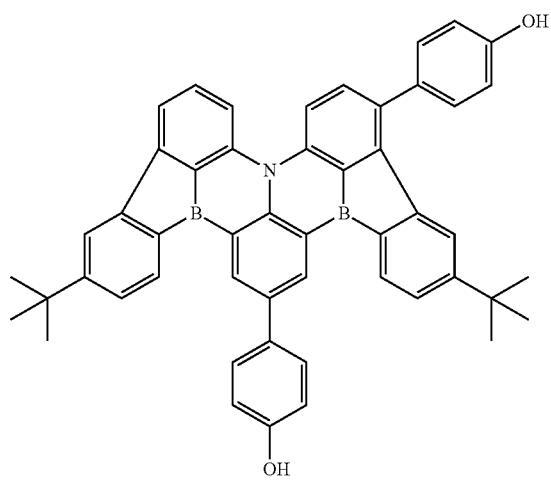

-continued
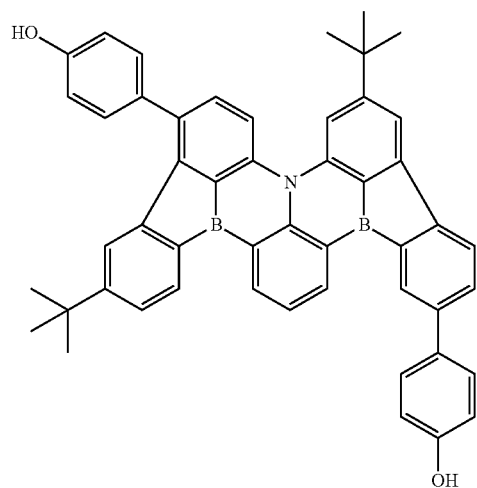
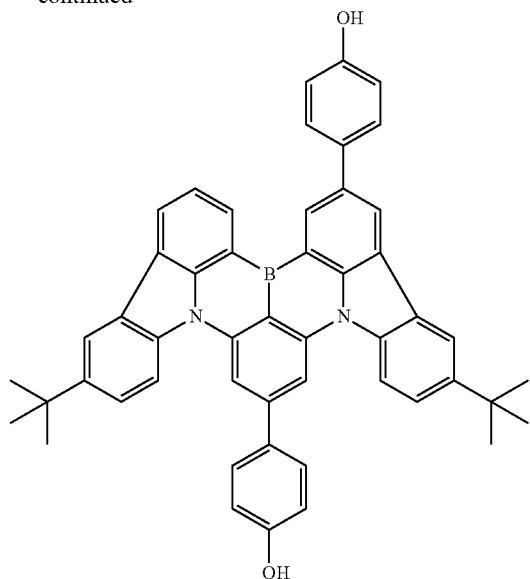
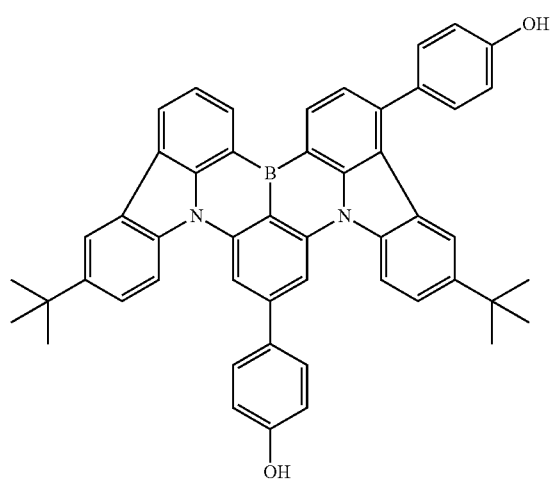
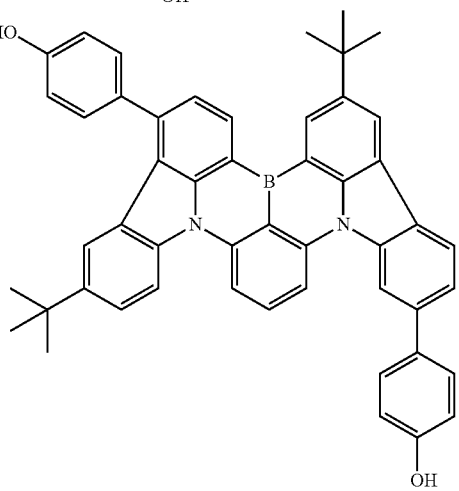
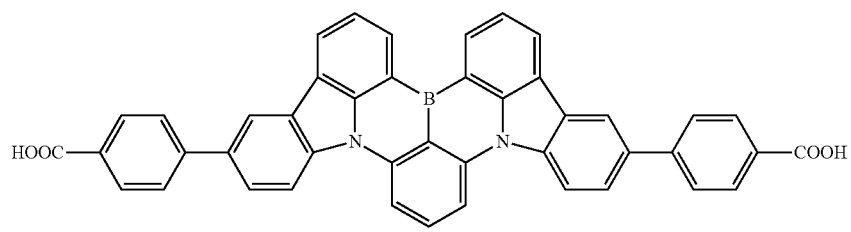
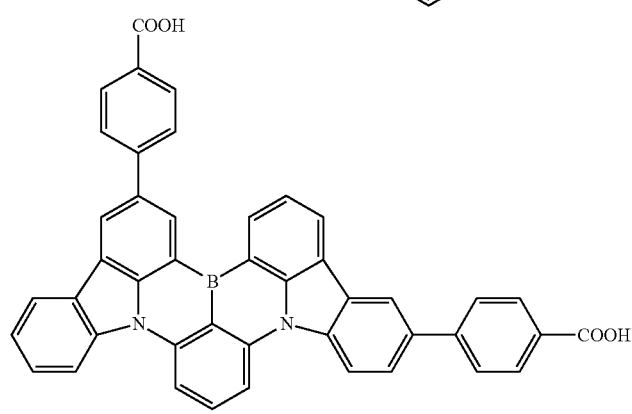

-continued
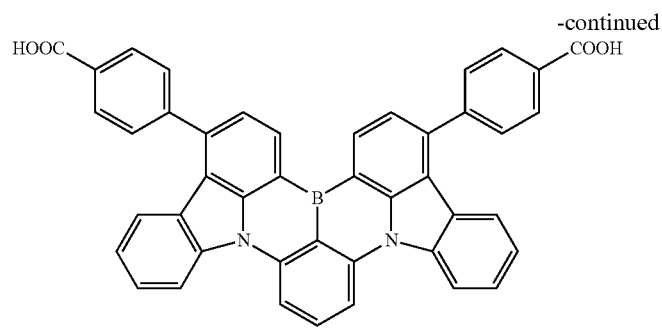
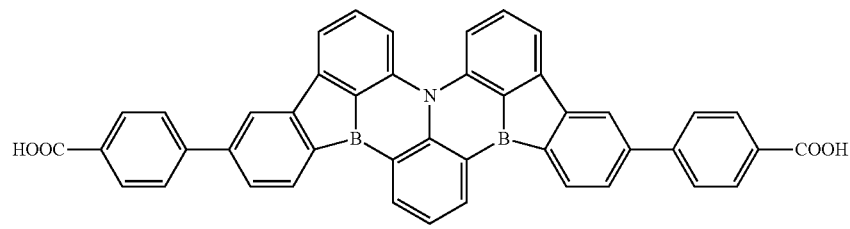
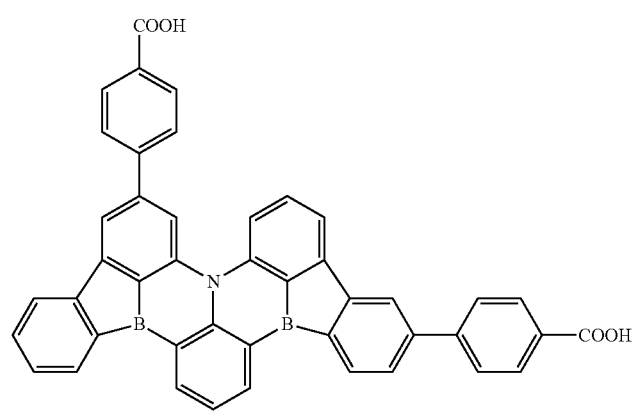
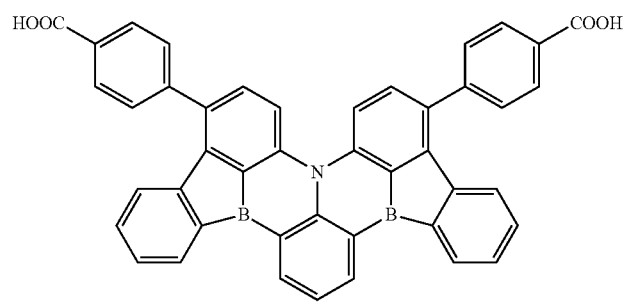
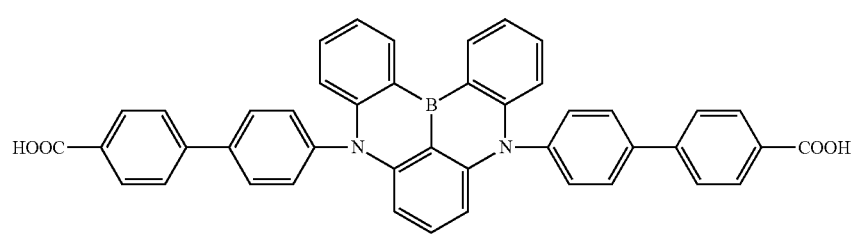

-continued
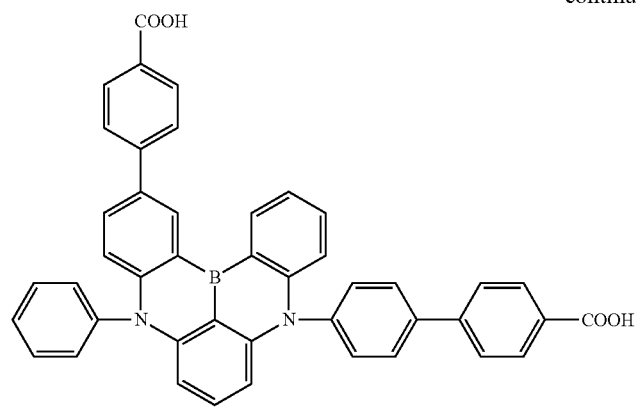
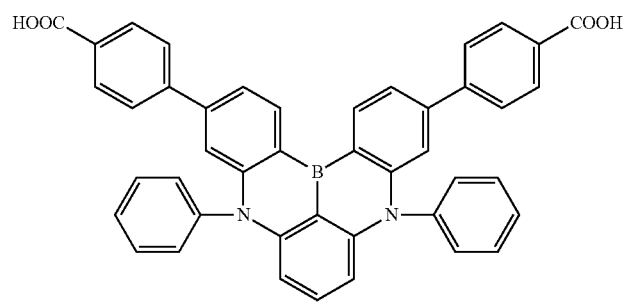
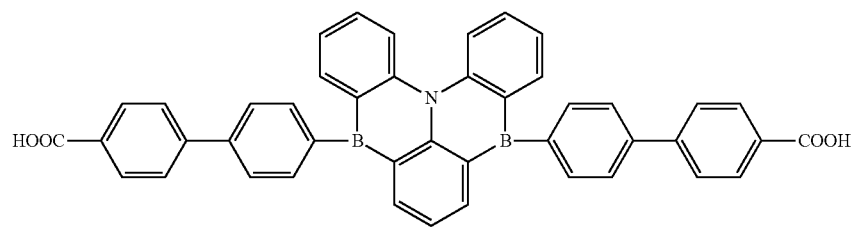
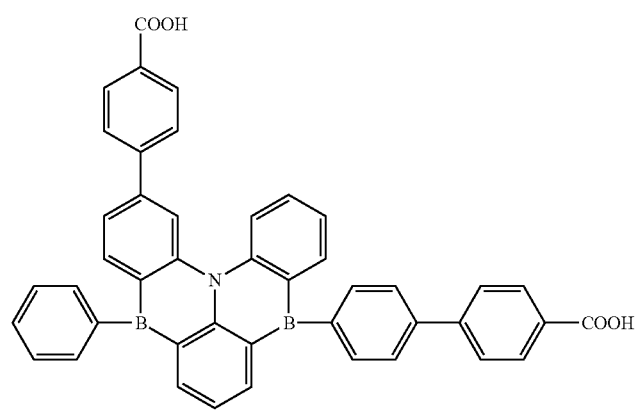

-continued
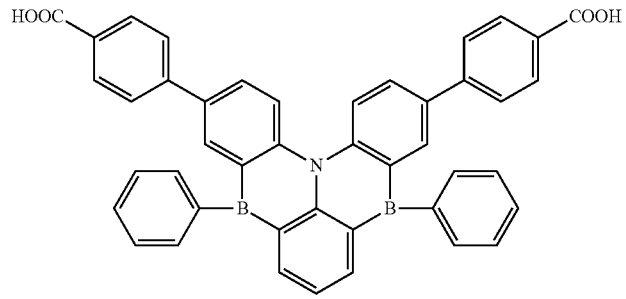
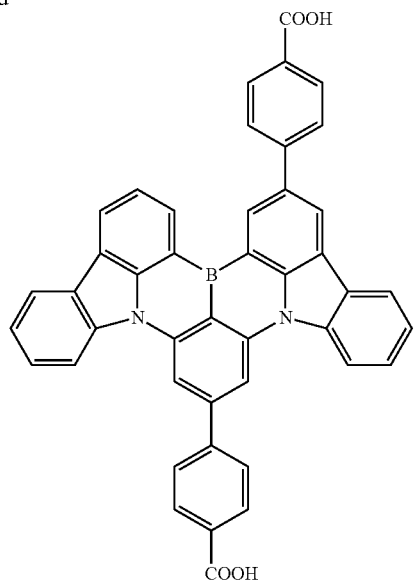
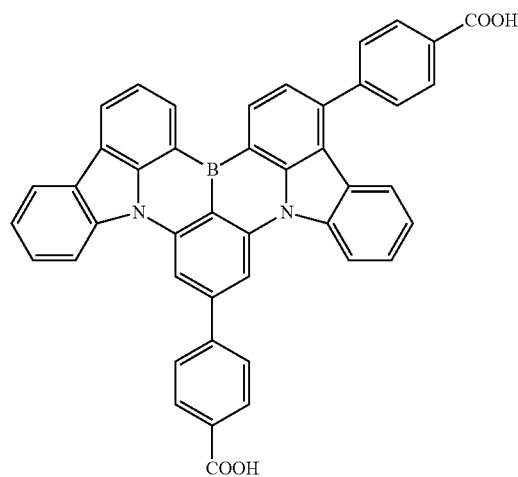
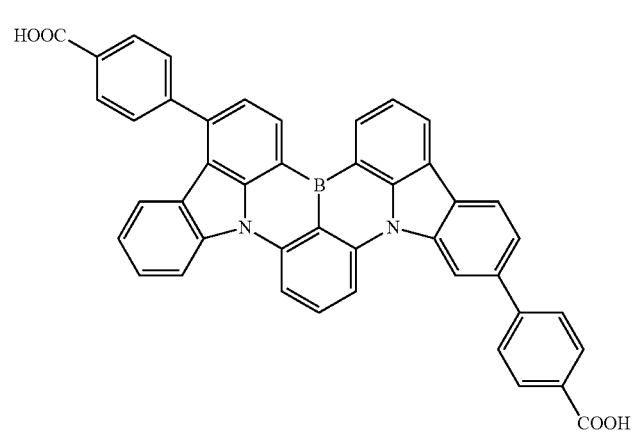
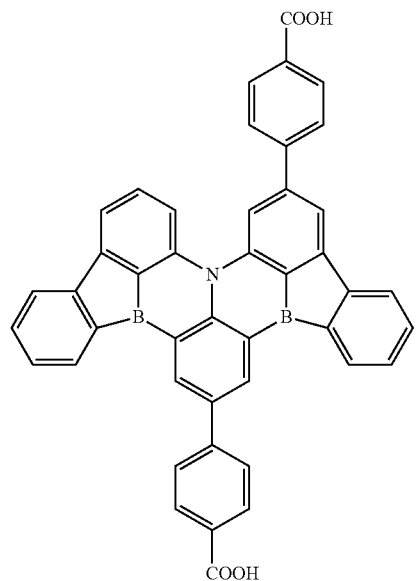
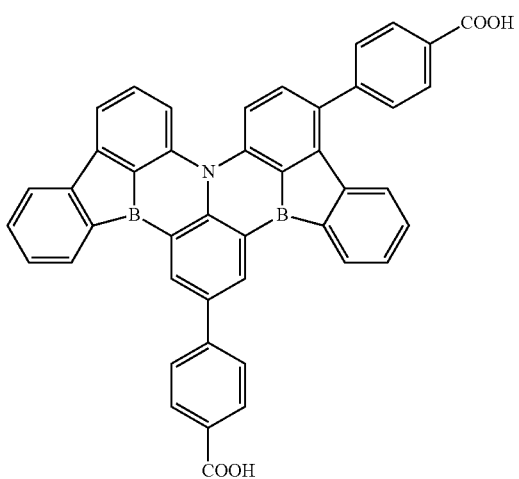

41
42
-continued
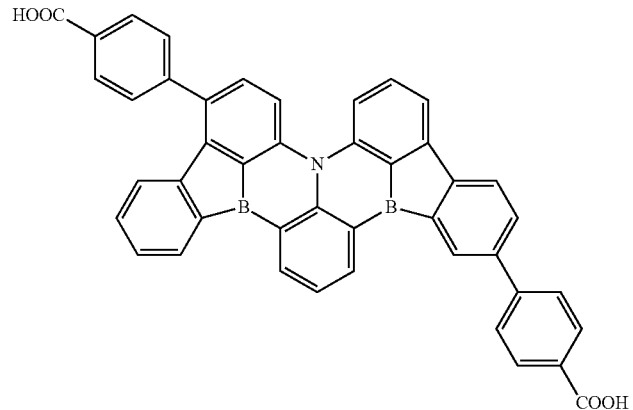
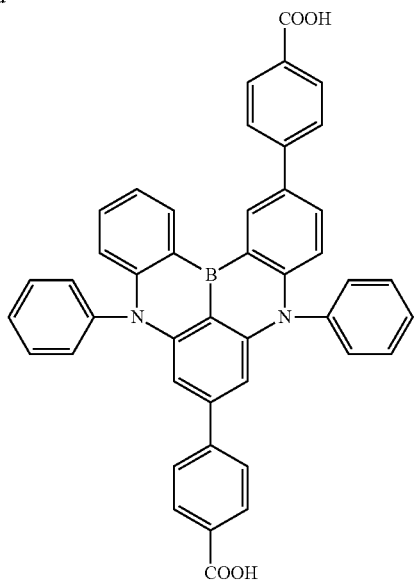
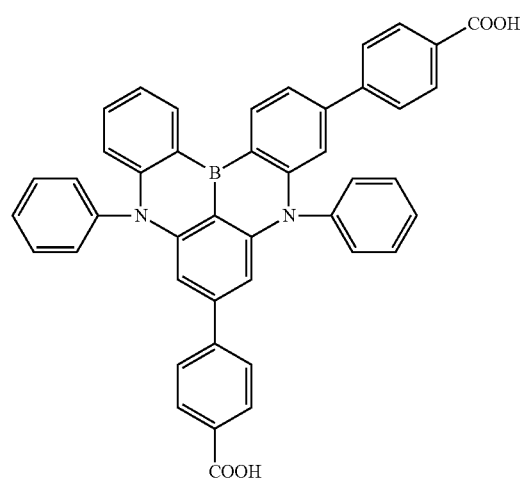
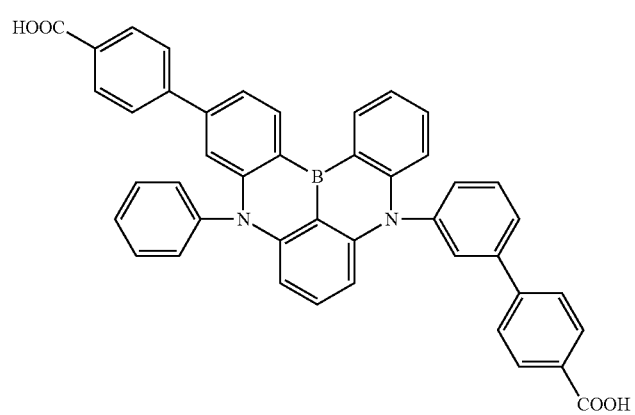
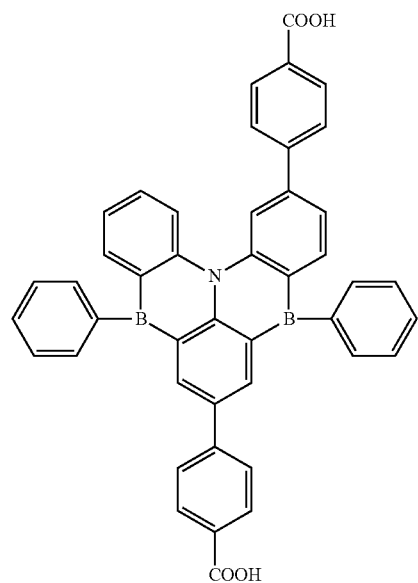
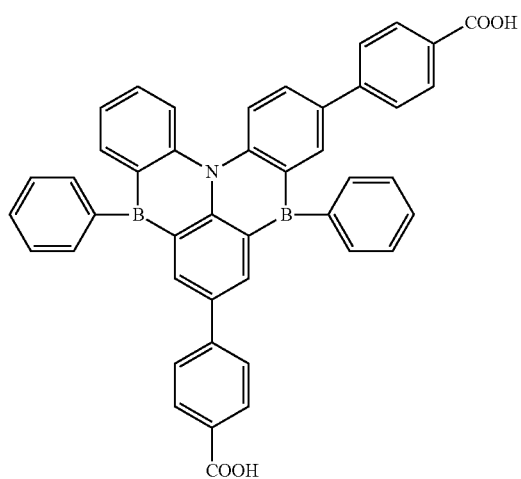

-continued
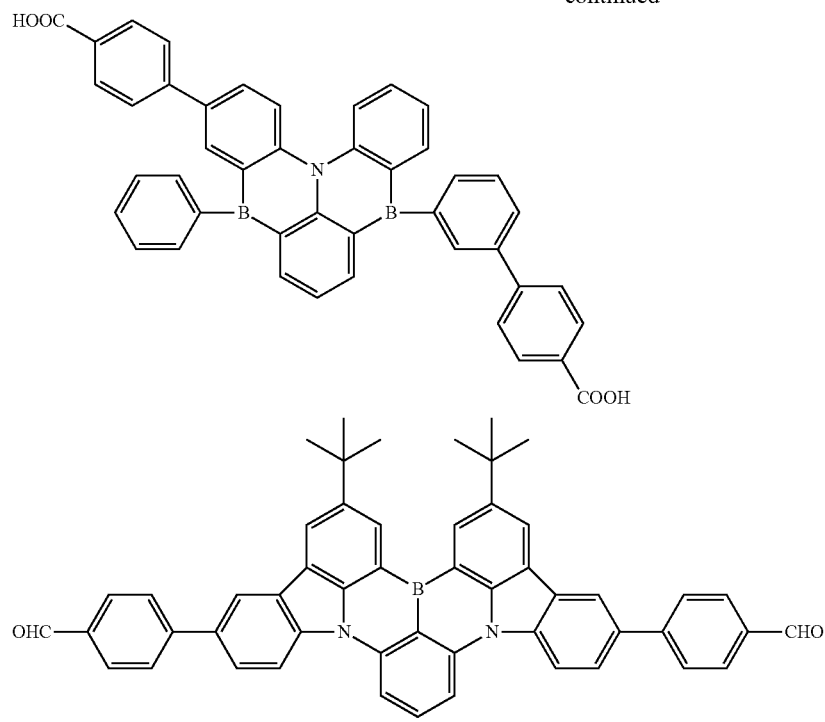
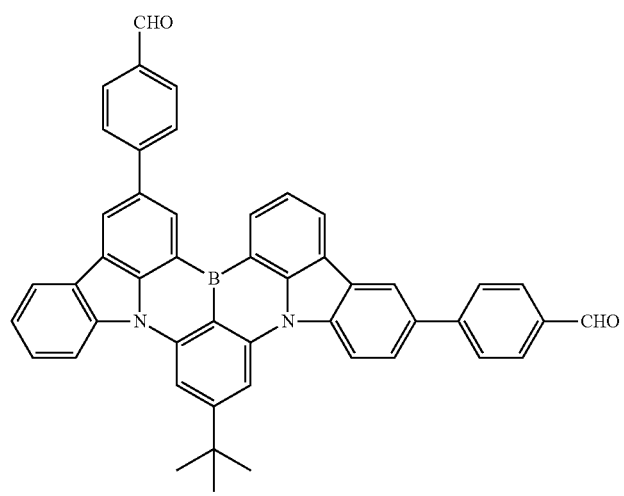
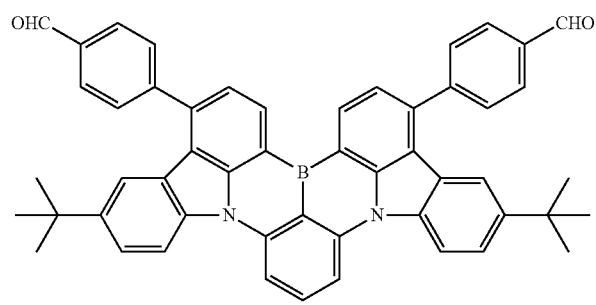

-continued
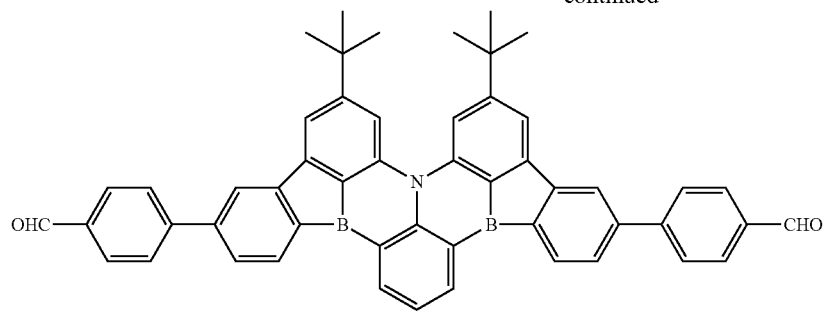
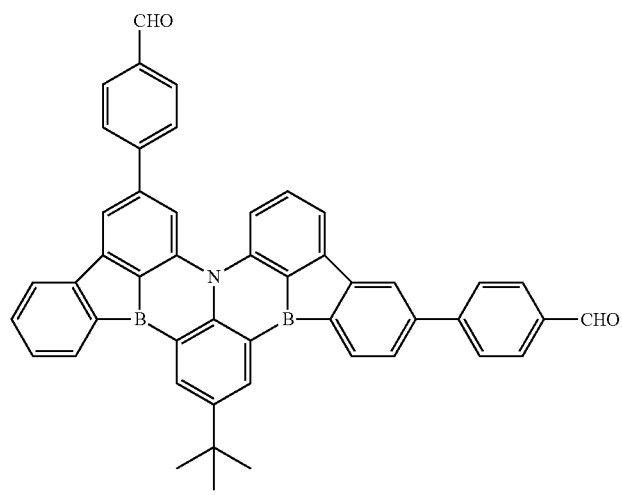
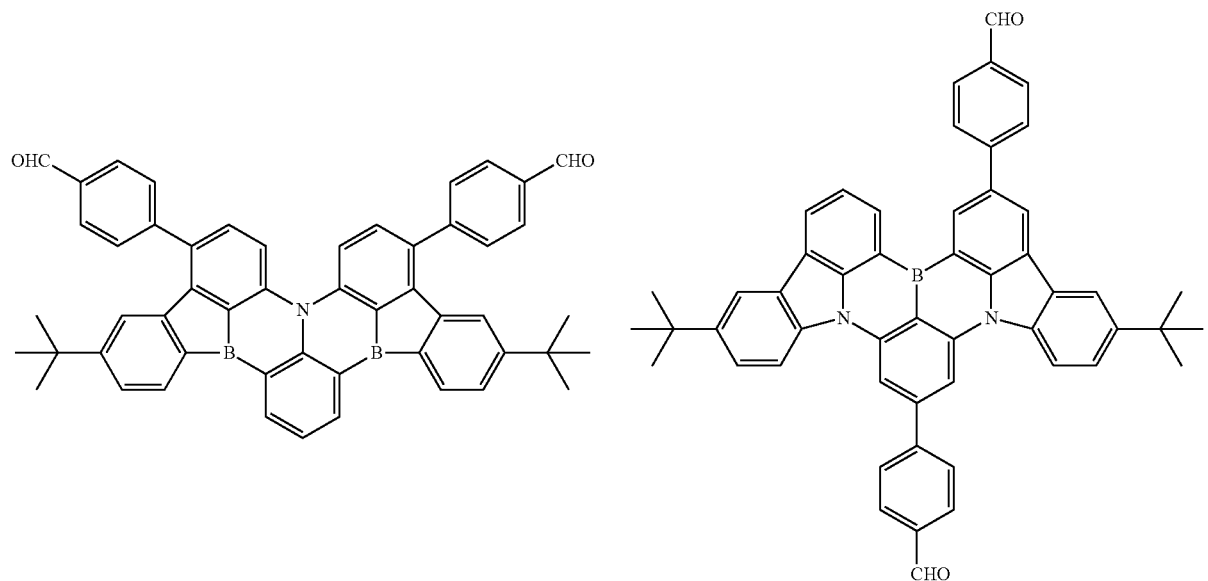

-continued
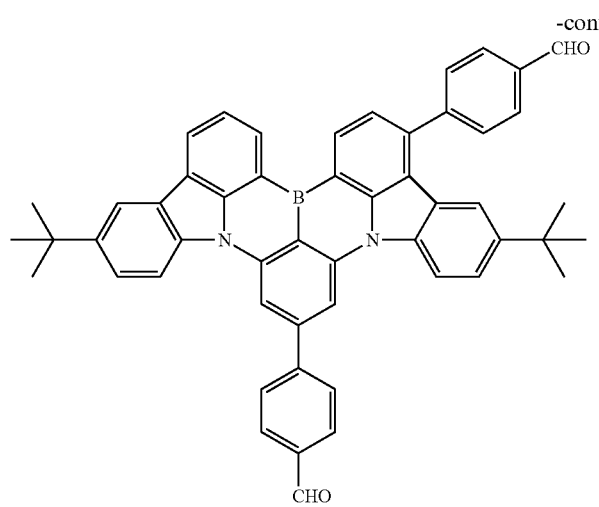
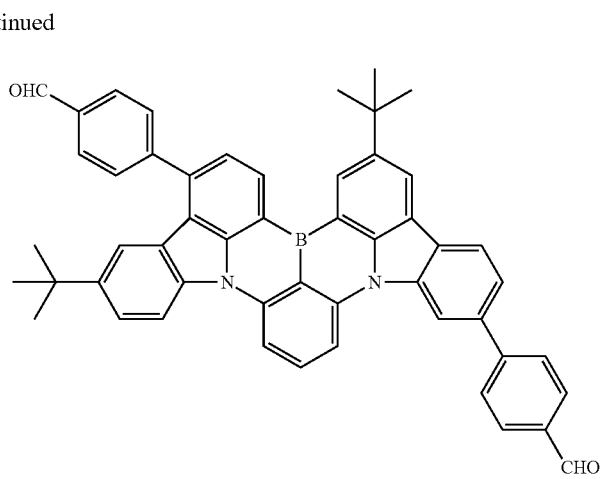
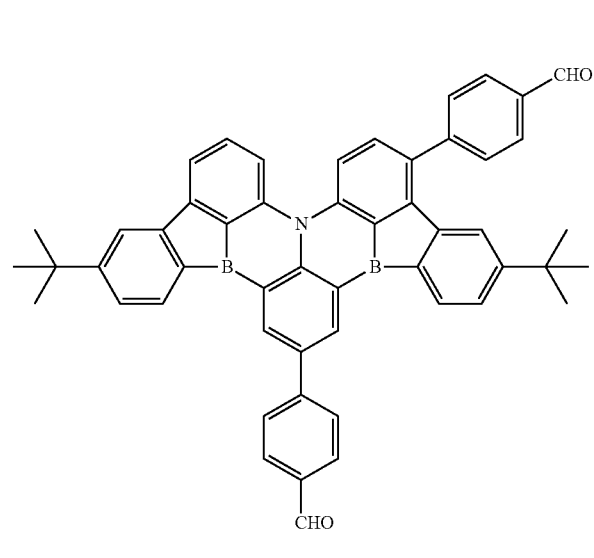
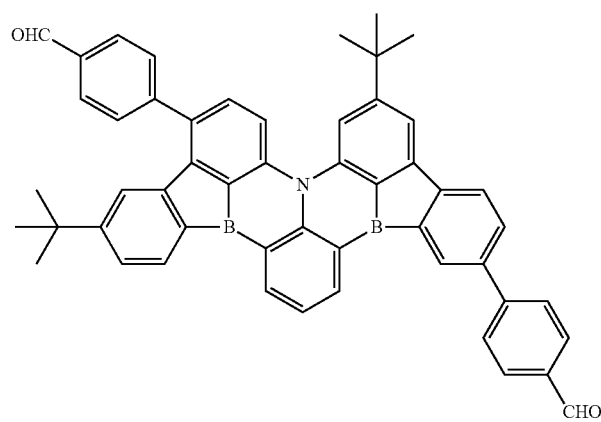

-continued
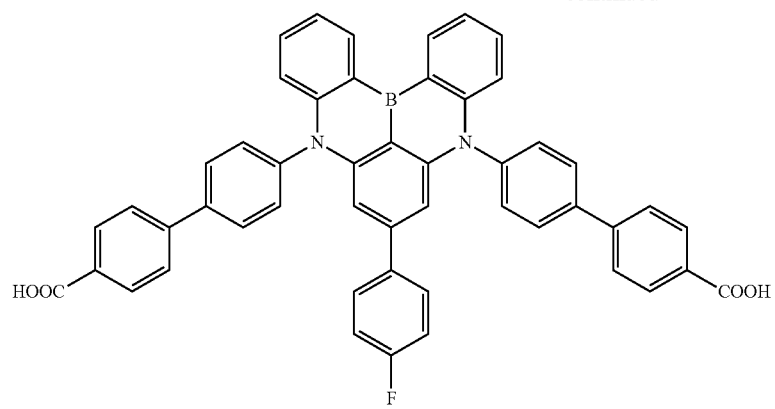
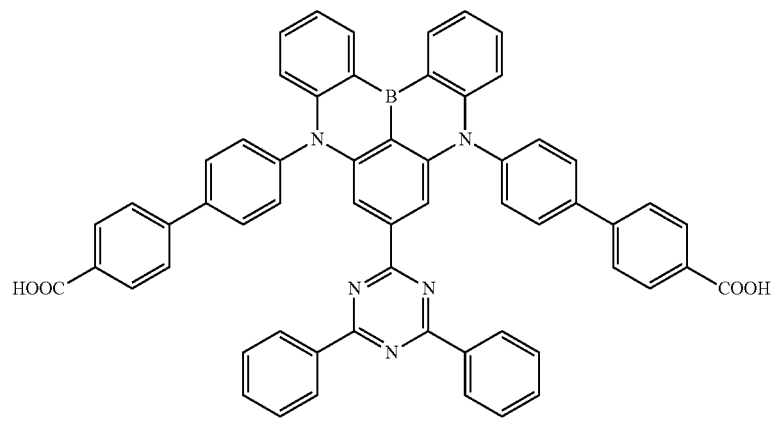
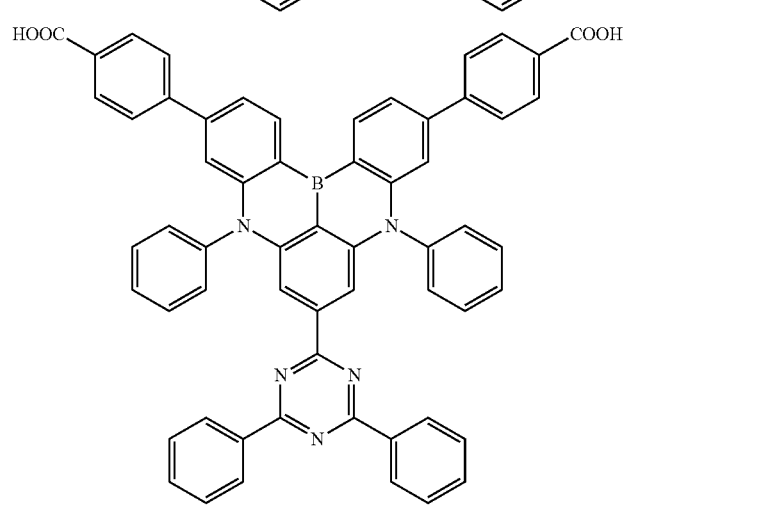
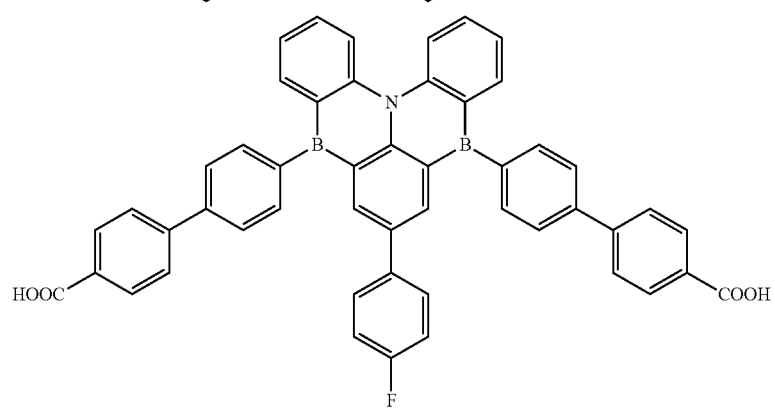

-continued
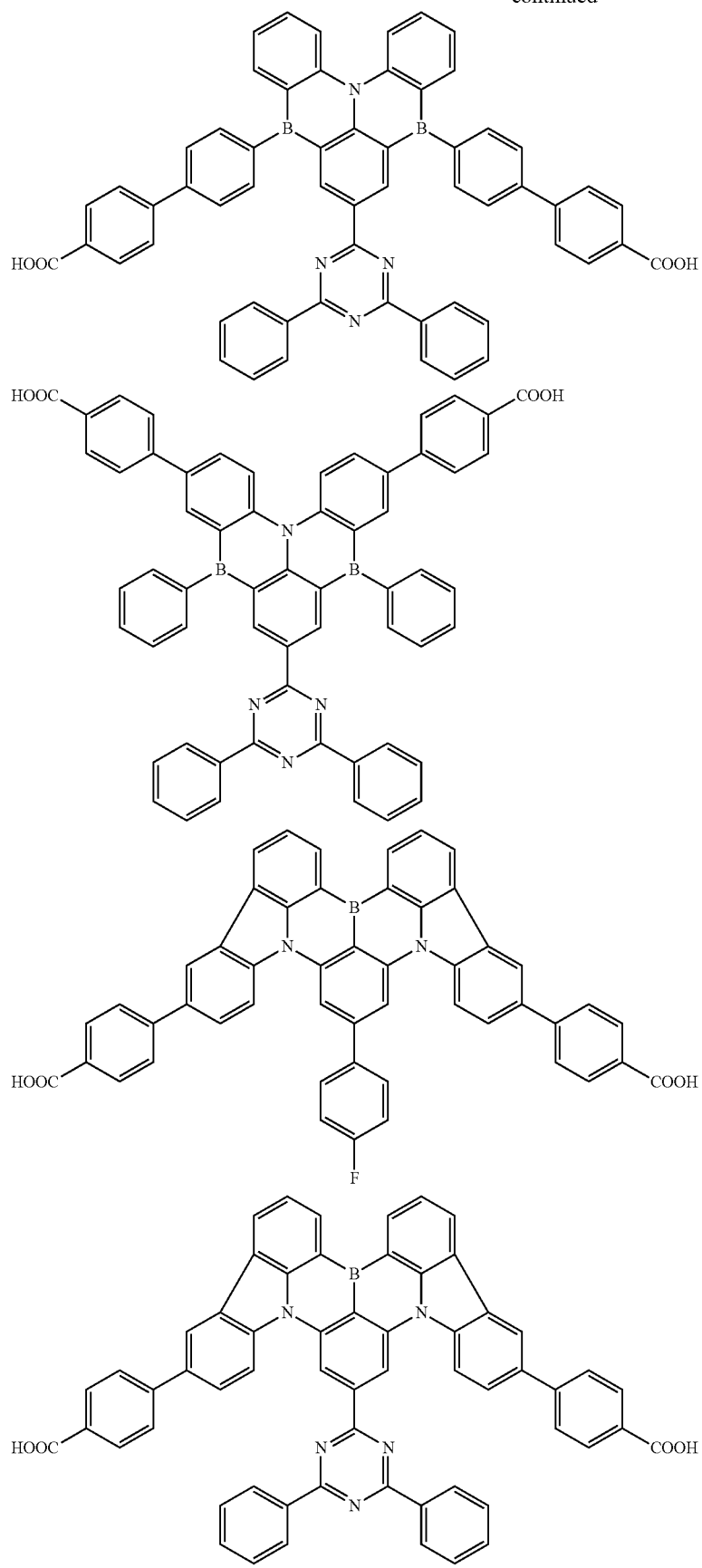

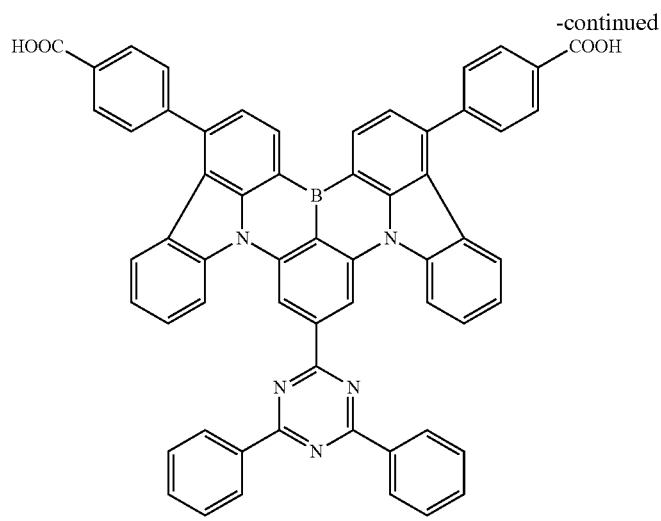
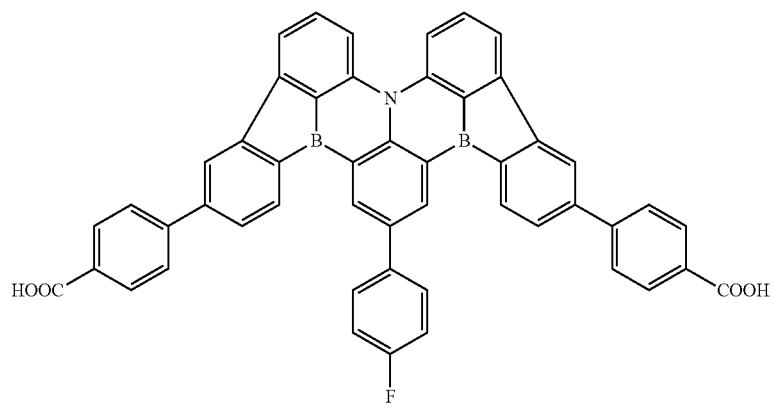
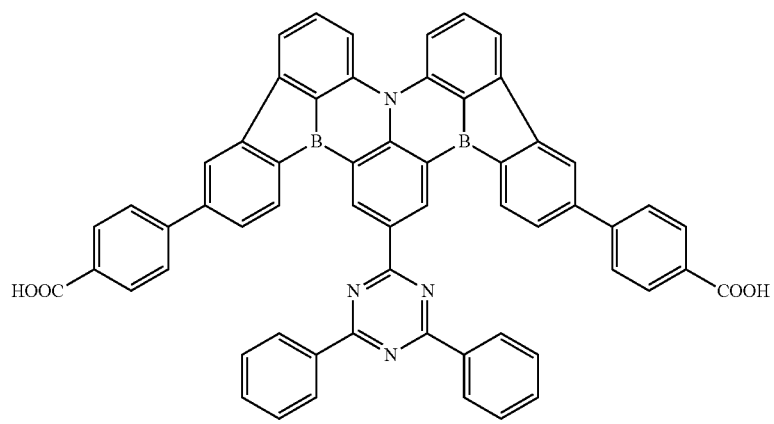

-continued
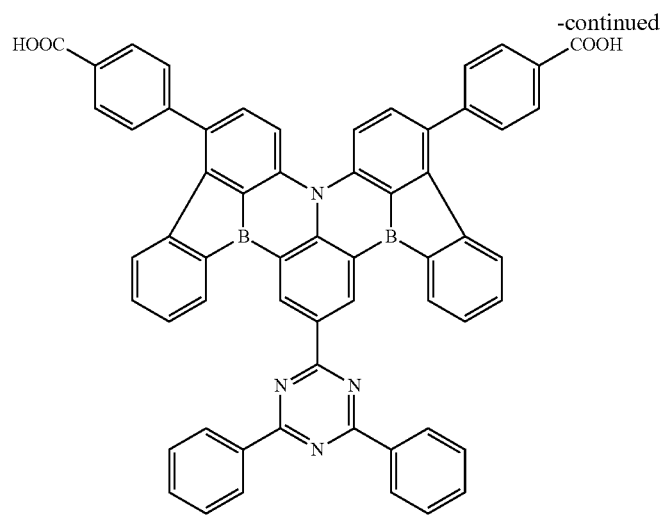
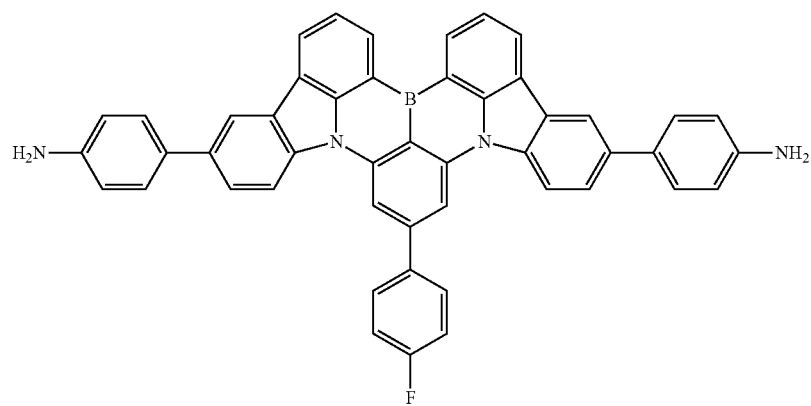
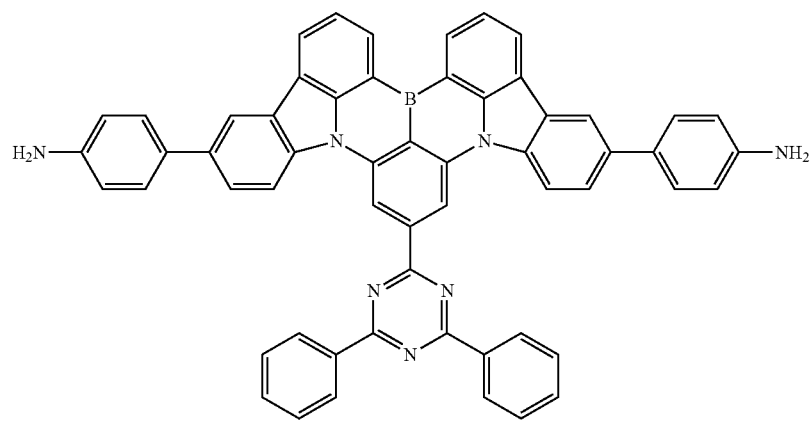

-continued
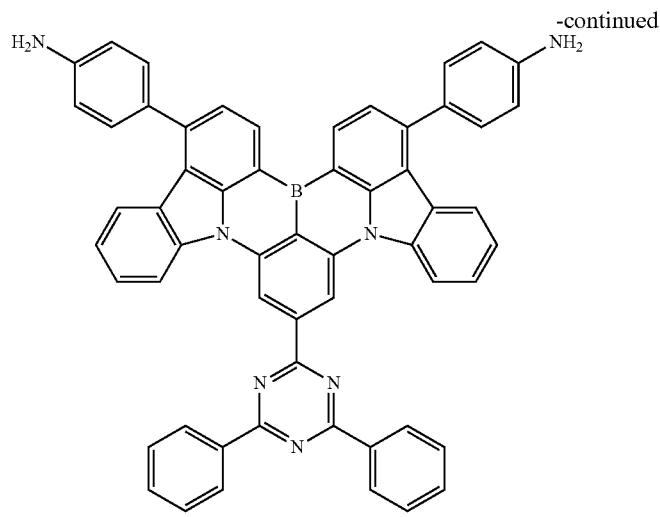
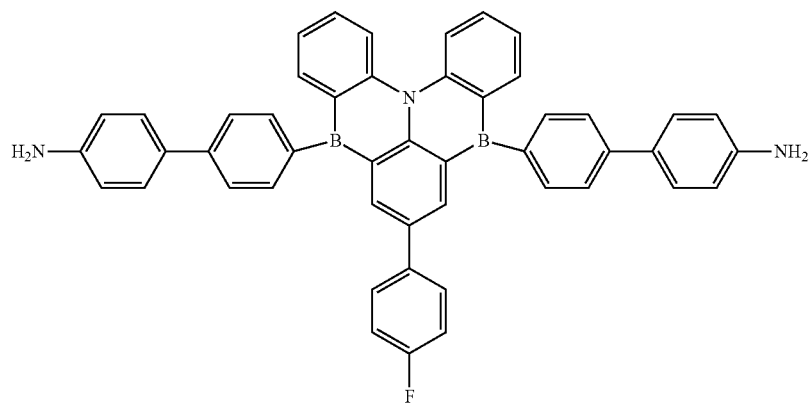
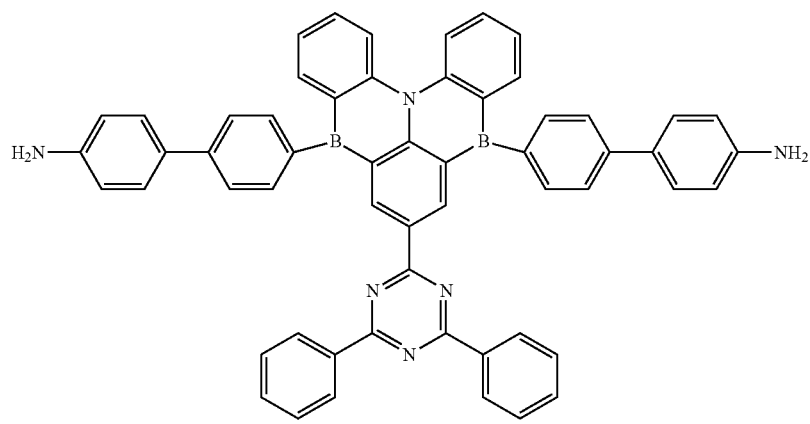

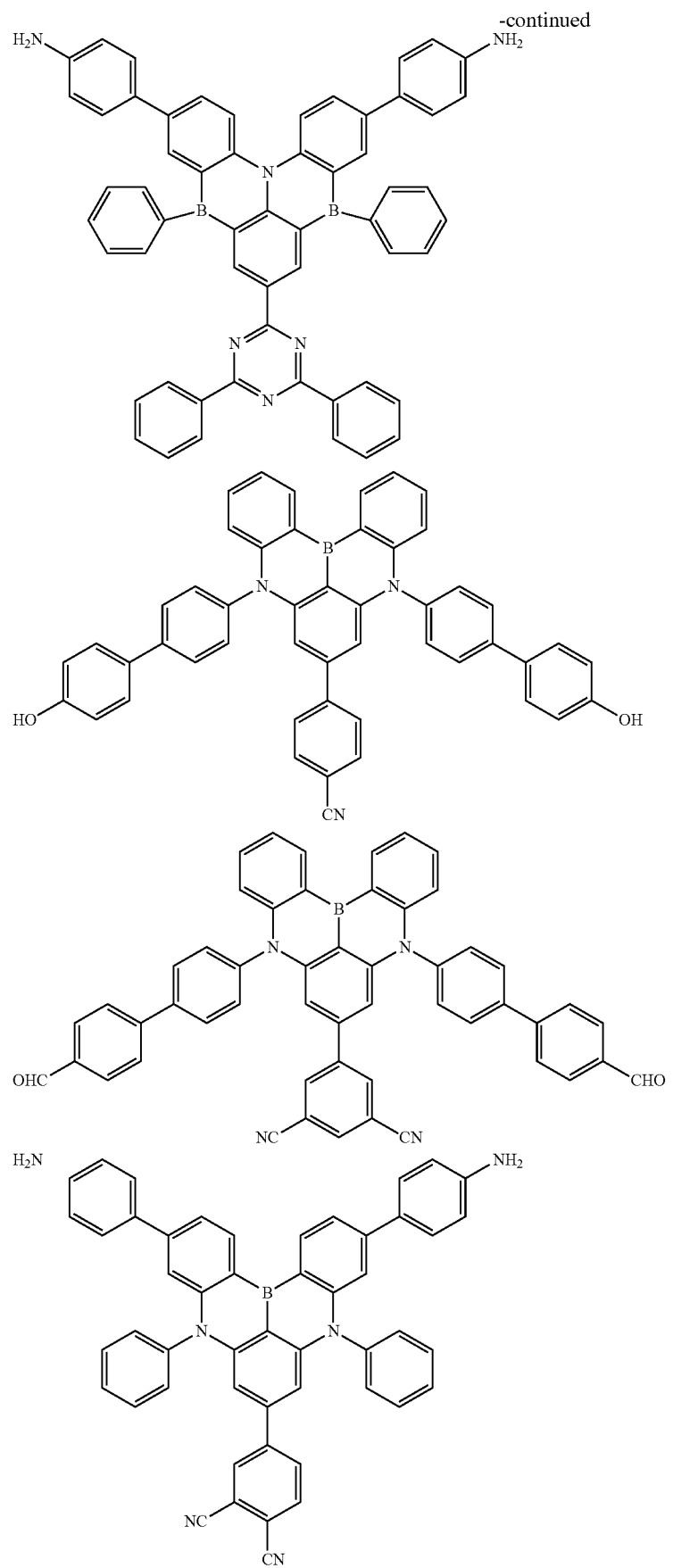

-continued
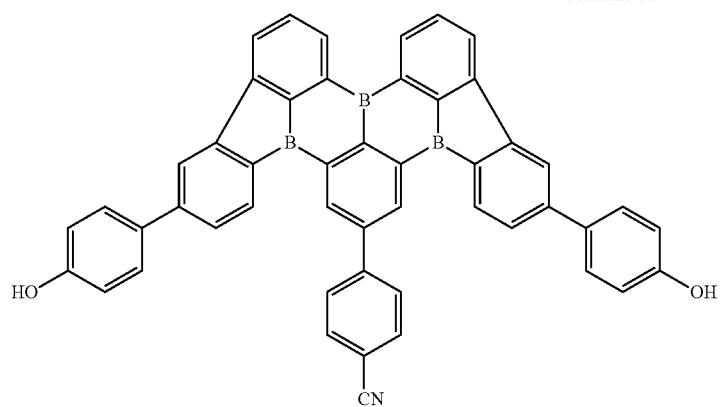
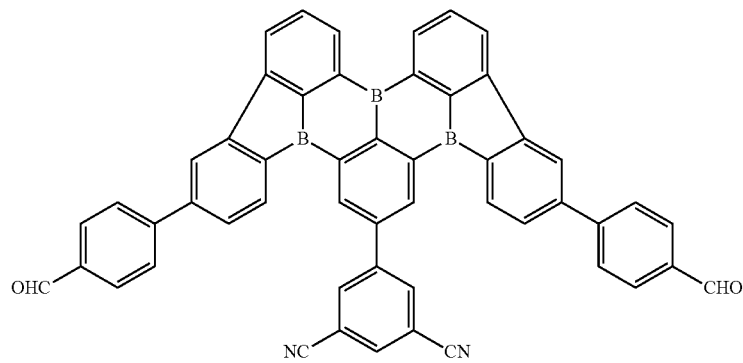
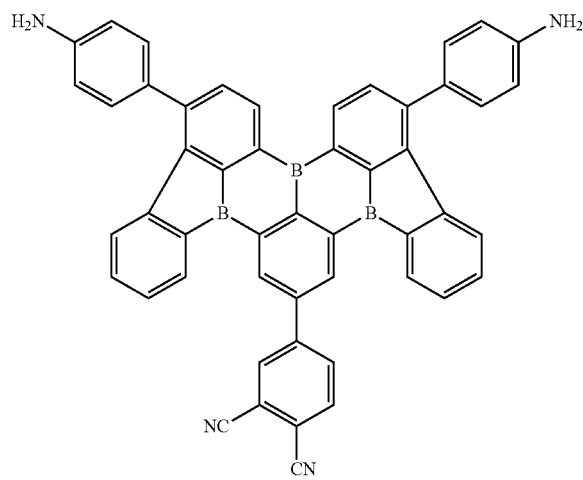
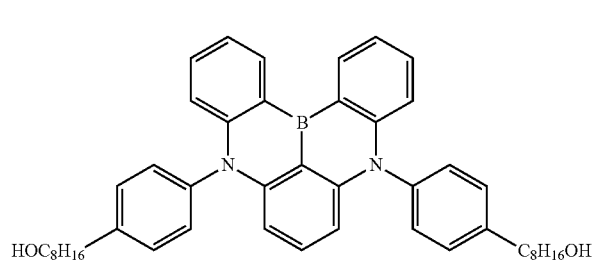
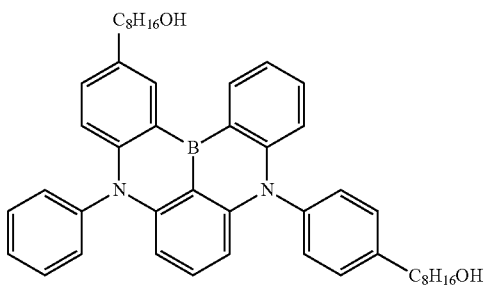

-continued
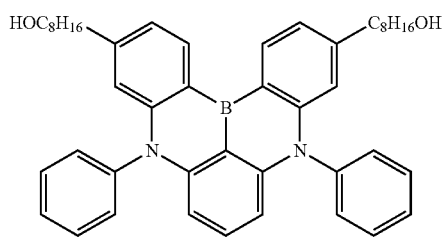
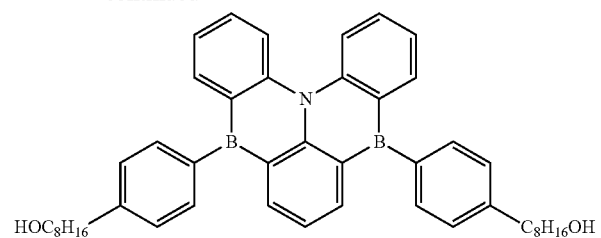
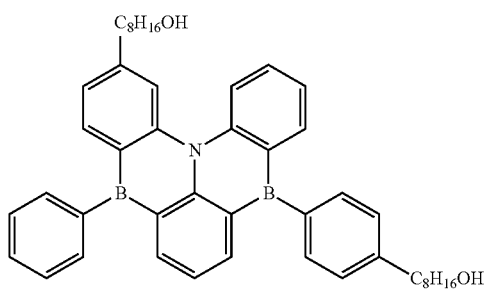
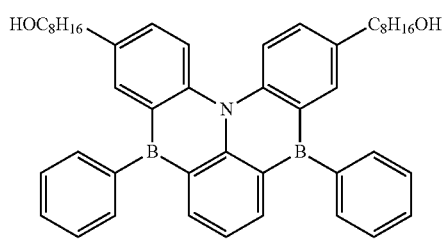
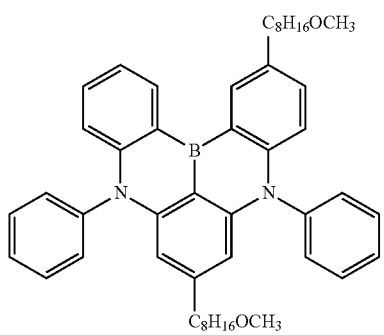
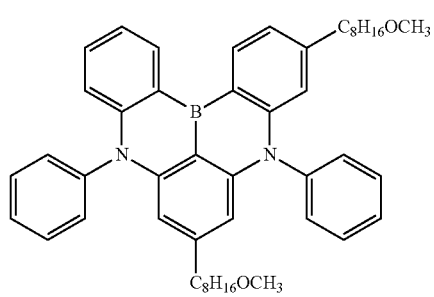
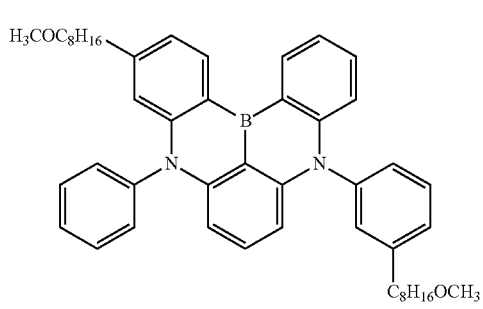
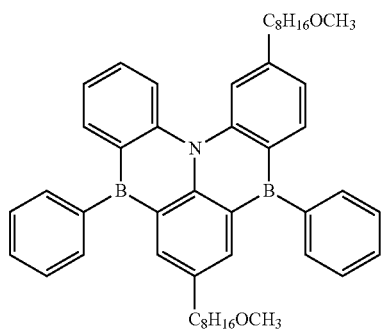
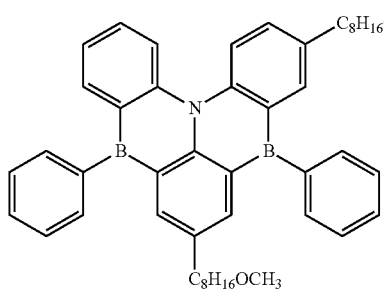
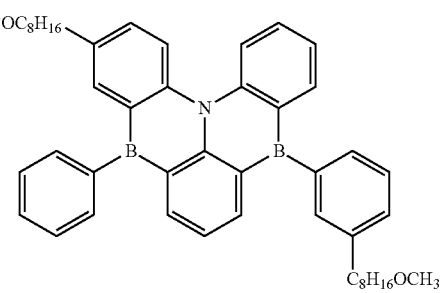

-continued
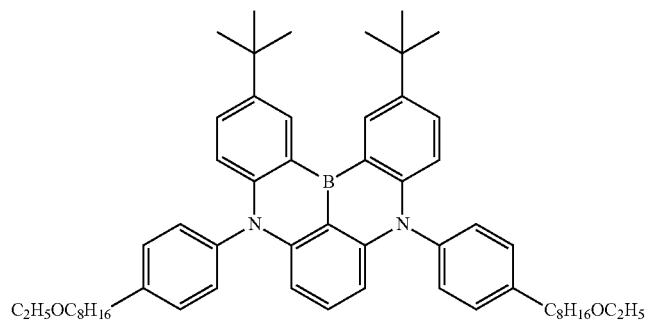
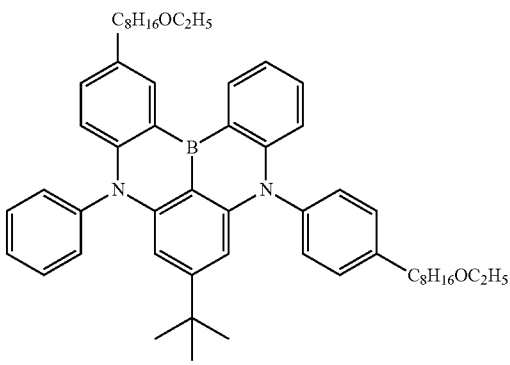
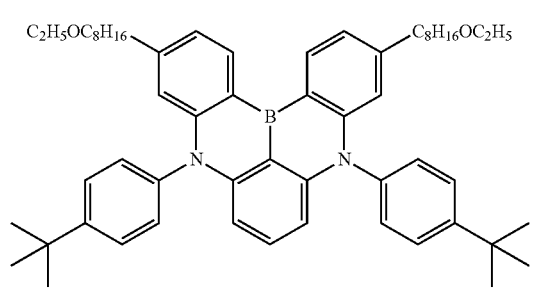
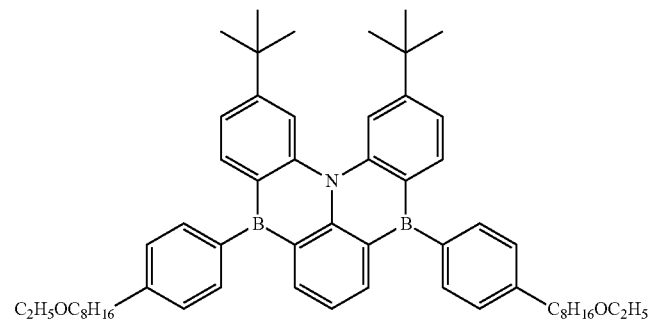
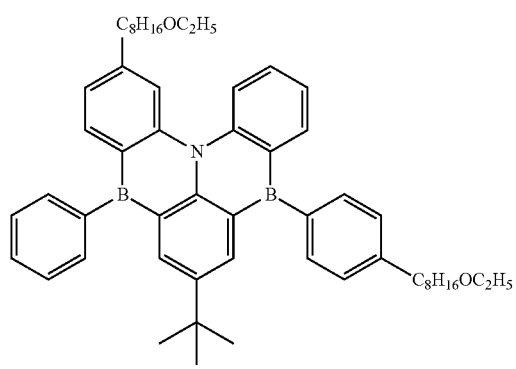
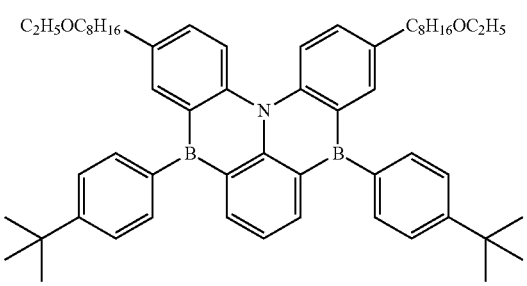
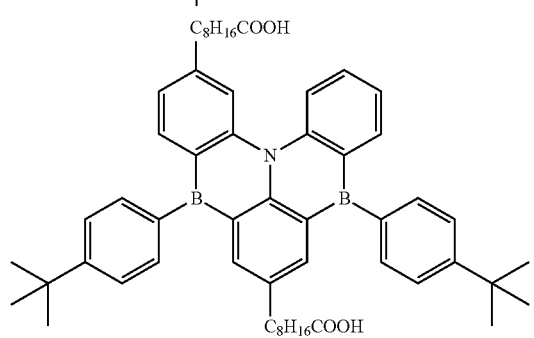
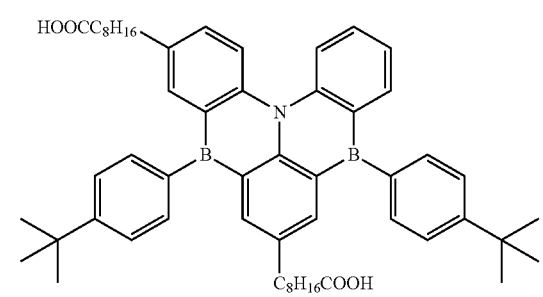
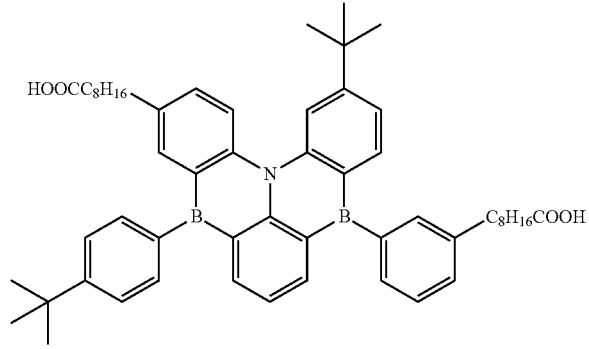
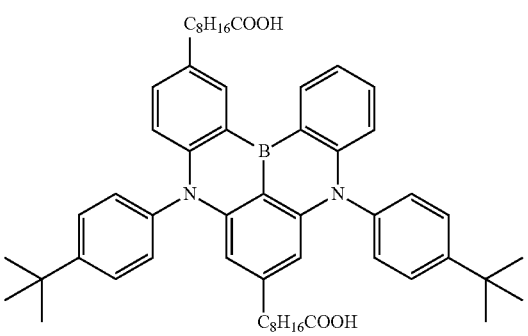

-continued
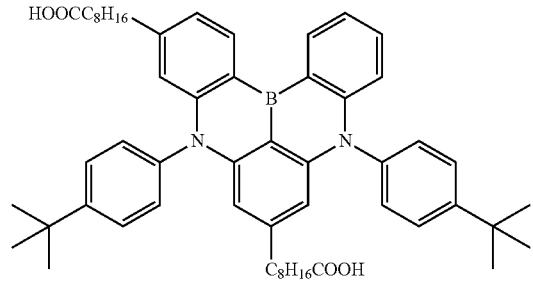
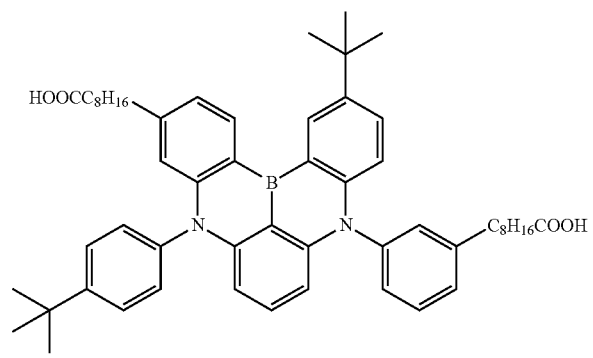
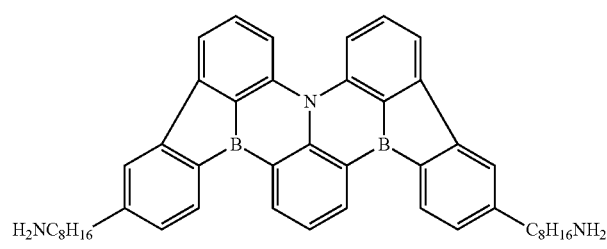
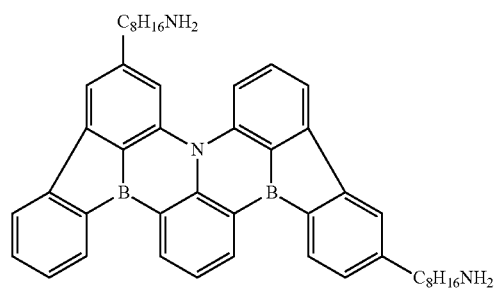
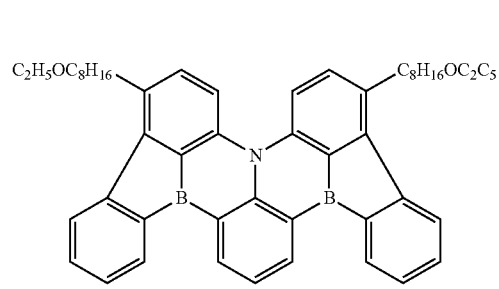
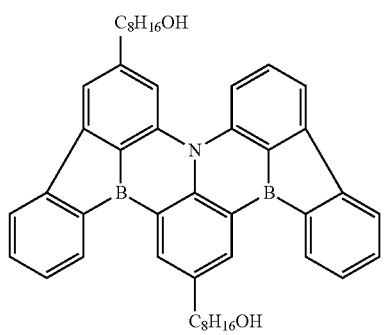
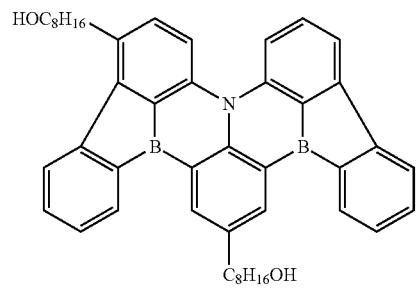
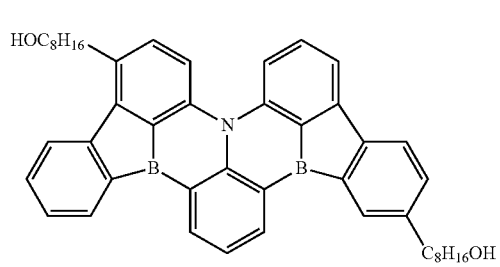
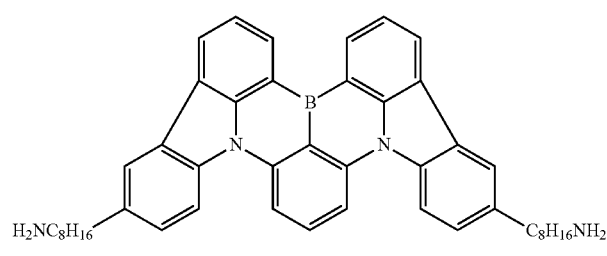
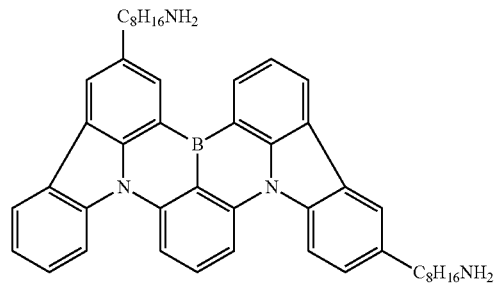

-continued
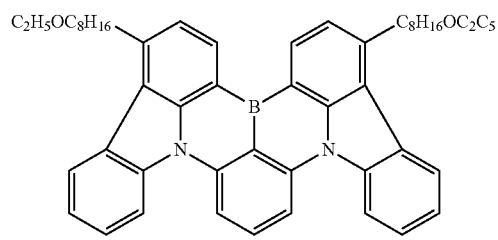
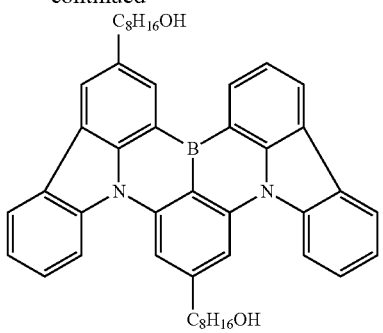
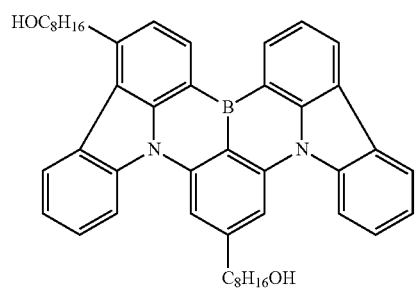
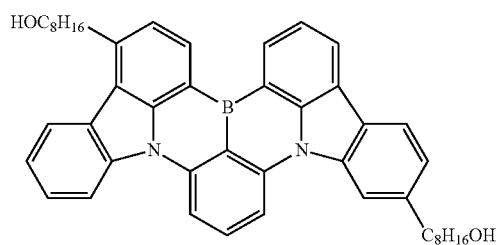
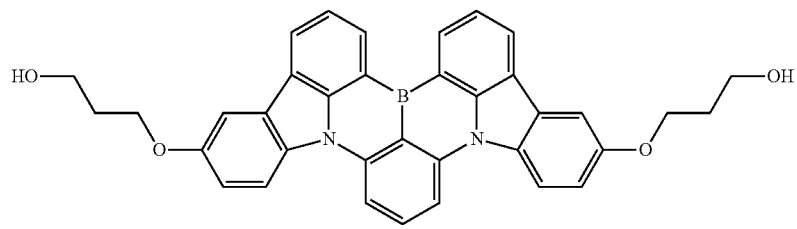
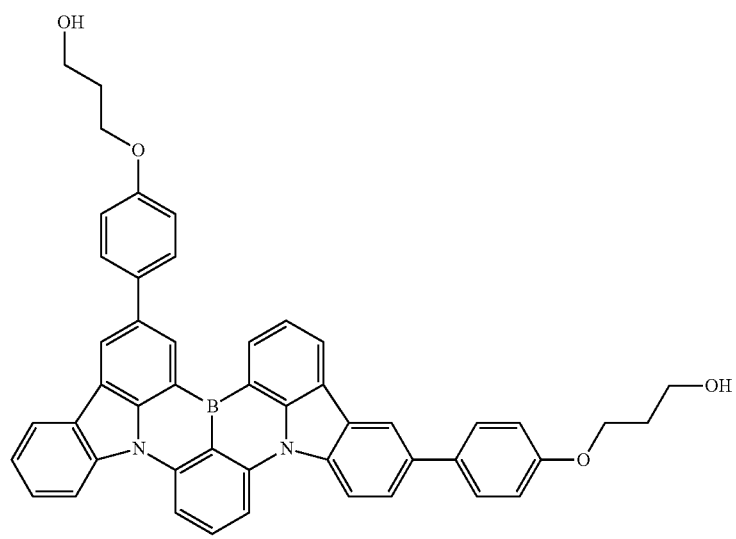

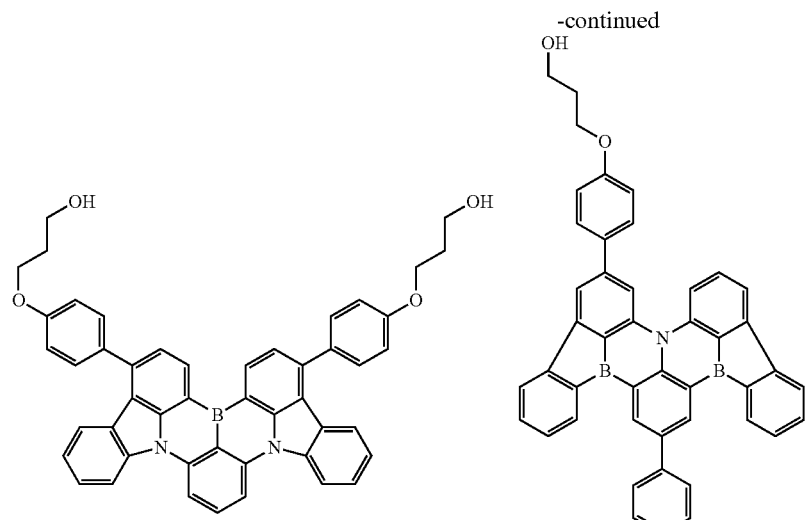
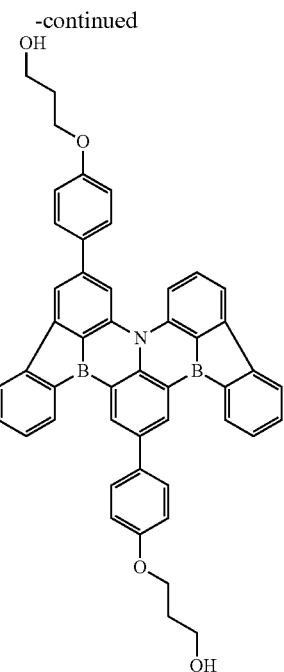
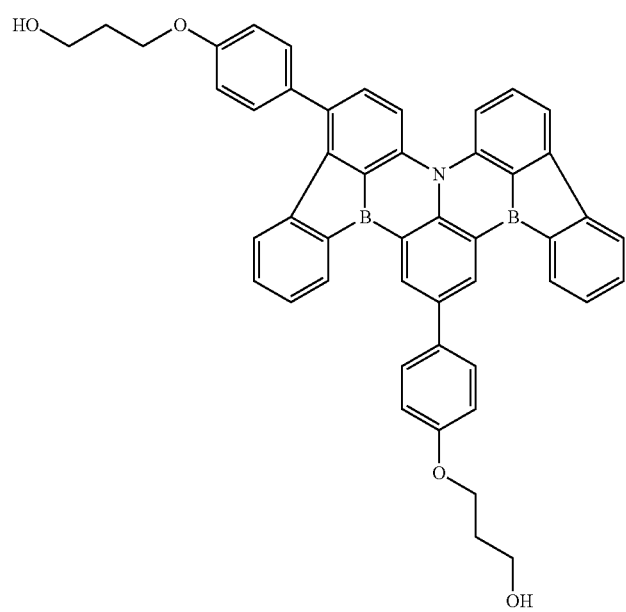

-continued
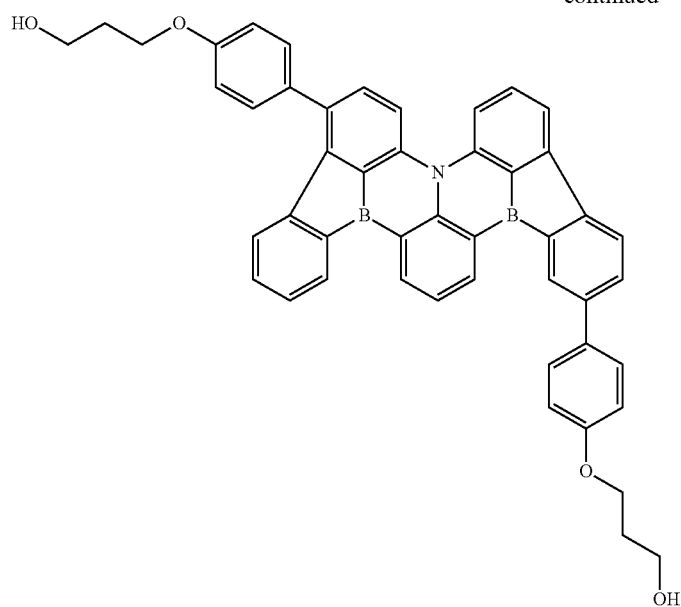
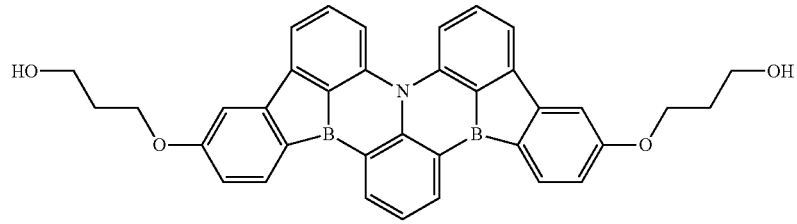
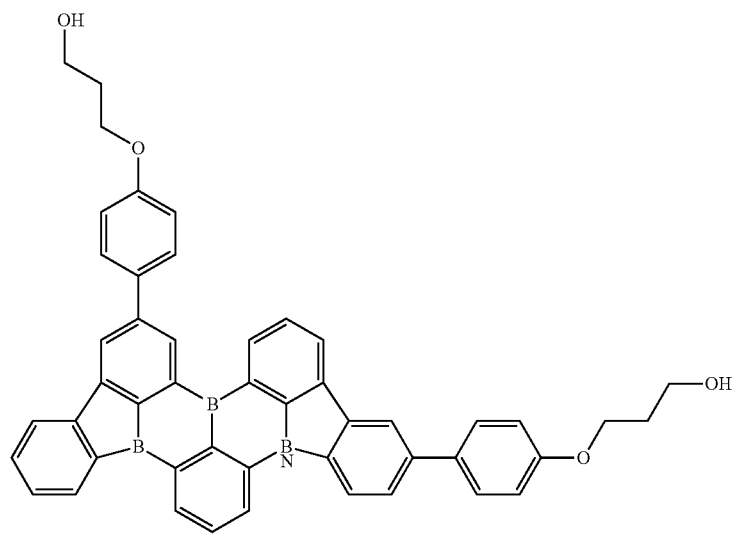

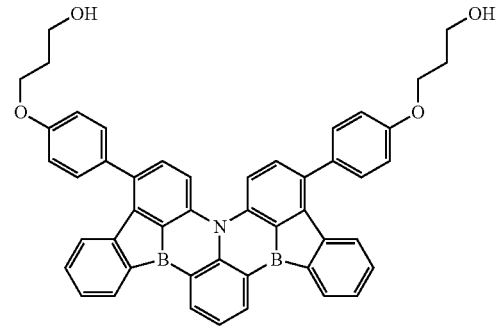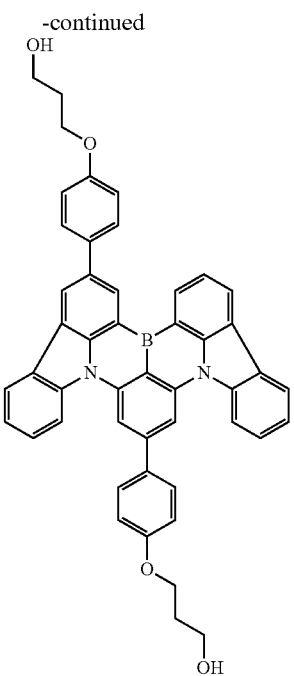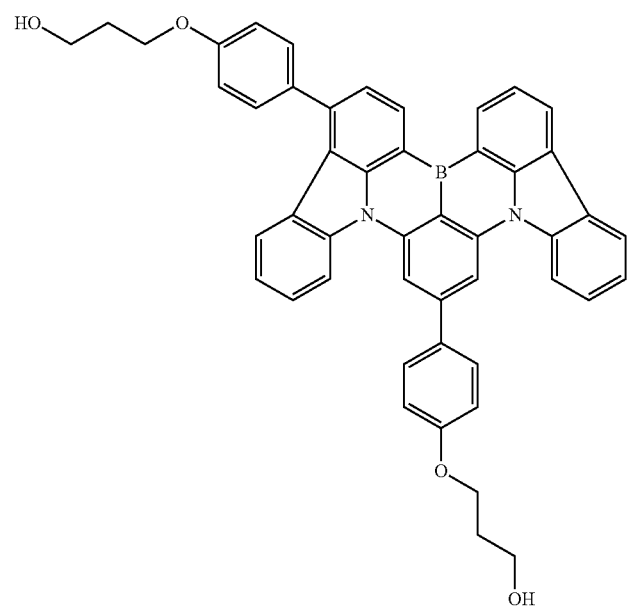

-continued
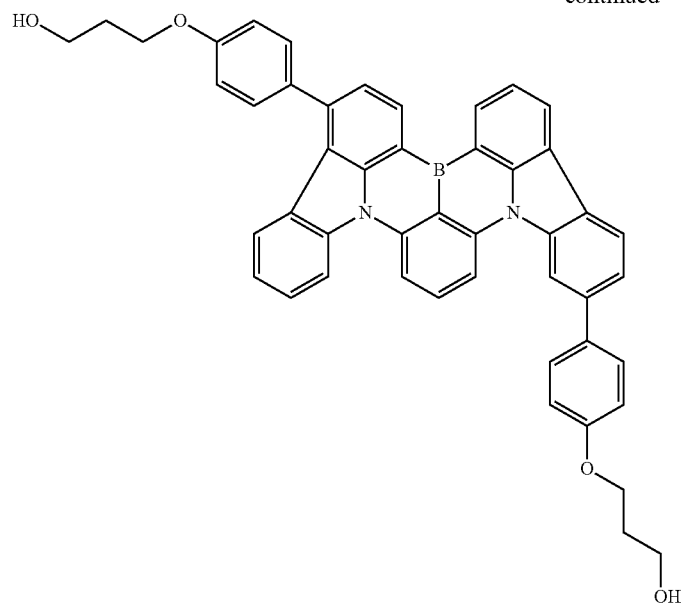
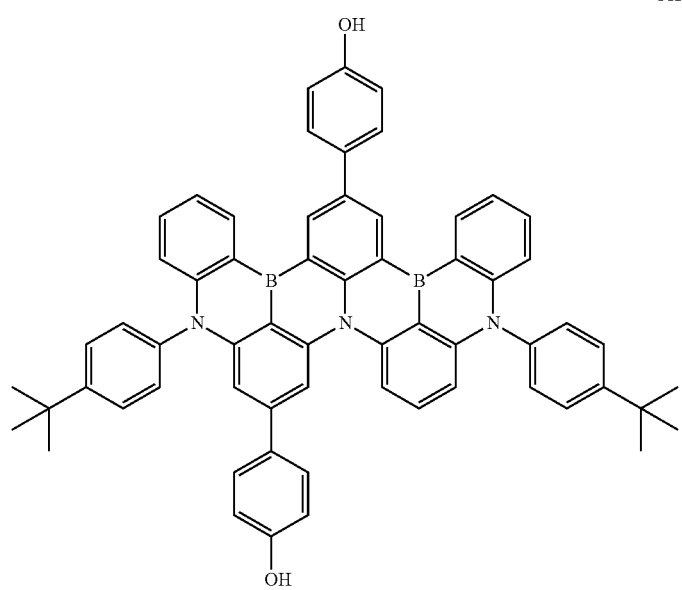
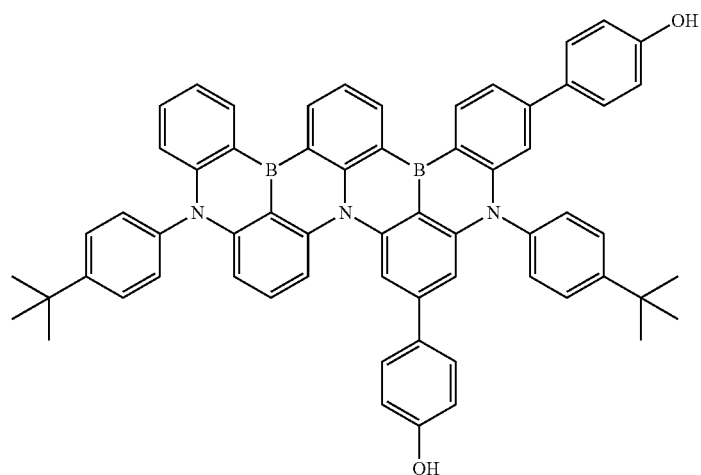

-continued
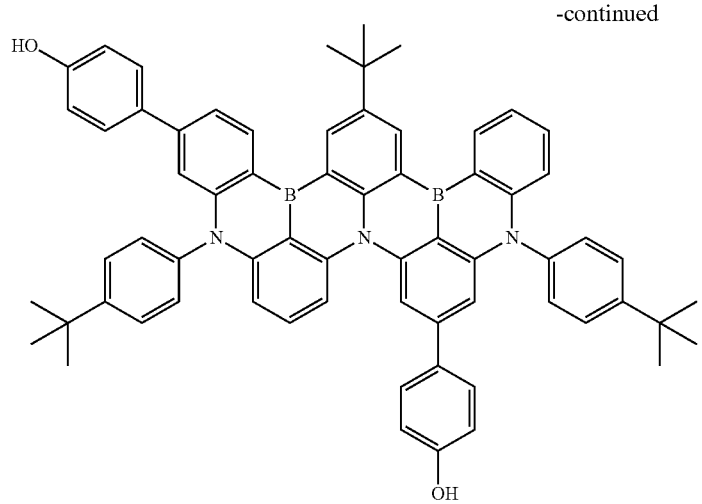
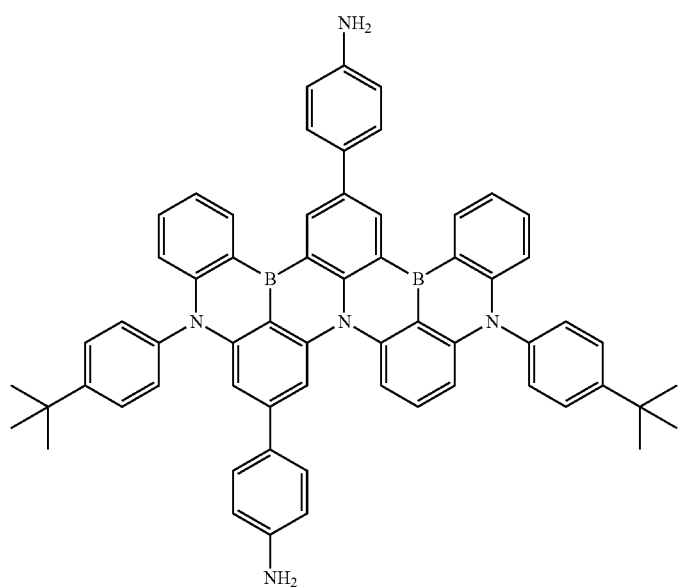
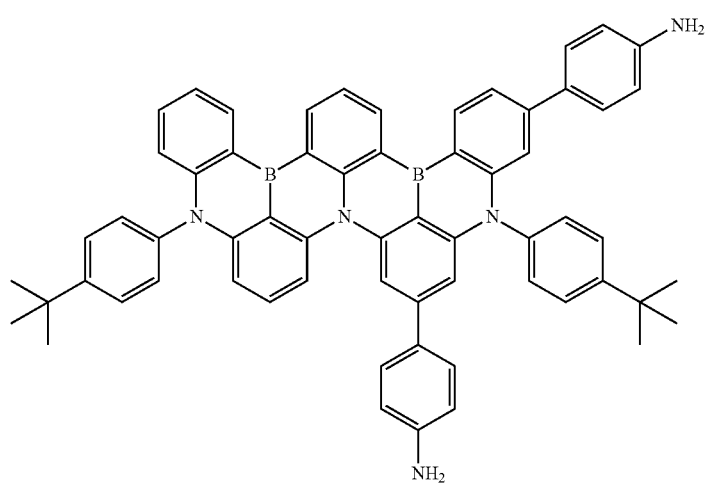

-continued
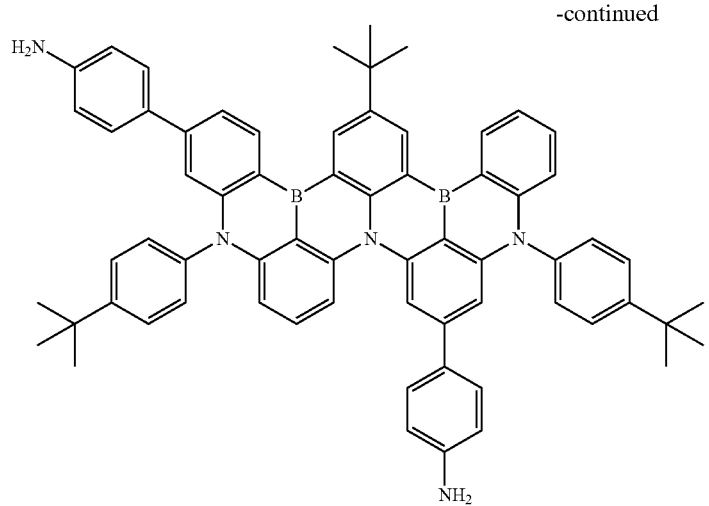
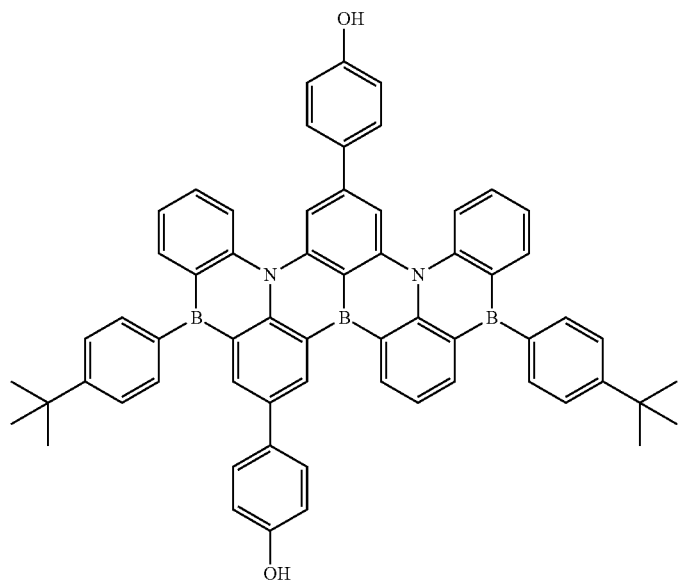
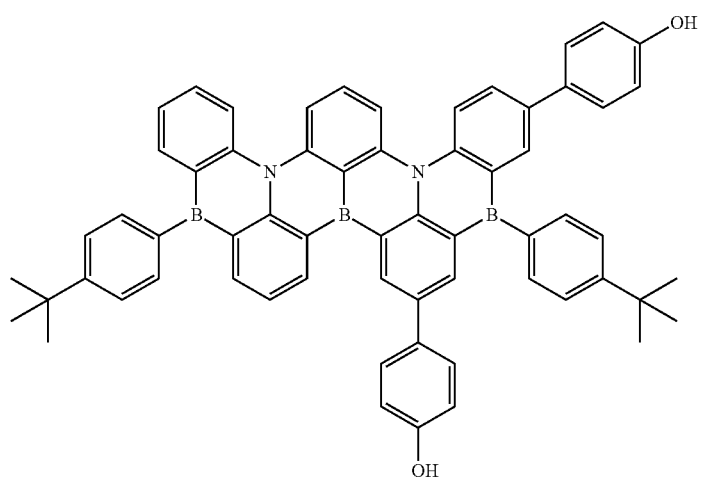

-continued
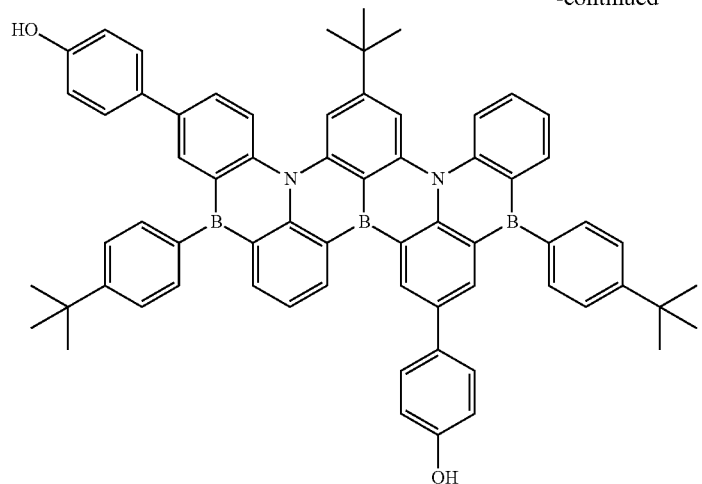
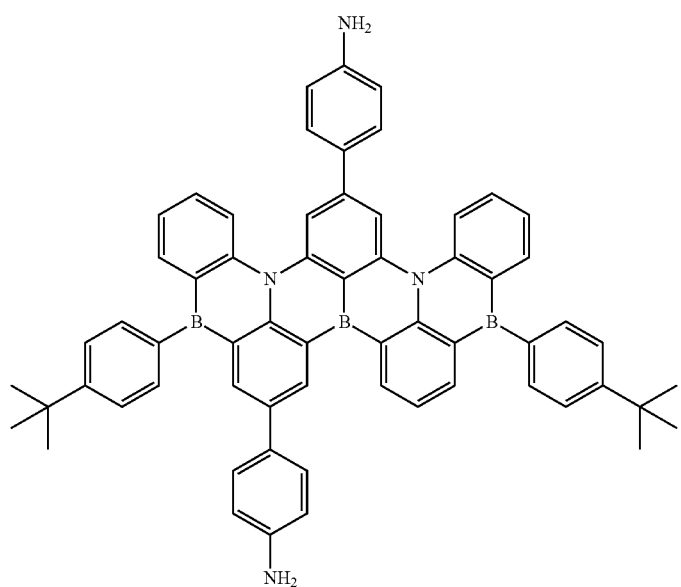
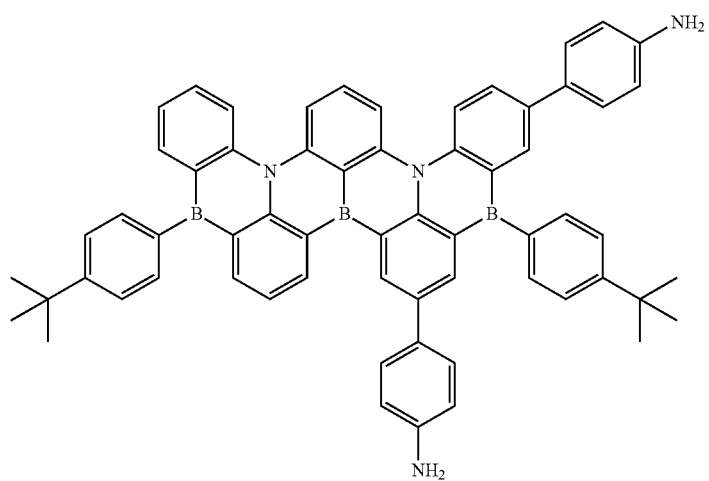

-continued
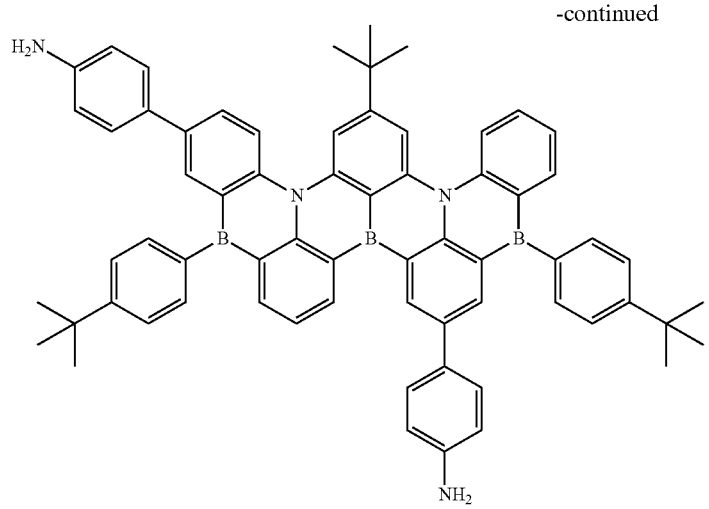
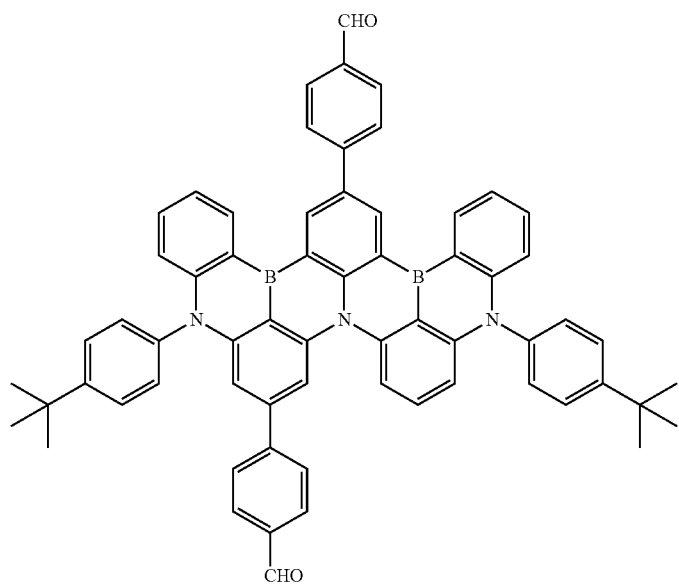
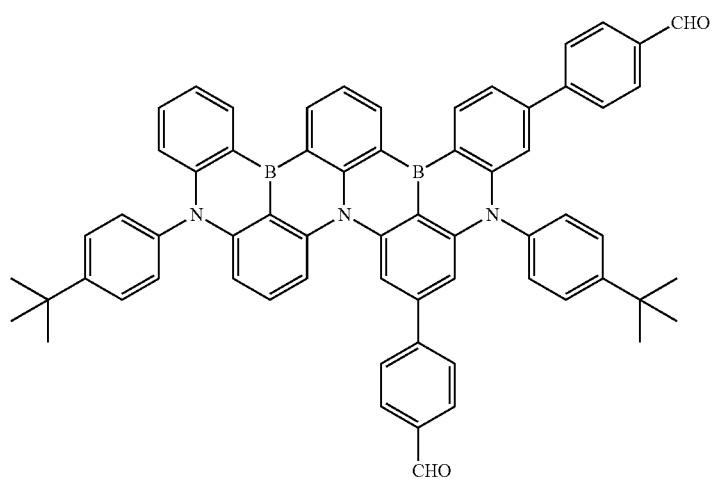

-continued
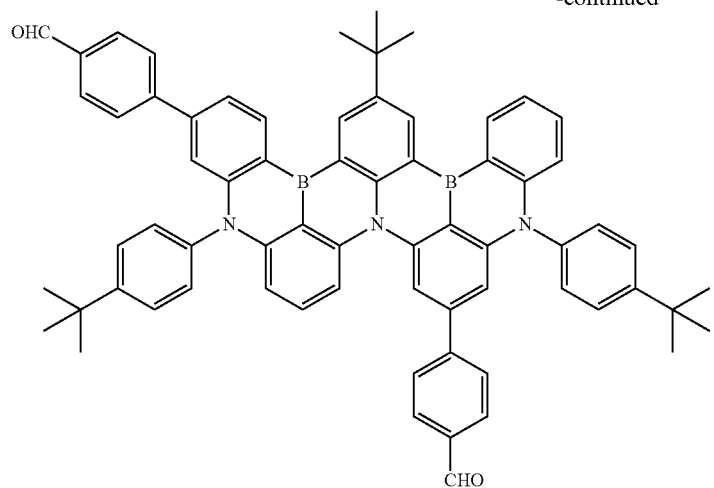
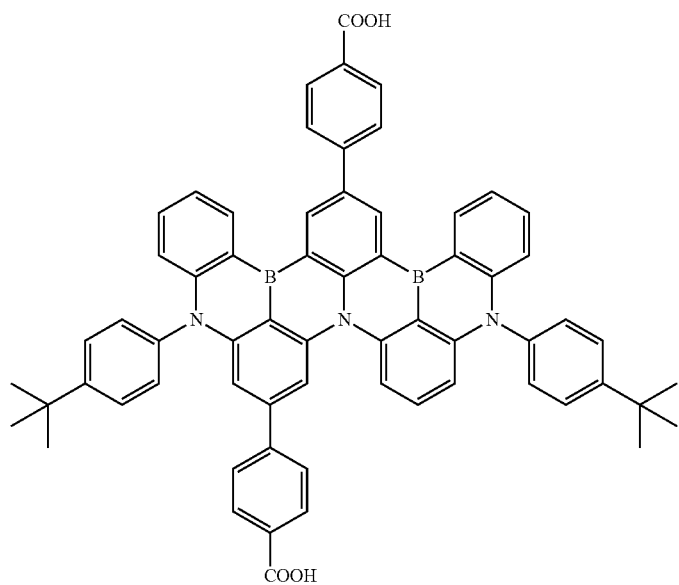
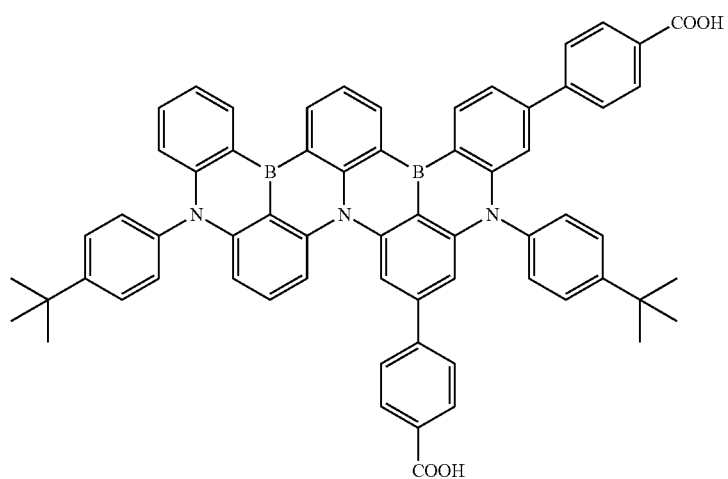

-continued
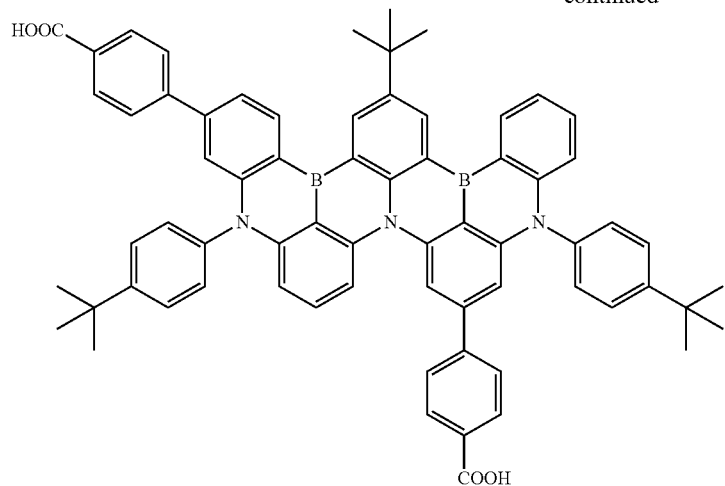
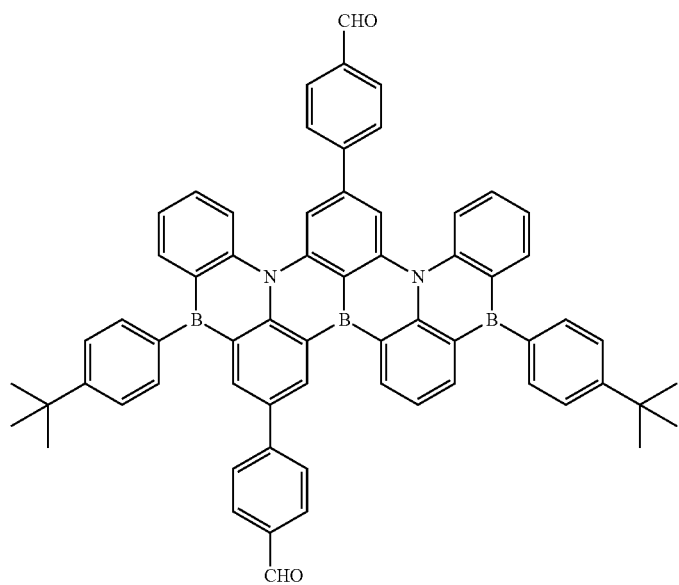
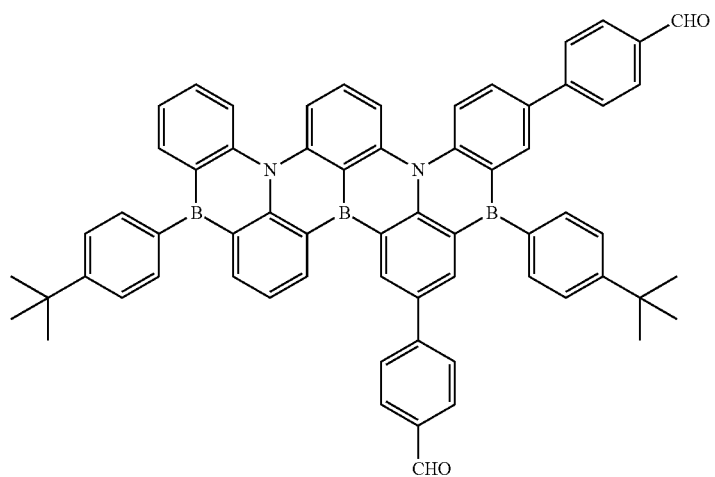

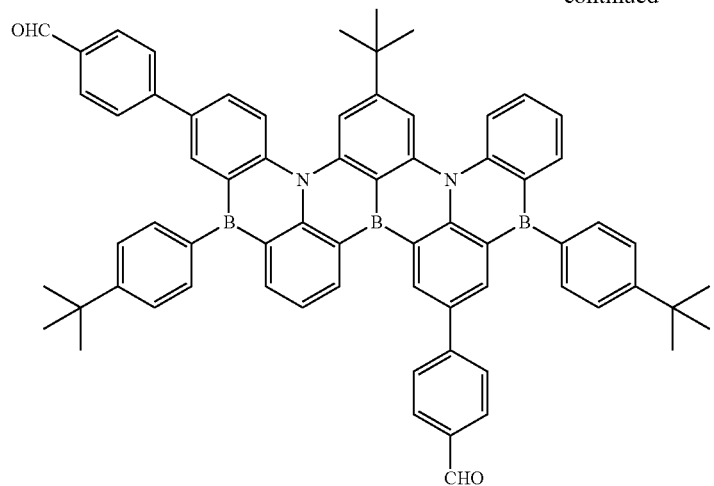
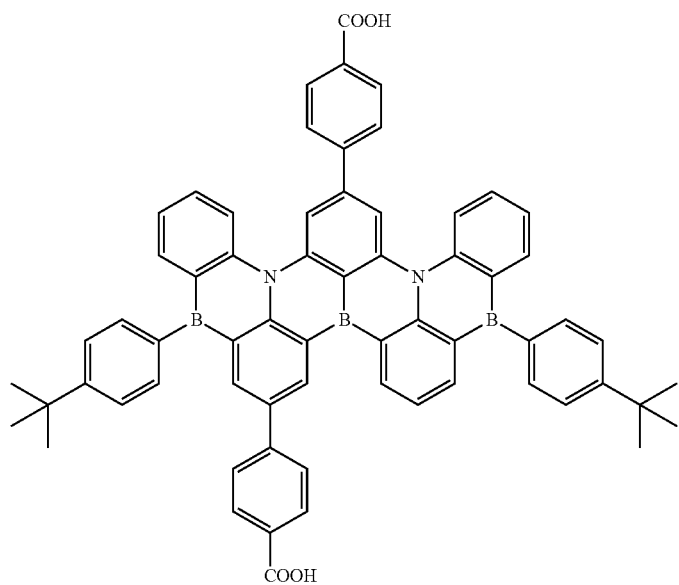
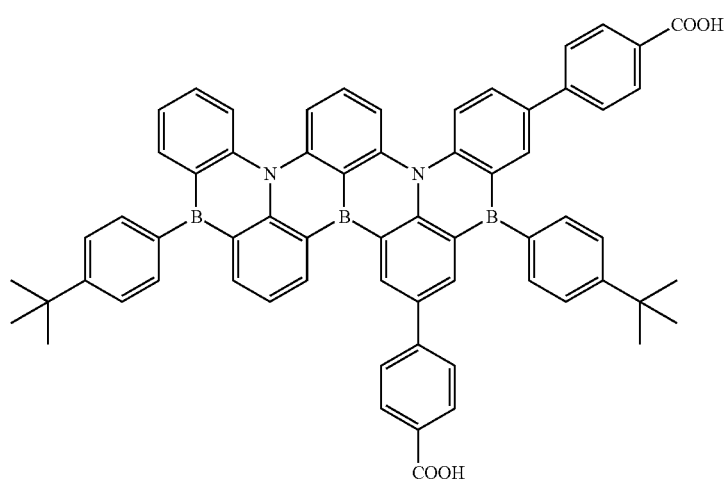

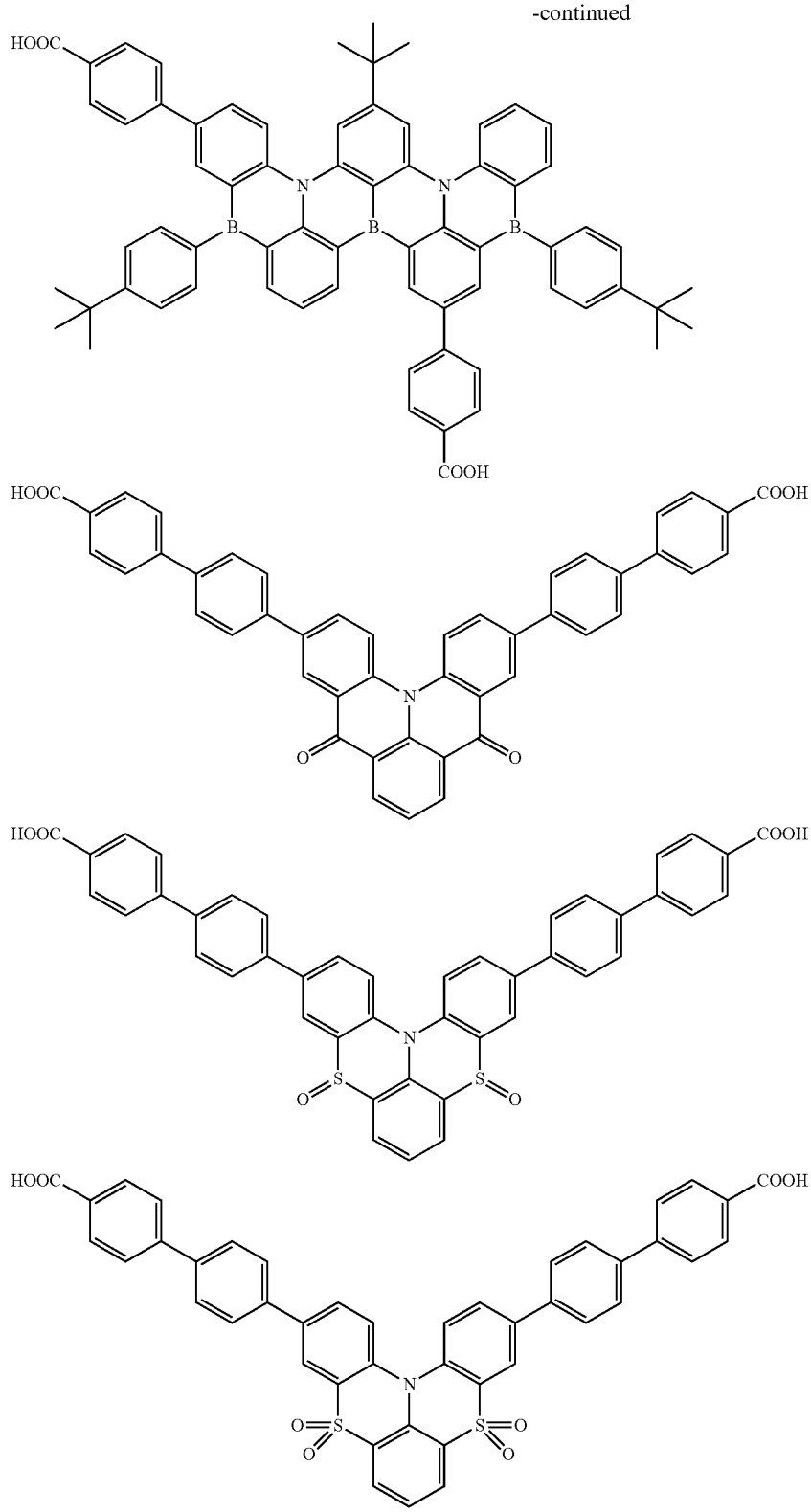

In another aspect, the present disclosure also provides a synthetic method for the organic compound according to the formula (1) or (2), wherein feedstocks containing active groups are used to carry out the reaction. These active feedstocks comprise at least one leaving group, such as, a bromine, an iodine, a boronic acid, or a boronic ester. The appropriate reactions for forming C—C linkages are familiar to the person skilled in the art and are described in the literature, particularly appropriate and preferred coupling reactions are the SUZUKI, STILLE, Hartwig, and HECK.

In yet another aspect, the present disclosure further provides a mixture, comprising at least one organic compound as described above and another organic functional material. The another organic functional material may be selected from the group consisting of a hole-injection material (HIM), a hole-transport material (HTM), a hole-blocking material (HBM), an electron-injection material (EIM), an electron-transport material (ETM), an electron-blocking material (EBM), an organic host material (Host), a singlet emitting material (fluorescent emitting material), a triplet emitting material (phosphorescent emitting material), a thermally activated delayed fluorescence material (TADF material), and an organic dye. These organic functional materials are described in details, for example, in WO2010135519A1, US20090134784A1 and WO201110277A1. The entire contents of the these three documents are incorporated herein by reference in their entirety.

In some embodiments, the mixture comprises an organic compound as described herein, and a fluorescent host material (or singlet host material). The organic compound as described herein can be used here as a dopant or an emitter with a weight percentage is ≤15 wt %, preferably ≤12 wt %, more preferably ≤9 wt %, particularly preferably ≤8 wt %, and most preferably ≤7 wt %.

In some embodiments, the mixture comprises an organic compound as described herein, another fluorescent emitter (or singlet emitter), and a fluorescent host material. In this embodiment, the organic compound as described herein can be used as co-emitter, and the weight ratio of which to another fluorescent emitter ranges from 1:20 to 20:1.

The fluorescent host material and the fluorescent emitter are described in details below.

1. Singlet Host

Examples of singlet host materials are not specially limited, any organic compound may be used as a host, as long as its singlet energy is higher than dopant material, eapecially higher than that of the singlet emitter or the fluorescent emitter.

Examples of the organic compound used as the singlet host material may be selected from: cyclic aromatic hydrocarbon compounds, such as benzene, biphenyl, triphenylbenzene, triphenylene, benzphenanthrene, naphthalene, anthracene, phenalene, phenanthrene, fluorene, pyrene, chrysene, perylene, azulene; aromatic heterocyclic compounds, such as dibenzothiophene, dibenzofuran, dibenzothiophene, furan, thiophene, benzofuran, benzothiophene, benzoselenophene, carbazole, indocarbazole, pyridine, pyrrolodine, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indolizine, benzoxazole, benzoisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuranopyridine, furopyridine, benzothienopyridine, thiophenedipyridine, benzoselenophenopyridine, or selenophenodipyridine. The organic compound used as the singlet host material may be containing a 2 to 10 ring atoms, which may be the same or different types of cyclic aromatic hydrocarbon groups/aromatic heterocyclic groups, and are linked to one another directly or via at least one group selected from the group consisting of oxygen atom, nitrogen atom, sulfur atom, silicon atom, phosphorus atom, boron atom, chain structure unit, and aliphatic ring group.

In some embodiments, the singlet host material may be selected from the compounds comprising at least one of the following groups:

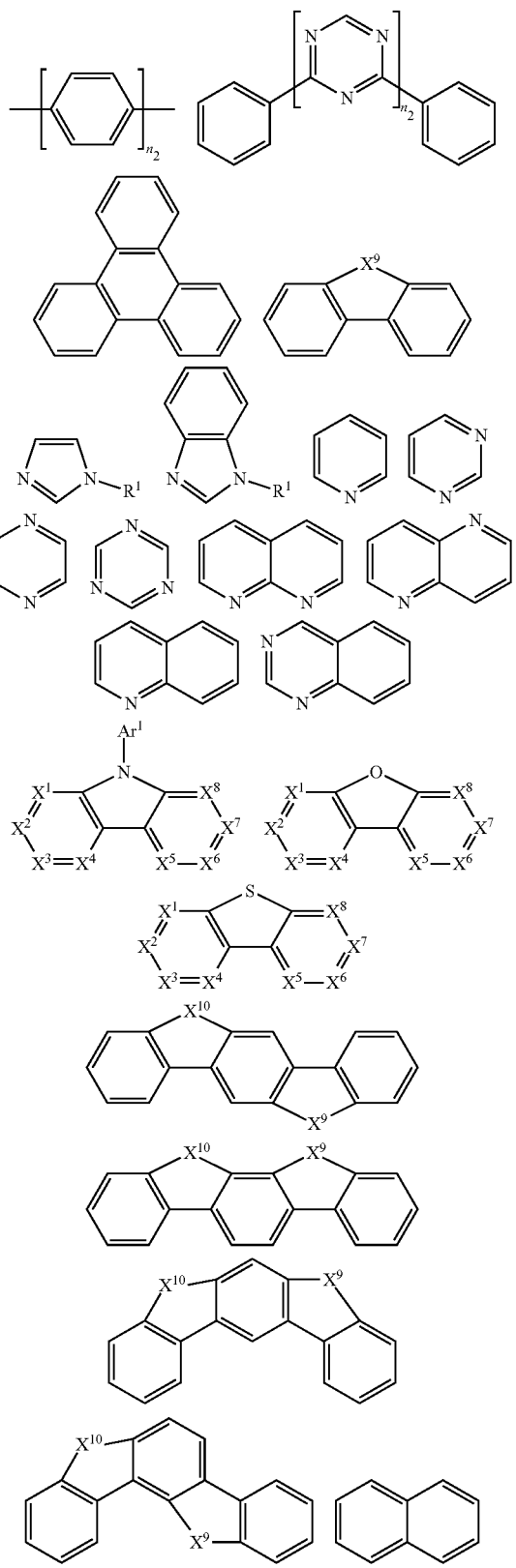

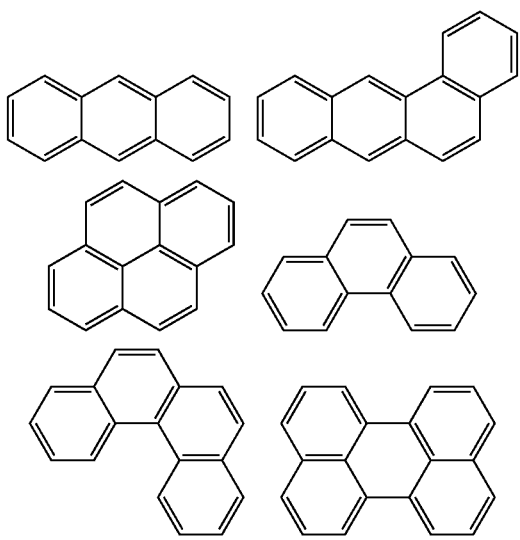

wherein $R^1$ may be independently selected from the group consisting of H, alkyl, alkoxy, amino, alkene, alkyne, aralkyl, heteroalkyl, aryl, and heteroaryl; $Ar^1$ is aryl or heteroaryl in the same definition as $Ar^1$ defined as described above; $n_2$ is an integer from 0 to 20; each of $X^1$ to $X^8$ is CH or N; each of $X^9$ and $X^{10}$ is $CR^1R^2$ or $NR^1$.

Examples of some anthracene-based singlet host materials are listed below:

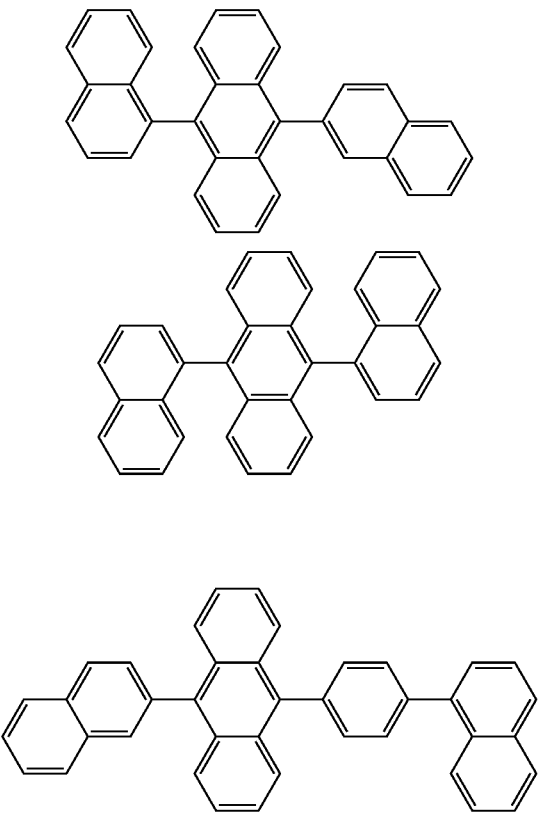

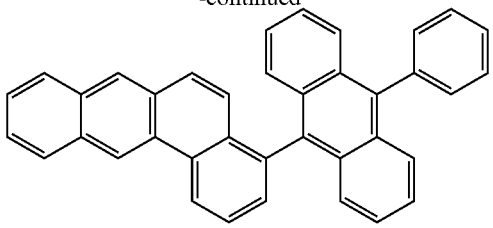

2. Singlet Emitter

The singlet emitter tends to have a longer conjugate π-electron system. Hitherto, there have been many examples of styryl amines and derivatives thereof as disclosed in JP2913116B and WO2001021729A1, and indenofluorenes and derivatives thereof as disclosed in WO2008/006449 and WO2007/140847.

In some embodiments, the singlet emitter can be selected from the group consisting of monostyrylamines, distyrylamines, tristyrylamines, tetrastyrylamines, styrenphosphines, styrenethers, and arylamines.

A monostyrylamine refers to a compound, which comprises an unsubstituted or substituted styrenyl group and at least one amine, preferably an aromatic amine. A distyrylamine is meant a compound comprising two unsubstituted or substituted styrylgroups and at least one amine, preferably an aromatic amine. A ternarystyrylamine refers to a compound comprising three unsubstituted or substituted styryl groups and at least one amine, preferably an aromatic amine. A quaternarystyrylamine refers to a compound comprising four unsubstituted or substituted styryl groups and at least one amine, preferably an aromatic amine. A preferred styrene is stilbene, which may be further substituted. The corresponding phosphines and ethers are defined analogously as amines. Aryl amine or aromatic amine refers to a compound comprising three unsubstituted or substituted aromatic rings or heterocyclic systems directly linked to nitrogen. At least one of these aromatic or heterocyclic ring systems is preferably a fused ring system and preferably has at least 14 aromatic ring atoms. Preferred examples thereof include aromatic anthracene amine, aromatic anthracene diamine, aromatic pyrene amine, aromatic pyrene diamine, aromatic trolamine and aromatic trodiamine An aromatic anthraceneamine refers to a compound, wherein a diarylamine group is attached directly to the anthracene, preferably at the position 9. An aromatic anthracene diamine refers to a compound in which two diarylamine groups are directly attached to the anthracene, most preferably at positions 9, 10. Aromatic pyrene amines, aromatic pyrene diamines, aromatic dromamines, and aromatic dromenediamines are similarly defined, wherein the diarylamino group is most preferably attached to position 1 or 1,6 of pyrene.

Examples of singlet emitters based on vinylamine and arylamine are also preferred examples which may be found in the following patent documents: WO2006/000388, WO2006/058737, WO2006/000389, WO2007/065549, WO2007/115610, U.S. Pat. No. 7,250,532B2, DE102005058557A1, CN1583691A, JP08053397A, U.S. Pat. No. 6,251,531B1, US2006/210830A, EP1957606A1, and US2008/0113101A1, the whole contents of which are incorporated herein by reference.

Examples of singlet emitters based on stilbene and its derivatives may be found in U.S. Pat. No. 5,120,129.

Further preferred singlet emitter can be selected from the group consisting of indenofluorene-amine and indenofluorene-diamine such as disclosed in WO2006/122630, benzoindenofluorene-amine and benzoindenofluorene-diamine such as disclosed in WO2008/006449, dibenzoindenofluorene-amine and dibenzoindenofluorene-diamine such as disclosed in WO2007/140847.

Other materials useful as singlet emitter include, but not limited to, polycyclic aromatic compounds, are especially selected from the derivatives of the following compounds: anthracenes such as 9,10-bis(2-naphthoanthracene), naphthalene, tetraphenyl, phenanthrene, perylene such as 2,5,8,11-tetra-t-butylatedylene, indenoperylene, phenylenes such as (4,4'-(bis(9-ethyl-3-carbazovinylene)-1,1'-biphenyl), periflanthene, decacyclene, coronene, fluorene, spirobifluorene, arylpyren (e.g., US20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4 (dicyanoethylene)-6-(4-dimethylaminostyryl-2-methyl)-4H-pyrane (DCM), thiapyran, bis(azinyl)imine-boron compounds (US2007/0092753A1), bis(azinyl) methene compounds, carbostyryl compounds, oxazone, benzoxazole, benzothiazole, benzimidazole, and diketopyrrolopyrrole. Some singlet emitter materials may be found in the following patent documents: U.S. Pat. Nos. 4,769,292, 6,020,078, and US 2007/0252517A1. The patent documents listed above are specially incorporated herein by reference in their entirety.

The following are some examples of singlet emitters:

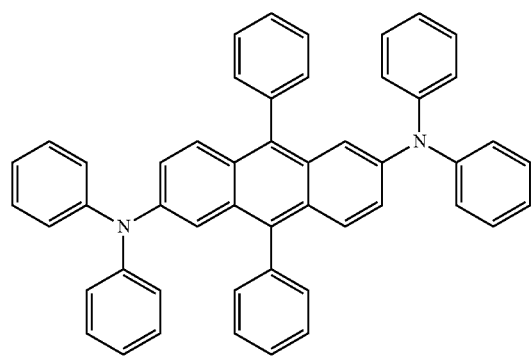

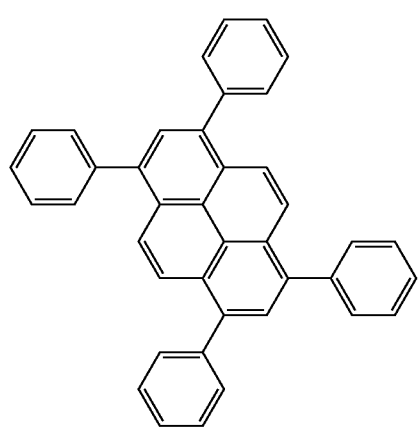

-continued

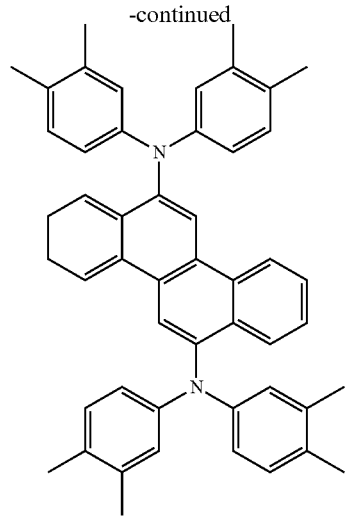

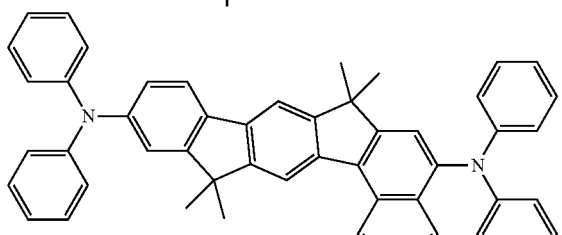

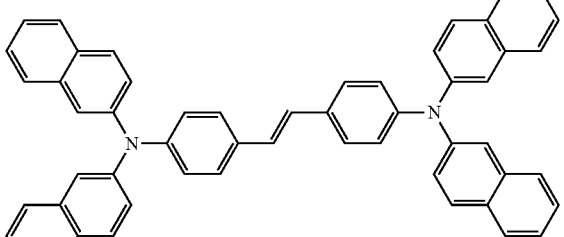

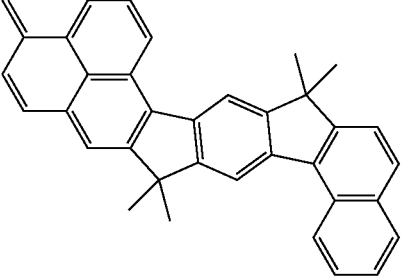

The publications of organic functional material presented above are incorporated herein by reference for the purpose of disclosure.

In yet another aspect, the present disclosure further provides a formulation, comprising at least one organic compound as described herein, at least one organic solvent.

In some embodiments, the formulation comprises an organic resin. In some embodiments, the formulation comprises two or more organic resins. In some embodiments, the formulation comprises three or more organic resins.

For the purposes of the present disclosure, the organic resin refers to a resin prepolymer or a resin formed after the prepolymer is crosslinked or cured.

The organic resins suitable for the present disclosure include, but not limited to: polystyrene, polyacrylate, polymethacrylate, polycarbonate, polyurethane, polyvinylpyrrolidone, polyvinyl acetate, polybutene, polyethylene glycol, polysiloxane, epoxy resin, polyvinyl alcohol, polyacrylonitrile, polyvinylidene chloride(PVDC), polystyrene-acrylonitrile(SAN), polybutylene terephthalate(PBT), polyethylene terephthalate(PET), polyvinyl butyrate(PVB), polyvinyl chloride(PVC), polyamide, polyoxymethylene, polyimide, polyetherimide, and mixtures thereof.

Further, the organic resins suitable for the present disclosure include, but not limited to, those formed by homopolymerization or copolymerization of the following monomers (resin prepolymers): styrene derivatives, acrylate derivatives, acrylonitrile derivatives, acrylamide derivatives, vinyl ester derivatives, vinyl ether derivatives, maleimide derivatives, conjugated diene derivatives.

Examples of styrene derivatives include, but not limited to alkylstyrenes, such as α-methylstyrene, o-, m-, p-methylstyrene, p-butylstyrene, especially 4-tert-butylstyrene; alkoxystyrene, such as p-methoxy styrene, p-butoxystyrene, p-tert-butoxystyrene.

Examples of acrylate derivatives include, but not limited to methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate., phenyl acrylate, phenyl methacrylate, 2-methoxyethyl acrylate, 2-methoxyethyl methacrylate, 2-phenoxyethyl acrylate, 2-phenoxyethyl methacrylate, methoxydiethylene glycol acrylate, methoxydiethylene glycol methacrylate, methoxytriethylene glycol acrylate, methoxytriethylene glycol methacrylate, methoxypropylene glycol acrylate, methoxypropylene glycol methacrylate, methoxy dipropylene glycol acrylate, methoxydipropylene glycol methacrylate, isobornyl acrylate, isobornyl methacrylate, dicyclopentadiene acrylate, dicyclopentadiene methacrylate, adamantane (meth)acrylate, norbornene (meth)acrylate, 2-hydroxy-3-phenoxypropyl acrylate, 2-hydroxy-3-phenoxypropyl methacrylate, glyceryl monoacrylate, glyceryl monostearate; 2-aminoethyl acrylate, 2-aminoethyl methacrylate, 2-dimethylaminoethyl acrylate, 2-dimethylaminoethyl methacrylate, N,N-dimethylaminoethyl (meth)acrylic acid, N,N-diethylaminoethyl (meth)acrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, N,N-dimethyl-1,3-propane diamine (meth)acrylate, 3-dimethylaminopropyl acrylate, 3-dimethylaminopropyl methacrylate, glycidyl acrylate, and glycidyl methacrylate.

Examples of acrylonitrile derivatives include, but not limited to acrylonitrile, methacrylonitrile, α-chloroacrylonitrile, and vinylidene cyanide.

Examples of acrylamide derivatives include, but not limited to acrylamide, methacrylamide, α-chloroacrylamide, N-2-hydroxyethyl acrylamide, and N-2-hydroxyethyl methacrylamide.

Examples of vinyl ester derivatives include, but not limited to vinyl acetate, vinyl propionate, vinyl butyrate, and vinyl benzoate.

Examples of vinyl ether derivatives include, but not limited to vinyl methyl ether, vinyl ethyl ether, and allyl glycidyl ether.

Examples of maleimide derivatives include, but not limited to maleimide, benzylmaleimide, N-phenylmaleimide, and N-cyclohexylmaleimide.

Examples of conjugated diene derivatives include, but not limited to 1,3-butadiene, isoprene, and chloroprene.

The homopolymers or copolymers can be prepared by free radical polymerization, cationic polymerization, anionic polymerization, or organometallic catalytic polymerization (for example Ziegler-Natta catalysis). The process of polymerization can be suspension polymerization, emulsion polymerization, solution polymerization, or bulk polymerization.

The average molar mass $M_n$ (as determined by GPC) of the organic resins is generally in the range from 10 000 to 1 000 000 g/mol, preferably in the range from 20 000 to 750 000 g/mol, more preferably in the range from 30 000 to 500 000 g/mol.

In some embodiments, the organic resin is a thermosetting resin or an UV curable resin. In some embodiments, the organic resin is cured by a method that will enable roll-to-roll processing.

Thermoset resins require curing in which they undergo an irreversible processe of molecular cross-linking, which makes the resin non-fusible. In some embodiments, the thermosetting resin is an epoxy resin, a phenolic resin, a vinyl resin, a melamine resin, an urea-formaldehyde resin, an unsaturated polyester resin, a polyurethane resin, an allyl resin, an acrylic resin, a polyamide resin, a polyamide-imide resin, a phenol-amide polycondensation resin, an urea-melamine polycondensation resin, or combinations thereof.

In some embodiments, the thermosetting resin is an epoxy resin. The epoxy resin is easy to cure and do not give off volatiles or generate by-products from a wide range of chemicals. The epoxy resins can also be compatible with most substrates and tend to readily wet surfaces. See also Boyle, M. A. et al., "Epoxy Resins", Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation (Auburn, MI)).

In some embodiments, the formulation comprises an organic solvent. In other embodiments, the formulation comprises two or more organic solvents. In other embodiments, the formulation comprises three or more organic solvents.

In some embodiments, the formulation as described herein is a solution.

In some embodiment, the formulation as described herein is a dispersion.

The formulation in the embodiments of the present disclosure may comprise the organic compound of 0.01 to 20 wt %, preferably 0.1 to 20 wt %, more preferably 0.2 to 20 wt %, and most preferably 1 to 15 wt %.

Using the formulation as described herein, the color conversion layer may be fabricated by inkjet printing, transfer printing, photolithography, etc. In this case, the color conversion layer materials as described herein needs to be dissolved alone or together with other materials in a resin (prepolymer) and/or an organic solvent, to form inks. The mass concentration of the color conversion material as described herein in the ink is not less than 0.1 wt %. The color conversion ability of the color conversion layer can be tuned by modifying the concentration of the color conversion material in the ink and the thickness of the color conversion layer. In general, the higher the concentration of the color conversion material or the thickness of the layer, the higher the color conversion efficiency of the color conversion layer would be.

Other materials that can be added into the ink include but not limited to the following materials: polyethylene, polypropylene, polystyrene, polycarbonate, polyacrylate, polyvinyl pyrrolidone, polyvinyl alcohol, polyvinyl acetate, polyethylene glycol, polysiloxane, polyacrylonitrile, polyvinyl chloride, polyvinylidene chloride, polyethylene terephthalate, polybutylene terephthalate, polyvinyl butyrate, polyamide, polyoxymethylene, polyimide, polyether-etherketone, polysulfone, polyarylether, polyaramide, cellulose, modified cellulose, acetate fiber, nitrocellulose, or mixtures thereof.

In some embodiments, the organic solvent as described herein is selected from the group consisting of alcohols, esters, aromatic ketones, aromatic ethers, aliphatic ketones, aliphatic ethers, inorganic ester compounds such as boronic esters or phosphoric esters, and mixtures of two or more of them.

In some embodiments, the suitable and preferred organic solvents are aliphatics, alicyclics, aromatics, amines, thiols, amides, nitriles, esters, ethers, polyethers, alcohols, diols or polyols.

In some embodiments, the alcohol represents an organic solvent of the suitable class. Preferred alcohol includes alkylcyclohexanol, particularly methylated aliphatic alcohol, naphthol, etc.

Examples of the suitable alcohol solvents include dodecanol, phenyltridecanol, benzyl alcohol, ethylene glycol, ethylene glycol methyl ether, glycerol, propylene glycol, propylene glycol ethyl ether, etc.

The organic solvent may be used alone or as mixtures of two or more organic solvents.

In some embodiments, the formulation as described herein comprises an organic functional compound as described herein and at least one organic solvent, and further comprising another organic solvent. Examples of the another organic solvent include, but not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4 dioxane, acetone, methyl ethyl ketone, 1,2 dichloroethane, 3-phenoxytoluene, 1,1,1-trichloroethane, 1,1,2,2-tetrachloroethane, ethyl acetate, butyl acetate, dimethylformamide, dimethylacetamide, dimethylsulfoxide, tetrahydronaphthalene, decalin, indene, and/or a mixture thereof.

In some embodiments, in the formulation as described herein include, the another organic solvent is selected from aromatic, heteroaromatic, ester, aromatic ketone, aromatic ether, aliphatic ketone, aliphatic ether, cycloaliphatic, olefinic compound, or inorganic ester compounds such as boronic acid ester or phosphoric acid ester, or mixtures of two or more of them.

Examples of aromatic or heteroaromatic solvents as described herein include, but not limited to: 1-tetralone, 3-phenoxytoluene, acetophenone, 1-methoxynaphthalene, p-diisopropylbenzene, amylbenzene, tetrahydronaphthalene, cyclohexylbenzene, chloronaphthalene, 1,4-dimethylnaphthalene, 3-isopropylbiphenyl, p-methylcumene, dipentylbenzene, o-diethylbenzene, m-diethylbenzene, p-diethylbenzene, 1,2,3,4-tetramethyl benzene, 1,2,3,5-tetramethyl benzene, 1,2,4,5-tetramethyl benzene, butylbenzene, dodecyl benzene, 1-methylnaphthalene, 1,2,4-trichlorobenzene, 1,3-Dipropoxybenzene, 4,4-difluorodiphenylmethane, diphenyl ether, 1,2-dimethoxy-4-(1-propenyl)benzene, diphenylmethane, 2-phenylpyridine, 3-phenylpyridine, 2-phenoxymethyl ether, 2-phenoxytetrahydrofuran, ethyl-2-naphthyl ether, N-methyldiphenylamine, 4-Isopropylbiphenyl, Dichlorodiphenylmethane, 4-(3-phenylpropyl)pyridine, benzyl benzoate, 1,1-bis(3,4-dimethylphenyl) ethane, 2-isopropylnaphthalene, dibenzyl ether, etc.

In some embodiments, the suitable and preferred another solvents are aliphatics, alicyclics, aromatics, amines, thiols, amides, nitriles, esters, ethers, polyethers.

The another organic solvent may be a cycloalkane, such as decahydronaphthalene.

In some embodiments, the formulation as described herein comprises at least 50 wt % of an alcoholic solvent, preferably at least 80 wt %, particularly preferably at least 90 wt %.

In some embodiments, the organic solvent particularly suitable for the present disclosure is a solvent having Hansen solubility parameters in the following ranges:

$\delta_d$ (dispersion force) is in the range of 17.0 to 23.2 MPa$^{1/2}$, especially in the range of 18.5 to 21.0 MPa$^{1/2}$;

$\delta_p$ (polarity force) is in the range of 0.2 to 12.5 MPa$^{1/2}$, especially in the range of 2.0 to 6.0 MPa$^{1/2}$;

$\delta_h$ (hydrogen bonding force) is in the range of 0.9 to 14.2 MPa$^{1/2}$, especially in the range of 2.0 to 6.0 MPa$^{1/2}$.

In the formulation as described herein, the boiling point parameter of the organic solvents should be taken into account when selecting the organic solvent. In the present disclosure, the boiling points of the organic solvents are ≥150° C.; preferably ≥180° C.; more preferably ≥200° C.; further more preferably ≥250° C.; and most preferably ≥275° C. or ≥300° C. The boiling points in these ranges are beneficial in terms for preventing nozzle clogging of the inkjet printhead. The organic solvent can be evaporated from solution system to form a functional material film.

In some embodiments, the formulation as described herein, wherein:
1) the viscosity is in the range of 1 cps to 100 cps at 25° C.; and/or
2) the surface tension is in the range of 19 dyne/cm to 50 dyne/cm at 25° C.

In the formulation as described herein, the surface tension parameter of the organic solvent should be taken into account when selecting the organic solvent. The suitable surface tension parameters of the inks are suitable for the particular substrate and particular printing method. For example, for the inkjet printing, in some embodiments, the surface tension of the organic solvent at 25° C. is in the range of 19 dyne/cm to 50 dyne/cm, further in the range of 22 dyne/cm to 35 dyne/cm, and still further in the range of 25 dyne/cm to 33 dyne/cm.

In some embodiments, the surface tension of the ink as described herein at 25° C. is in the range of 19 dynes/cm to 50 dynes/cm; more preferably in the range of 22 dyne/cm to 35 dyne/cm; and most preferably in the range of 25 dyne/cm to 33 dyne/cm.

In the formulation as described herein, the viscosity parameters of the ink of the organic solvent must be taken into account when selecting the organic solvent. The viscosity can be adjusted by different methods, such as by the selection of appropriate organic solvent and the concentration of the functional materials in the ink. In some embodiments, the viscosity of the organic solvent is less than 100 cps, further less than 50 cps, and still further 1.5 to 20 cps. The viscosity herein refers to the viscosity during printing at the ambient temperature that is generally at 15-30° C., preferably 18-28° C., more preferably 20-25° C., and most preferably 23-25° C. The formulation thus prepared will be particularly suitable for inkjet printing.

In some embodiments, the formulation as described herein has a viscosity at 25° C. in the range of about 1 cps to 100 cps; more preferably in the range of 1 to 50 cps; and most preferably in the range of 1.5 to 20 cps.

The ink obtained from the organic solvent satisfying the above-mentioned boiling point parameter, surface tension parameter and viscosity parameter can form a functional material film with uniform thickness and composition property.

Salts are difficult to be purified, and contains impurities, which may often influence the opto-elecrtonic performance of the device. For the purposes of the present disclosure, in some some embodiments, the formulation or mixture as described herein does not comprise any salts, and preferably does not comprise any organic acid salts formed by organic acids and metals. In terms of cost, the present disclosure preferably excludes organic acid salts comprising transition metals or lanthanide elements.

In yet another aspect, the present disclosure further provides an organic functional material film comprising an organic compound or a mixture as described herein. Preferably, the organic functional material film is made from a formulation as described herein.

In yet another aspect, the present disclosure further provides a method for preparing the organic functional material film, as shown in the following steps:

1) Prepare a formulation as described herein.
2) The formulation is coated on a substrate by printing or coating to form a film, wherein the method of printing or coating is selected from the group consisting of inkjet printing, nozzle printing, typographic printing, screen printing, dip coating, spin coating, blade coating, roller printing, torsional roll printing, planographic printing, flexographic printing, rotary printing, spray printing, brush or pad printing, and slit die coating.
3) The obtained film is heated at least 50° C., optionally in combination with UV irradiation, to allow the film to undergo a crosslinking reaction and be cured.

The thickness of the organic functional material film is generally 50 nm-200 m, preferably 100 nm-150 m, more preferably 500 nm-100 m, still more preferably 1 m-50 m, and most preferably 1 m-20 m.

In some embodiments, the organic functional material film has a thickness of 20 nm-20 m, preferably less than 15 m, more preferably less than 10 m, still more preferably less than 8 m, particularly preferably less than 6 m, further preferably less than 4 m, and most preferably less than 2 m.

In yet another aspect, a further purpose of the present disclosure is to provide the use of the above organic compound and mixture thereof in optoelectronic devices.

In some embodiments, the optoelectronic device may be selected from an organic light emitting diode (OLED), an organic photovoltaic cell (OPV), an organic light emitting electrochemical cell (OLEEC), an organic field effect transistor (OFET), an organic light emitting field effect transistor, an organic laser, an organic spintronic device, an organic sensor, or an organic plasmon emission diode.

In yet another aspect, the present disclosure provides an optoelectronic device comprising one of the organic compound, mixture, or an organic functional material film as described above.

In some embodiments, the optoelectronic device may be selected from an organic light emitting diode (OLED), an organic photovoltaic cell (OPV), an organic light emitting electrochemical cell (OLEEC), an organic field effect transistor (OFET), an organic light emitting field effect transistor, an organic laser, an organic spintronic device, an organic sensor, or an organic plasmon emitting diode.

Preferably, the optoelectronic device is an electroluminescent device, such as an organic light emitting diode (OLED), an organic light emitting electrochemical cell (OLEEC), an organic light emitting field effect transistor, a perovskite light emitting diode (PeLED), or a quantum dot light emitting diode (QD-LED), wherein one of the functional layers comprises one of the organic compound and mixture as described above. The functional layer may be selected from a hole injection layer, a hole transport layer, an electron injection layer, an electron transport layer, a light emitting layer, or a cathode passivation layer (CPL).

In some embodiments, the optoelectronic device is an electroluminescent device, comprising two electrodes, and the functional layer is located on the same side of the two electrodes.

In some embodiments, the optoelectronic device comprises a light emitting unit and a color conversion layer, wherein the color conversion layer comprises one of the organic compound or the mixture as described above.

In some embodiments, the light emitting unit is selected from a solid state light emitting device. The solid state light emitting device is preferably selected from a LED, an organic light emitting diode (OLED), an organic light emitting electrochemical cell (OLEEC), an organic light emitting field effect transistor, a perovskite light emitting diode (PeLED), or a quantum dot light emitting diode (QD-LED).

In some embodiments, the light emitting unit emits blue light, which is converted into green light or red light by the color conversion layer.

In yet another aspect, the present disclosure further relates to a display, comprising at least three pixels of red, green and blue, wherein the blue pixel comprises a blue light emitting unit, and the pixel of red and green comprises a blue light emitting unit and a corresponding color conversion layer of red and green.

The present disclosure will be described below in conjunction with the preferred embodiments, but the present disclosure is not limited to the following embodiments. It should be understood that the scope of the present disclosure is covered by the scope of the claims of the present disclosure, and those skilled in the art should understand that certain changes may be made to the embodiments of the present disclosure.

SPECIFIC EMBODIMENT

Example 1: Synthesis of Compound 1

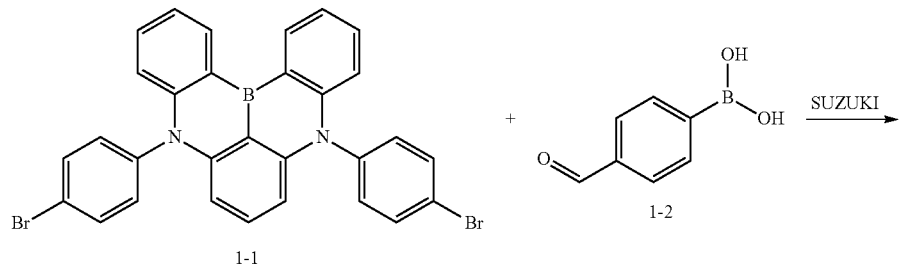

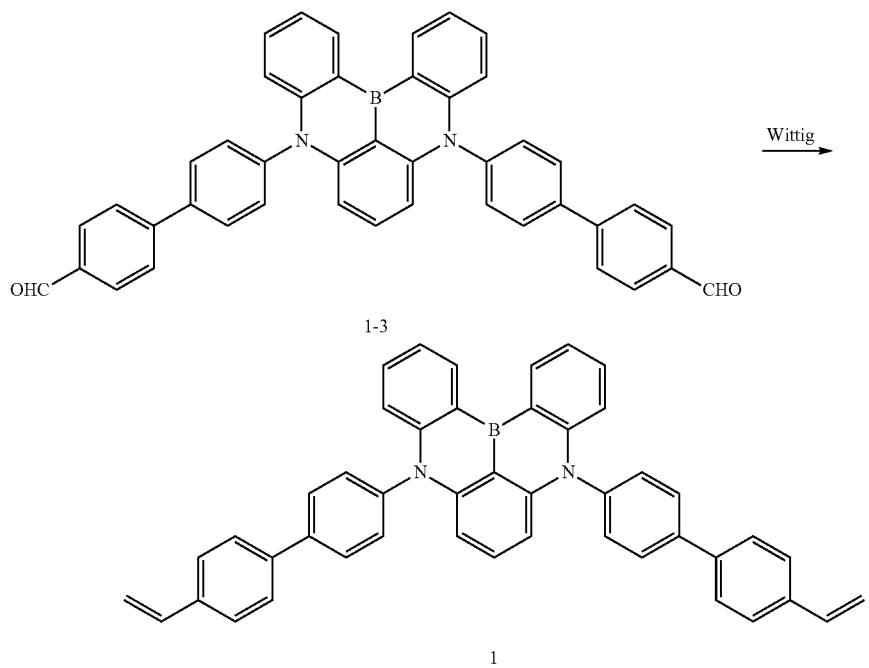

Synthesis of compound 1: by the classical SUZUKI reaction is as follows: 10.00 mmol of the intermediate 1-1, 20.08 mmol of the intermediate 1-2, and 20.00 mmol of potassium carbonate were added in turn to a 500 ml three-necked flask under $N_2$ atmosphere protection. Then 200 ml of toluene were poured in, and 0.3 mol of the catalyst Pd(PPh3)4 were added under stirring, then heating reflux reaction, TLC tracking. After the reaction was completed, the reaction solution was cooled to the room temperature, washed with water and dichloromethane each three times. The organic phase was then collected, dried with anhydrous $Na_2SO_4$, filtered and spin dried the solvent to obtain the crude product. The resulting product was purified by using flash chromatography column (7.88 mmol, yield: 78.8%), and further vacuum-dried for use. MS(ASAP)=604.2.

Example 1: Synthesis of Compound 1

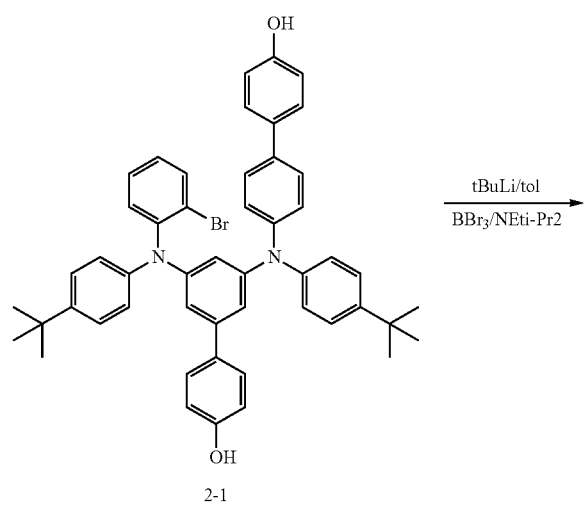

109
-continued

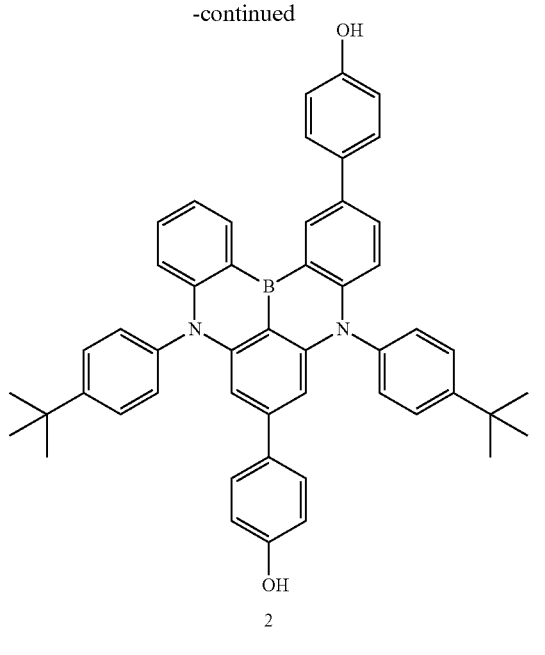

2

Synthesis of compound 2: The synthetic method was similar to that of compound 1, a classical SUZUKI reaction was adopted, yield: 82.4%. Vacuum-dried for use. MS (ASAP)=716.4.

Example 3: Synthesis of Compound 3

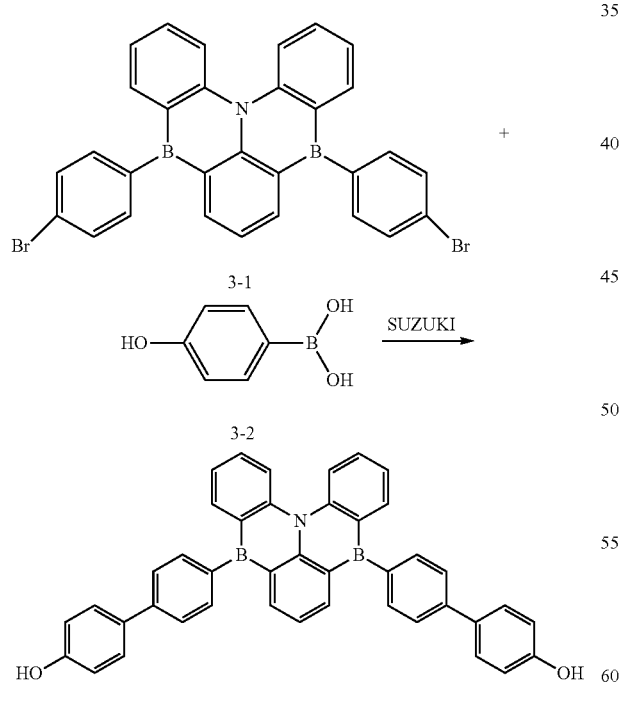

Synthesis of compound 3: The synthetic method was similar to that of compound 1, a classical SUZUKI reaction was adopted, yield: 75.3%. Vacuum-dried for use. MS (ASAP)=601.2.

110

Example 4: Synthesis of Compound 4

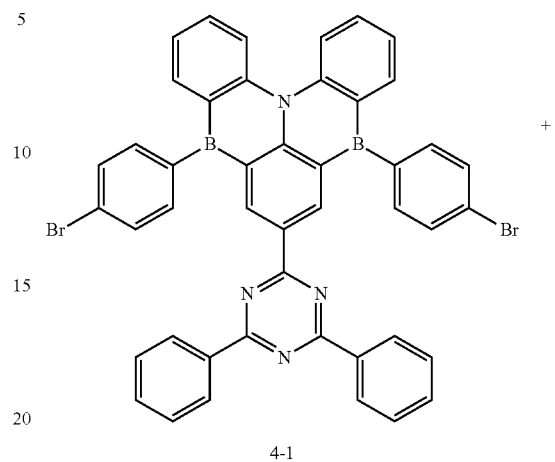

4-1

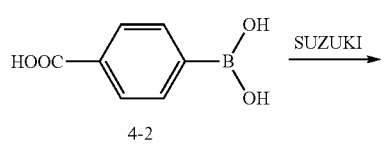

4-2

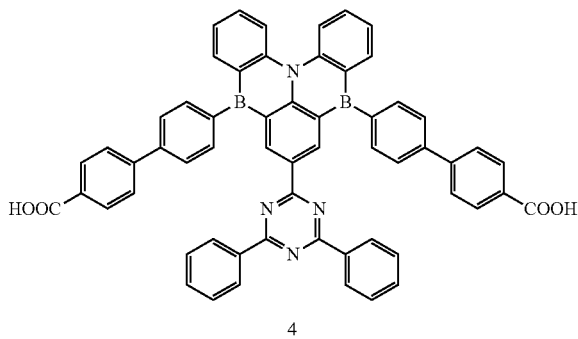

4

Synthesis of Compound 4

The synthetic method was similar to that of compound 1, a classical SUZUKI reaction was adopted, yield 78.4%. Vacuum-dried for use. MS(ASAP)=888.3.

Example 5: Synthesis of Compound 5

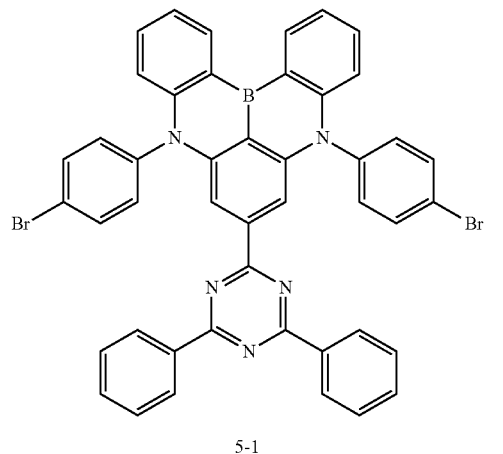

5-1

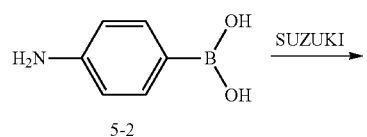

5-2

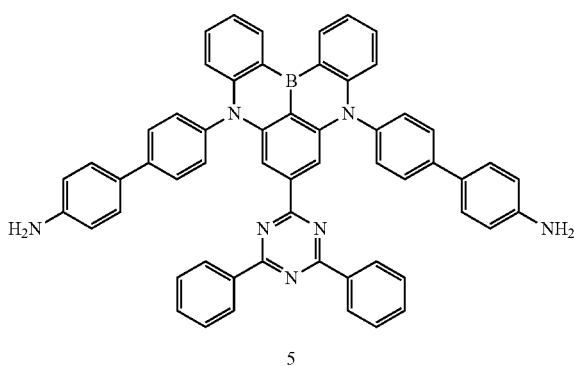

5

Synthesis of Compound 5

The synthetic method was similar to that of compound 1, a classical SUZUKI reaction was adopted, yield 81.3%. Vacuum-dried for use. MS(ASAP)=833.3.

Example 6: Synthesis of Compound 6

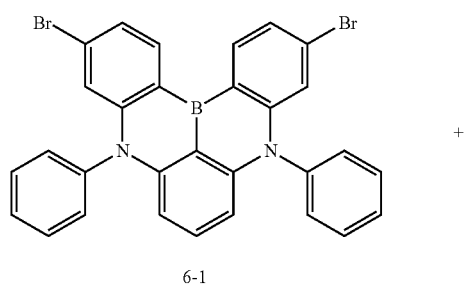

6-1

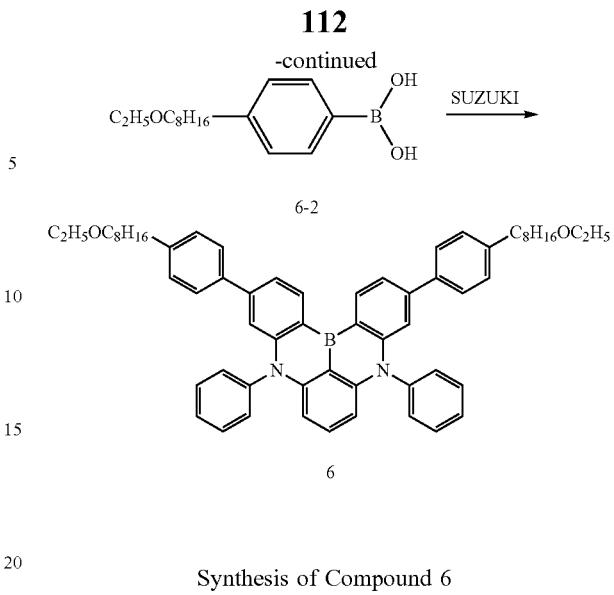

6

Synthesis of Compound 6

The synthetic method was similar to that of compound 1, a classical SUZUKI reaction was adopted, yield 80.4%. Vacuum-dried for use. MS(ASAP)=884.5.

Example 7: Synthesis of Compound 7

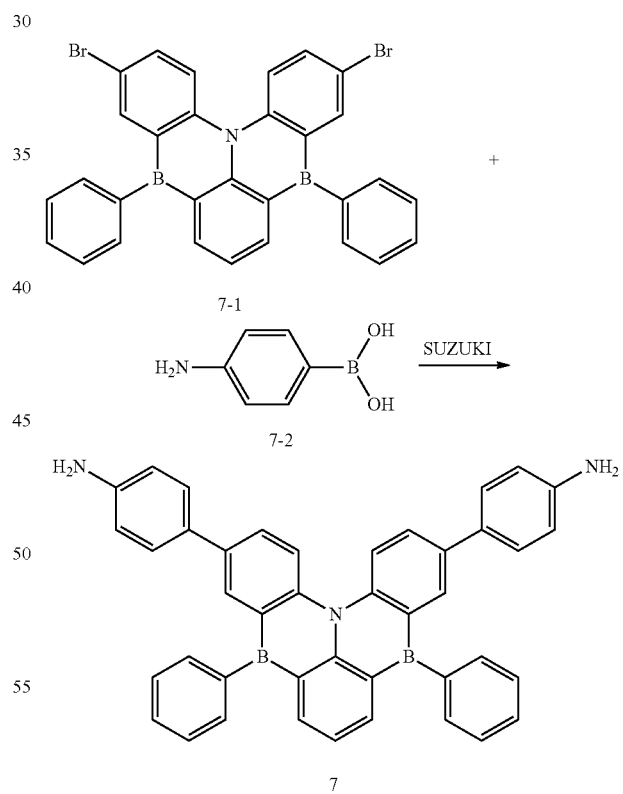

7

Synthesis of Compound 7

The synthetic method was similar to that of compound 1, a classical SUZUKI reaction was adopted, yield 79.3%. Vacuum-dried for use. MS(ASAP)=599.3.

Example 8: Synthesis of Compound 8

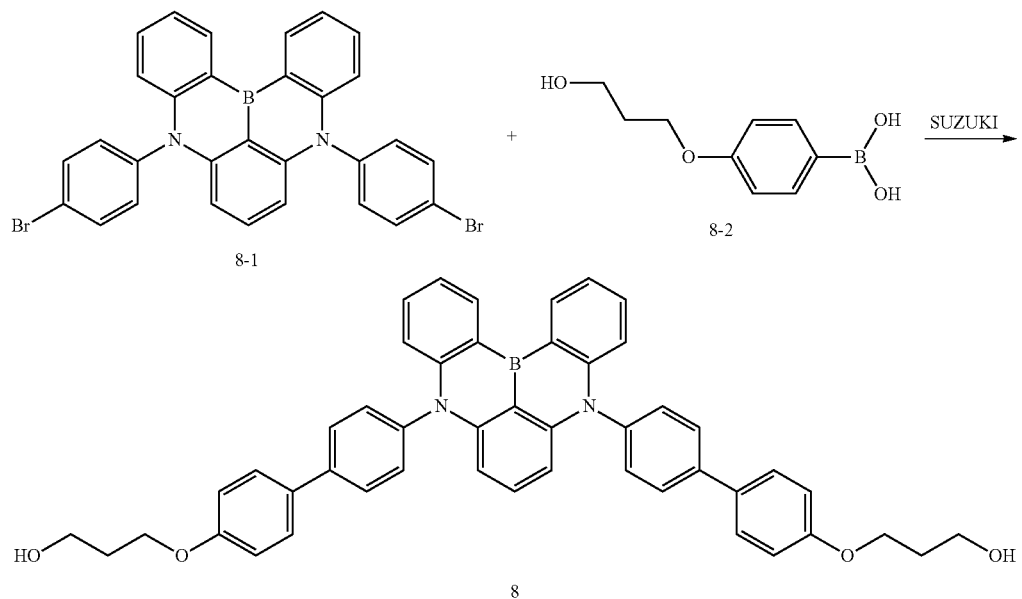

8

Synthesis of Compound 8

The synthetic method was similar to that of compound 1, a classical SUZUKI reaction was adopted, yield 85.2%. Vacuum-dried for use. MS(ASAP)=717.3.

Example 9: Synthesis of Compound 9

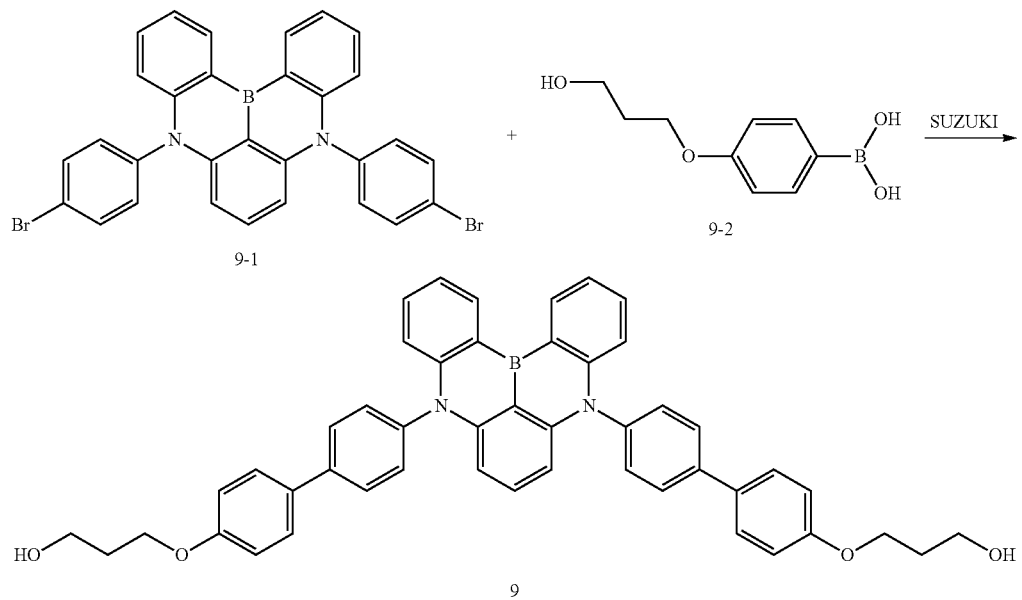

9

Synthesis of Compound 9

The synthetic method was similar to that of compound 1, a classical SUZUKI reaction was adopted, yield 89.3%. Vacuum-dried for use. MS(ASAP)=720.3.

Example 10: Synthesis of Compound 10

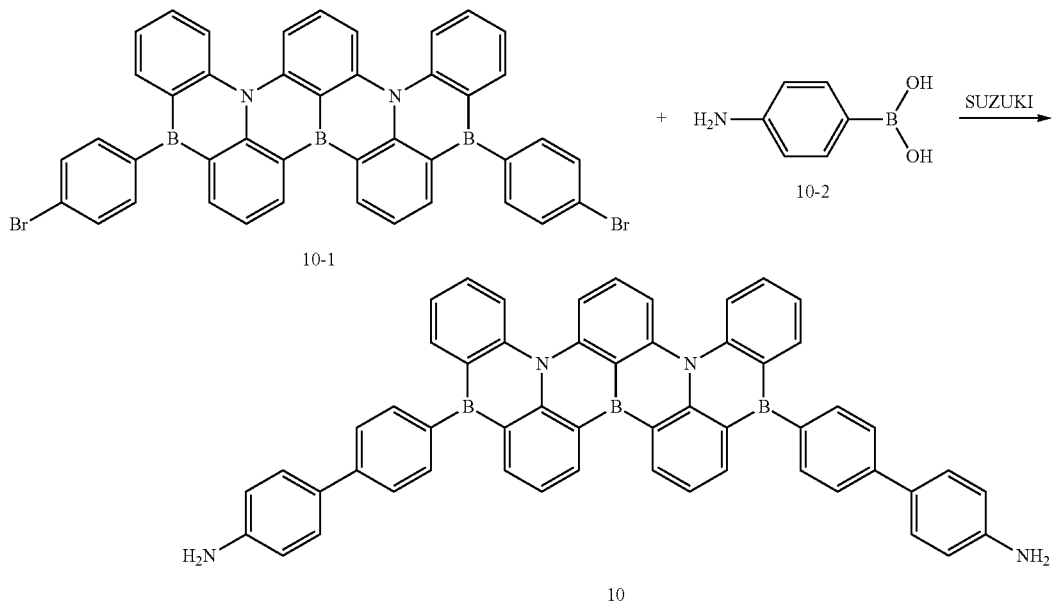

Synthesis of Compound 10

The synthetic method was similar to that of compound 1, a classical SUZUKI reaction was adopted, yield of 79.8%. Vacuum-dried for use. MS(ASAP)=774.3.

Example 11: Synthesis of Compound 11

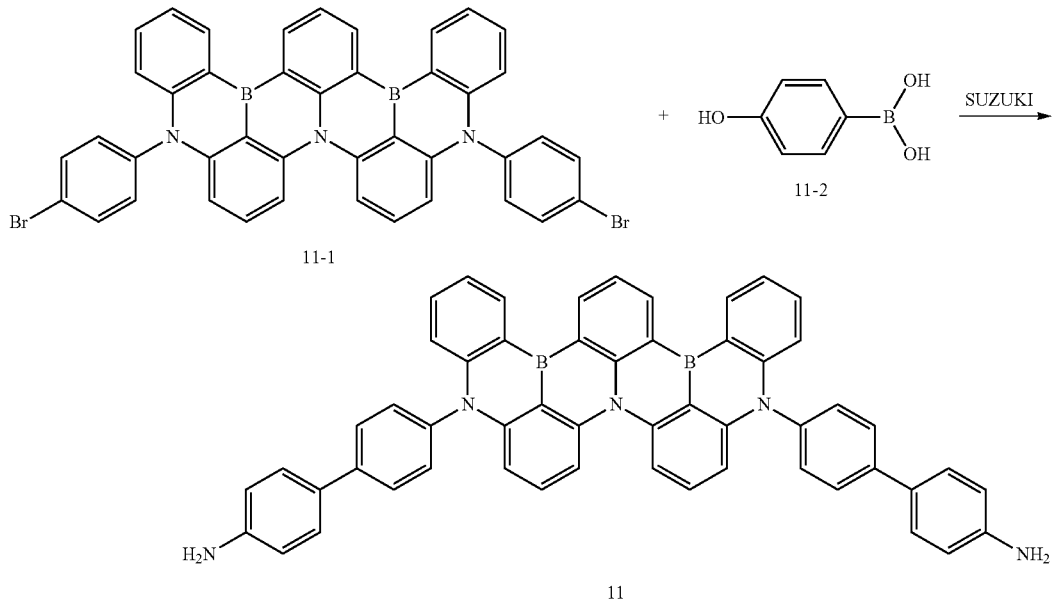

Synthesis of Compound 11

The synthetic method was similar to that of compound 1, a classical SUZUKI reaction was adopted, yield 80.8%. Vacuum-dried for use. MS(ASAP)=779.3.

Example 12: Synthesis of Compound 12
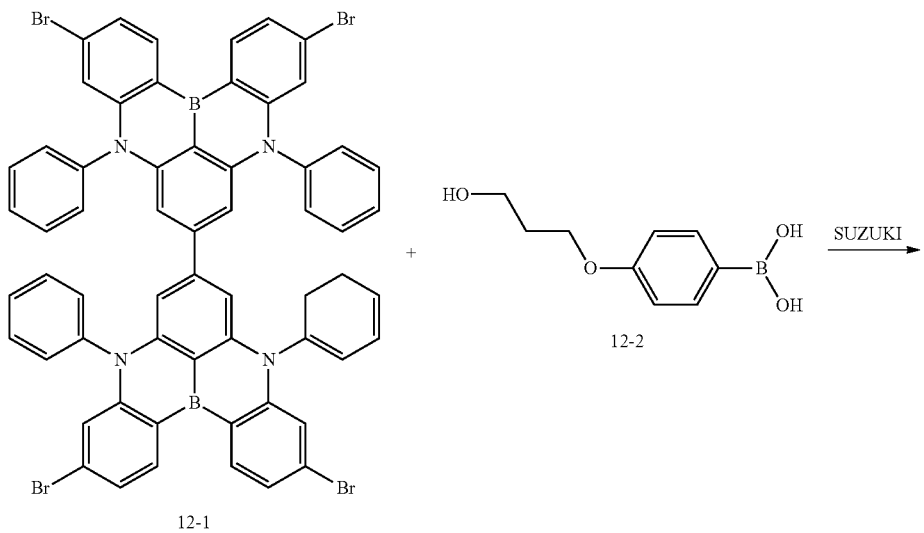
Synthesis of Compound 12
The synthetic method was similar to that of compound 1, a classical SUZUKI reaction was adopted, yield 50.4%. Vacuum-dried for use. MS(ASAP)=1438.6.

Example 13: Synthesis of Compound 13

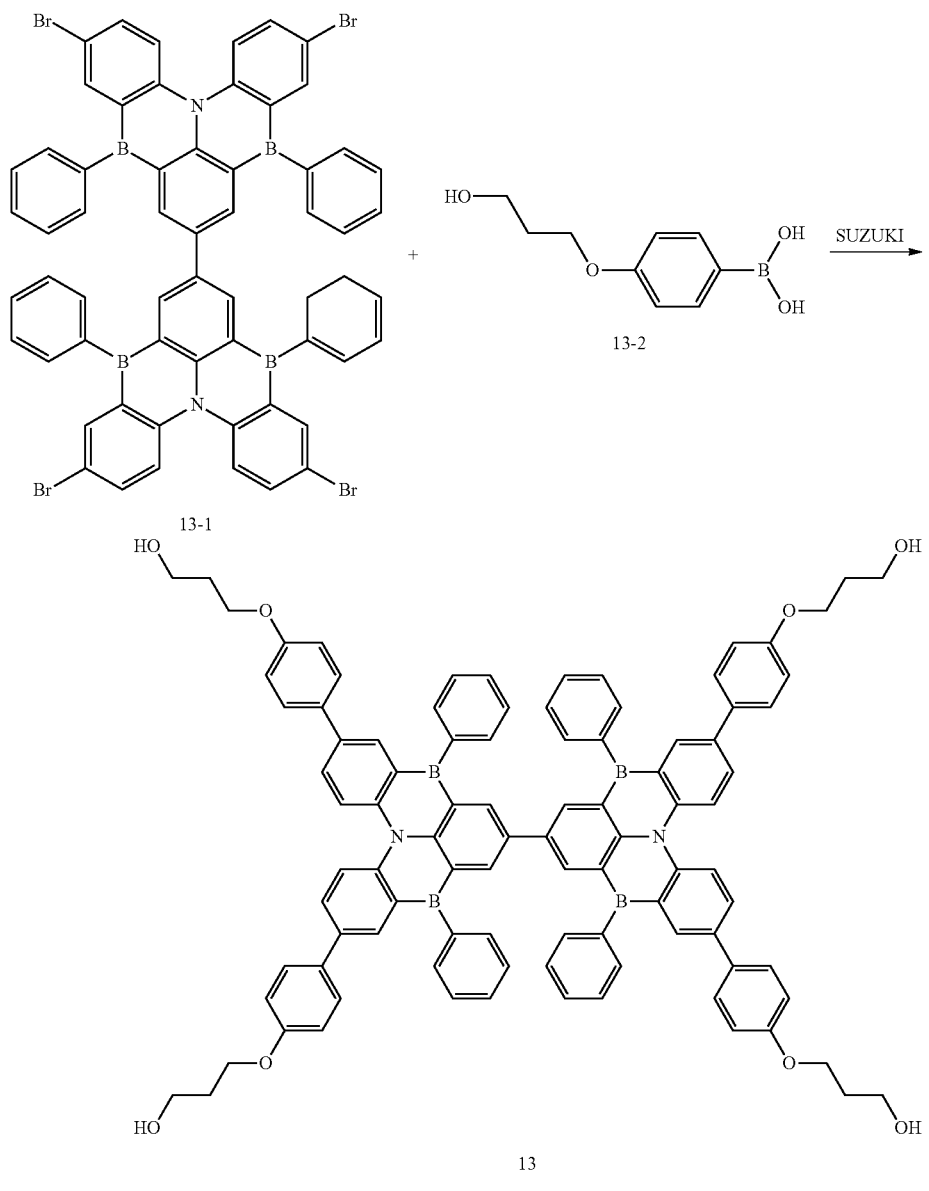

Example 13: Synthesis of Compound 13

The synthetic method was similar to that of compound 1, a classical SUZUKI reaction was adopted, yield 48.9%. Vacuum-dried for use. MS(ASAP)=1432.6.

The method for preparing the color conversion layer is as follows:

1) A blue color conversion material, a green color conversion material and a red color conversion material were respectively dissolved in a mixed solvent of phenyl dodecanol: toluene=3:2 in the ratio of 50 mg/ml, 50 mg/ml and 50 mg/ml. At the same time, 15 mg/ml of polystyrene, 5 mg/ml of silicon dioxide nanospheres of 3-5 μm in diameter were added into the solution to form the ink. Through slit coating using the ink, a solid thin film with a thickness of about 100 μm was formed on the surface of the electroluminescent device or a thin film as the color conversion layer of red, green and blue colors. The OD (optical density) of the above obtained color conversion layer is all greater than 4. Combined with blue light or near-ultraviolet light-emitting light source, the color conversion layers can be completely converted into blue, green light or red light.

2) A blue color conversion material, a green color conversion material and a red color conversion material were respectively dissolved into a mixed solvent of phenyl dodecanol: toluene=3:2 in the ratio of 50 mg/ml, 50 mg/ml and 50 mg/ml. The film was formed by blade coating or spin coating, and then heated on a heating plate at 100° C. for 10 minutes. The color conversion film of 100-500 nm was obtained. Such color conversion film can be used to prepare a RGB display device.

In addition, it is found in the present disclosure that compared with the corresponding compounds without alcohol-soluble or water-soluble groups, the compound as described herein, i.e., a compound having one, especially two or more alcohol-soluble or water-soluble groups, has better solubility (especially in alcohol solvents) and film-forming property, thus allowing higher quality films.

The technical features of the above-described embodiments can be combined in any ways. For the sake of brevity, not all possible combinations of the technical features of the above-described embodiments have been described. However, as long as there are no contradictions in the combination of these technical features, they should be considered to be within the scope of this specification.

What described above are several embodiments of the present disclosure, and they are specific and in details, but not intended to limit the scope of the present disclosure. It will be understood and improvements can be made without departing from the concept of the present disclosure, and all these modifications and improvements are within the scope of the present disclosure. The scope of the present disclosure shall be subject to the appended claims.

What is claimed is:

1. An organic compound, comprising a structural unit of formula (1) or (2),

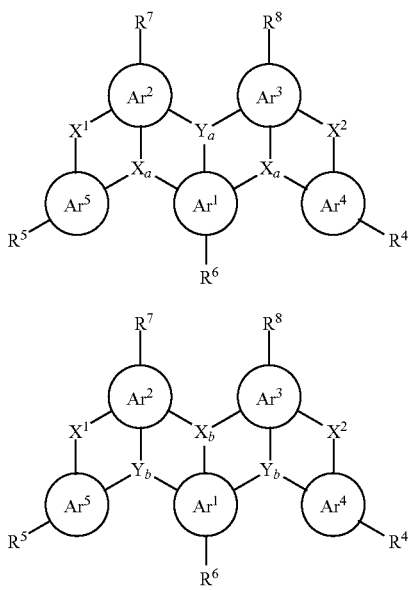

wherein:
each of $Ar^1$, $Ar^2$ and $Ar^3$ is independently an aromatic group containing 5 to 24 ring atoms, or a heteroaromatic group containing 5 to 24 ring atoms;
each of $Ar^4$ and $Ar^5$ is independently null, an aromatic group containing 5 to 24 ring atoms, or a heteroaromatic group containing 5 to 24 ring atoms;
each of $Y_a$ and $Y_b$ is independently B, P=O, C($R^9$), Si($R^9$);
when neither $Ar^4$ nor $Ar^5$ is null, each of $X_a$ and $X_b$ is independently N, C($R^9$), Si($R^9$);
when $Ar^4$ and/or $Ar^5$ is null, each of the corresponding $X_a$ and $Y_b$ is independently N ($R^9$), C($R^9R^{10}$), Si($R^9R^{10}$), C=O, O, C=N ($R^9$), C=C($R^9R^{10}$), P($R^9$), P(=O) $R^9$, S, S=O, or $SO_2$;
each of $X^1$ and $X^2$ is independently null or a bridging group;
$R_4$ to $R_{10}$ are independently selected from the group consisting of H, D, —F, —Cl, Br, I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched or cyclic alkyl group, a $C_3$-$C_{20}$ branched or cyclic haloalkyl group, a $C_3$-$C_{20}$ branched or cyclic alkoxy group, a $C_3$-$C_{20}$ branched or cyclic thioalkoxy group, a $C_3$-$C_{20}$ branched or cyclic silyl group, a $C_1$-$C_{20}$ ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate or isothiocyanate group, a hydroxyl group, a nitro group, a $CF_3$ group, a crosslinkable group, a substituted or unsubstituted aromatic or heteroaromatic group containing 5 to 40 ring atoms, an aryloxy or heteroaryloxy group containing 5 to 40 ring atoms, an arylamine or heteroarylamine group containing 5 to 40 ring atoms, a disubstituted unit in any position of the above substituents and a combination thereof, wherein one or more of the substituent groups can form a monocyclic or polycyclic aliphatic or aromatic ring system with each other and/or with the ring bonded to the groups:
wherein the organic compound comprises at least one alcohol-soluble or water-soluble group, and the at least one alcohol-soluble or water-soluble group is selected from the group consisting of:

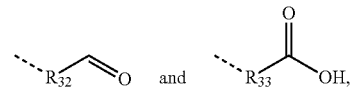

wherein:
$R_{32}$ and $R_{33}$ are independently selected from the group consisting of a substituted or unsubstituted aromatic or heteroaromatic group containing 5 to 40 ring atoms;
the dashed lines represent bonded bonds, t is an integer greater than 0.

2. The organic compound of claim 1, wherein the organic compound comprises a structural unit of formula (1a) or (2a):

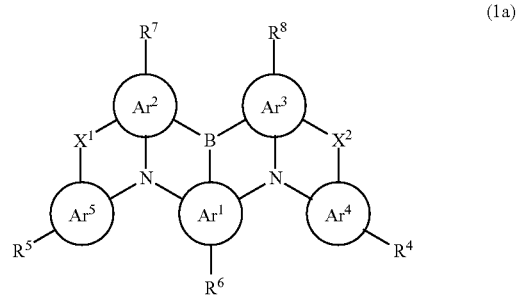

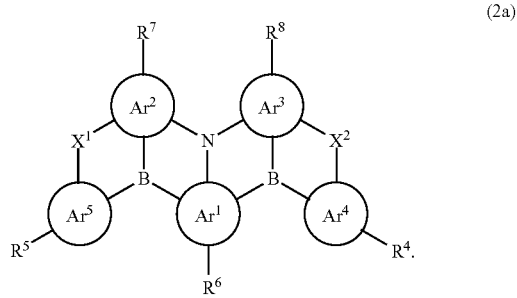

3. The organic compound of claim 1, wherein the organic compound comprises a structural unit represented by one of the following formulas (1b)-(1d) and (2b)-(2d):

(1b)
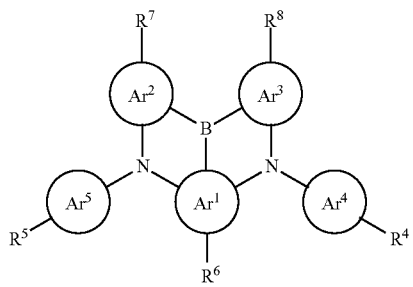

(2b)
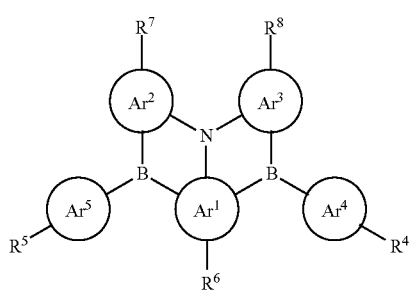

(1c)
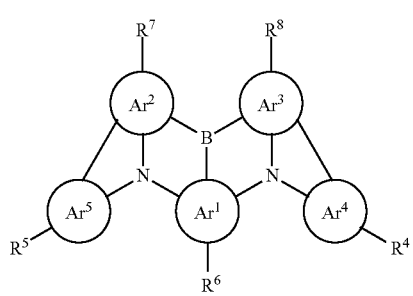

(2c)
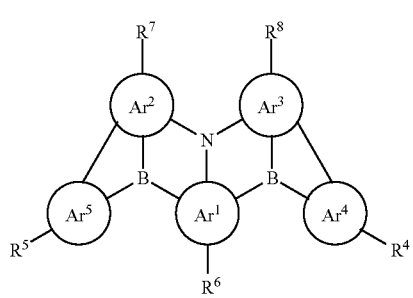

(1d)
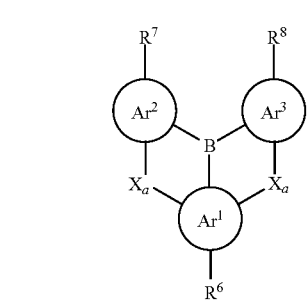

(2d)
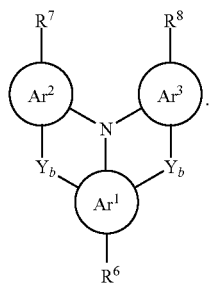

4. The organic compound of claim 1, wherein each of $Ar^1$, $Ar^2$, $Ar^3$, $Ar^4$, and $Ar^5$ in formula (1) or (2) is independently selected from the group consisting of:

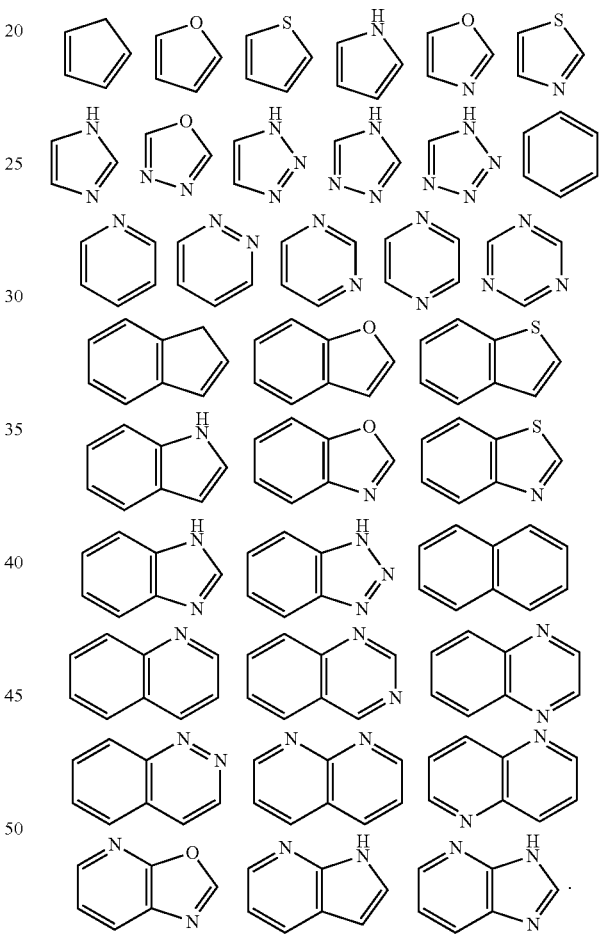

5. A formulation, comprising at least one organic compound according to claim 1, and at least one organic solvent.

6. The formulation of claim 5, wherein the at least one organic solvent is selected from the group consisting of alcohols, esters, aromatic ketones, aromatic ethers, aliphatic ketones, aliphatic ethers, and mixtures of two or more thereof.

7. The formulation of claim 6, wherein the esters comprises inorganic ester compounds, and the inorganic ester compounds comprises boronic esters and phosphoric esters.

8. An organic functional material film prepared using the formulation according to claim 5.

9. An organic functional material film, comprising the organic compound according to claim 1.

* * * * *